(12) United States Patent
Peng et al.

(10) Patent No.: US 11,894,375 B2
(45) Date of Patent: *Feb. 6, 2024

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Shih-Wei Peng, Hsinchu (TW); Te-Hsin Chiu, Miaoli County (TW); Wei-Cheng Lin, Taichung (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,080

(22) Filed: Jun. 22, 2022

(65) Prior Publication Data

US 2022/0320093 A1    Oct. 6, 2022

Related U.S. Application Data

(63) Continuation of application No. 17/075,578, filed on Oct. 20, 2020, now Pat. No. 11,374,005.

(51) Int. Cl.
*H01L 27/092*   (2006.01)
*H01L 23/528*   (2006.01)
(Continued)

(52) U.S. Cl.
CPC .... *H01L 27/0922* (2013.01); *H01L 21/02532* (2013.01); *H01L 21/02603* (2013.01);
(Continued)

(58) Field of Classification Search
CPC .......... H01L 27/0922; H01L 21/02532; H01L 21/02603; H01L 21/823807; H01L 21/823814; H01L 21/823828; H01L 21/823871; H01L 23/5286; H01L 29/0673; H01L 29/42392; H01L 29/66545; H01L 29/66742; H01L 29/78618; H01L 29/78696; H01L 29/0847; H01L 21/76895;
(Continued)

(56) References Cited

U.S. PATENT DOCUMENTS 11,374,005 B2 *  6/2022  Peng ................. H01L 29/78618

* cited by examiner

*Primary Examiner* — Tong-Ho Kim
(74) *Attorney, Agent, or Firm* — WPAT LAW; Anthony King

(57) ABSTRACT

A semiconductor device includes a first transistor and a second transistor. The first transistor is of a first type in a first layer and includes a gate extending in a first direction and a first active region extending in a second direction perpendicular to the first direction. The second transistor is of a second type arranged in a second layer over the first layer and includes the gate and a second active region extending in the second direction. The semiconductor device further includes a first conductive line in a third layer between the first and second layers. The first conductive line electrically connects a first source/drain region of the first active region to a second source/drain region of the second active region. The gate includes an upper portion and a lower portion, and the first conductive line crosses the first gate between the upper portion and the lower portion.

20 Claims, 64 Drawing Sheets

(51) Int. Cl.
*H01L 29/06* (2006.01)
*H01L 29/423* (2006.01)
*H01L 29/786* (2006.01)
*H01L 29/66* (2006.01)
*H01L 21/02* (2006.01)
*H01L 21/8238* (2006.01)

(52) U.S. Cl.
CPC ........... *H01L 21/823807* (2013.01); *H01L 21/823814* (2013.01); *H01L 21/823828* (2013.01); *H01L 21/823871* (2013.01); *H01L 23/5286* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ........... H01L 21/76897; H01L 21/8221; H01L 23/5225; H01L 27/0688; H01L 27/092; H01L 29/66439; H01L 29/165; H01L 29/775; H01L 29/7848; H01L 29/785; B82Y 10/00; Y02P 80/30
USPC ....................................................... 257/384
See application file for complete search history.

SEMICONDUCTOR STRUCTURE AND METHOD OF FORMING THE SAME

PRIORITY CLAIM AND CROSS-REFERENCE

The present application is a continuation of U.S. application Ser. No. 17/075,578 filed Oct. 20, 2020, now allowed, the entire content of which is incorporated herein by reference.

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density the number of interconnected devices per chip area) has generally increased while geometric size (i.e., the smallest component that can be created using a fabrication process) has decreased. Such advances have increased the complexity of designing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the devices in electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
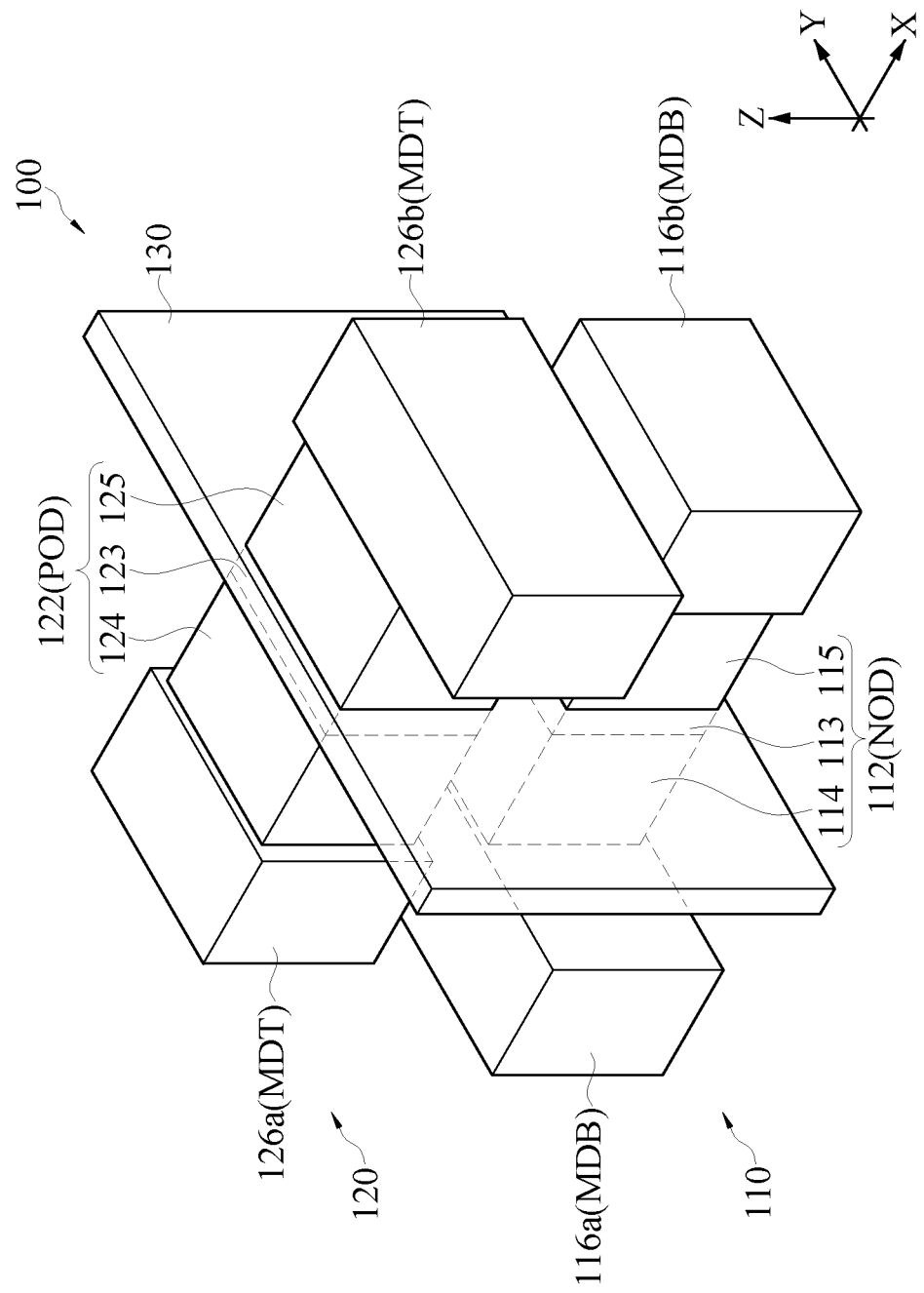
FIG. 1 is a perspective view of a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another elements) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Throughout the present disclosure, several features of a same type are labeled by the same generic numerals/letters and differentiated from one another by postfixes of different lower-case numerals/letters. For example, the labels 102a and 102b may refer to two instances of a feature in a semiconductor device, in which the instances 102a and 102b may have the same or different device configurations, such as the dimensions or materials. In some cases, if multiple features are referred to by a same label, it is intended to mean the union set of such features, e.g., the description "features 102" refers to the collection of the features 102a and 102b. Throughout various views and illustrative embodiments, like elements are designated with like reference numerals for ease of understanding.

The term "standard cell" or simply "cell" used throughout the present disclosure refers to a group of circuit patterns in a design layout to implement specific functionalities of a circuit. A cell is generally comprised of one or more layers, and each layer includes various patterns expressed as polygons of the same or various shapes. A design layout may be generated through placing one or more cells in allocated locations of a blank layout. In some cases, after the cells are placed, conductive features are introduced to the design layout to electrically connect these cells to form an electronic circuit. The geometries of the patterns of the cells may be adjusted at different stages of a circuit design flow in order to compensate for design and process effects. The cells may be accessible from cell libraries provided by semiconductor manufacturers or designers. In some cases, the cell libraries may be stored in a non-transitory computer-readable storage medium and accessed by a processor in various circuit design stages.

Throughout the present disclosure, the cells are designed for implementing electronic circuits formed by semiconductor devices, e.g., a metal-oxide-semiconductor (MOS) field-effect transistor (FET), and can be a planar FET, a fin-type FET (FinFET), a gate-all-around (GAA) FET, a nanosheet FET, a nanowire FET, a fully-depleted silicon-on-isolator (FDSOI) FET, or the like.

Throughout the present disclosure, the term "nanosheet" refers to a substantially two-dimensional layer formed of semiconductor materials, such as silicon or silicon germanium. In a nanosheet FET, one or more nanosheet layers are used as a channel. A gate of the FET warps around each of the nanosheets to achieve better control of the channel thereby leading to enhanced electrical performance of the FET.

In the various embodiments of the present disclosure, a semiconductor device is provided, in which the semiconductor device includes a vertical stack of at least an upper FET and a lower FET, in which the upper and lower FETs share a common gate and independently controlled source/drain regions and each FETs has one or more physical channels extending between two source/drain regions. In an example of one FET or more FET stacks arranged in a row, an inner interconnect structure (IIS) in an intermediate layer between the upper and lower FETs is introduced to provide a conduction path electrically connecting two source/drain regions of an upper or a lower FET from the same or different FET stacks in the row.

Existing approaches provide an interconnect structure formed by forming conductive lines and vias arranged in an upper layer over the upper FET or a in a lower layer below the lower FET, and thus the conventional interconnect structure is referred to herein as an outer interconnect structure. In contrast, the proposed IIS increases the connection opportunities for interconnecting the FETs of the FET stack in addition to the outer interconnect structure. The length of the conduction path of the interconnect structure formed by the IIS can be made less than the outer interconnect structure. In addition, more connection opportunities of the outer interconnect structure are freed accordingly. Therefore, the semiconductor device adopting the IIS can improve device performance in terms of device size, power or speed, as illustrated by the non-limiting examples provided below.

FIG. 1 is a schematic diagram of a perspective view of a semiconductor device 100, in accordance with some embodiments of the present disclosure. FIG. 1 depicts a simplified version of the semiconductor device 100 for the purpose of illustrating the spatial relationships of the FETs in the semiconductor device 100; the spatial relationships of the semiconductor device 100 are provided in greater detail with reference to FIGS. 2A to 2E.

Referring to FIG. 1, the semiconductor device 100 includes a vertical stack of two FETs 110 and 120. The FETs 110 and 120 are vertically stacked in the direction of the z-axis, in which the FET 120 is arranged over the FET 110. In some embodiments, the FETs 110 and 120 are vertically stacked over a substrate (not shown). The substrate underlying the stacking structure can be any substrate suitable for epitaxial growth and/or is formed of any suitable crystalline material including, for example, silicon, silicon germanium (SiGe), or the like.

In some embodiments, the FET stack is constructed by a p-type FET and an n-type FET, or vice versa, and thus the semiconductor device 100 is referred to as a complementary FET (CFET) device. In some embodiments, the term "p-type FET" as discussed above is referred to as a FET including a p-type dopant, e.g., boron, in doped source/drain regions of the p-type FET. The term "n-type FET" as discussed above is referred to as a FET including an n-type dopant, e.g., phosphorous or arsenic, in doped source/drain regions of the n-type FET.

The FET 110 includes an active region (NOD) 112, a gate 130, a first conductive line (MDB) 116a and a second conductive line (MDB) 116b. The active region 112, also referred to as an active area or an oxide-defined (OD) area, extends in an x-direction along the x-axis and defines a first source/drain region 113, a second source/drain region 114, and a channel region 115, in which the channel region 115 is arranged between the source/drain regions 113 and 114 and wrapped around by the gate 130. In some embodiments, the channel region 115 is formed of one nanosheet or a stack of nanosheets. The nanosheet(s) of the channel region 115 may be wrapped around by the gate 130. In some embodiments, the source/drain regions 113 and 114 include epitaxially formed materials, such as silicon or silicon germanium, on opposite sides of the channel region 115. In some embodiments, the source/drain regions 113 and 114 include dopants, such as a p-type dopant, e.g., boron, or an n-type dopant, e.g., phosphorous and arsenic. In the present example, the source/drain regions 113 and 114 include n-type dopants, and thus the active region 112 is referred to as an n-type active region (NOD).

The gate 130 extends in a gate direction from a top-view perspective, e.g., in the y-direction along the y-axis, and is arranged between the first source/drain region 113 and the second source/drain region 114 of the FET 110. The gate 130 is configured to control current in the channel region 115 through a biasing signal applied to the gate 130. In some embodiment, the gate 130 is formed of a conductive material, such as doped polysilicon or formed of a metal gate including metallic materials such as tungsten and cobalt, and other work function adjusting metals, such as Ti, Al, TiAl, TiN, TaC, and the like. In some embodiments, the gate 130 includes a multilayer structure. In some embodiments, the multilayer structure of the gate 130 includes a gate dielectric layer, which may be formed of a high-k dielectric material.

In some embodiments, the conductive lines 116a and 116b are arranged in a same layer of the active region 112 and electrically connected to the first and second source/drain regions 113 and 114, respectively. In some examples, the conductive lines 116a and 116b are also referred to the source/drain contacts. In some embodiments, the conductive lines 116a and 116b wrap around portions of the source/drain regions 113 and 114, respectively.

In some embodiments, the conductive lines 116 are formed of conductive materials, e.g., one or more of copper, silver, tungsten, titanium, nickel, tin, aluminum or another metal or material suitable for providing low resistance electrical connection in the semiconductor device 100. In some other embodiments, the conductive lines 116 include semiconductor materials. In some embodiments, the conductive lines 116 include epitaxial layers with dopants. The conductive lines 116 may be formed of one or more of silicon (Si), SiGe, silicon-carbide, boron, phosphorous, arsenic, gallium, or other suitable materials.

Similar to the FET 110, the FET 120 includes an active region 122, the gate 130, a first conductive line (MDT) 126a and a second conductive line (MDT) 126b. The active region 122 extends in a direction parallel to the active region 112 and defines a first source/drain region 123, a second source/drain region 124, and a channel region 125, in which the channel region 125 is arranged between the two source/drain regions 123 and 124 and wrapped around by the gate 130. In some embodiments, the conductive lines 126a and 126b are arranged in a same layer of the active region 122 and electrically connected to the first and second source/drain regions 123 and 124, respectively. The materials, configurations and forming methods of the FET 120 are similar to those of the FET 110, and their detailed descriptions are omitted for brevity. In the present example, the source/drain regions 123 and 124 include p-type dopants, and thus the active region 122 is referred to as a p-type active region (POD).

The gate 130 extends in the gate direction, e.g., along the y-direction, and is arranged between the first source/drain region 123 and the second source/drain region 124 of the FET 120. The gate 130 is configured to control current in the channel region 125 through the same biasing signal which controls the channel region 115. In this connection, the gate 130 extends across the FETs 110 and 120 in a direction along the z-axis.

The structures of the semiconductor device 100 as discussed above are given for illustrative purposes. Variants of the semiconductor device 100 are within the contemplated scope of the present disclosure. For example, the semiconductor device 100 is extended to include additional gates that are in parallel, in series, or in parallel and series combination, to the gate 130 as discussed above. In some other embodiments, the FET 110 is stacked above the FET 120.

Figure 2A:
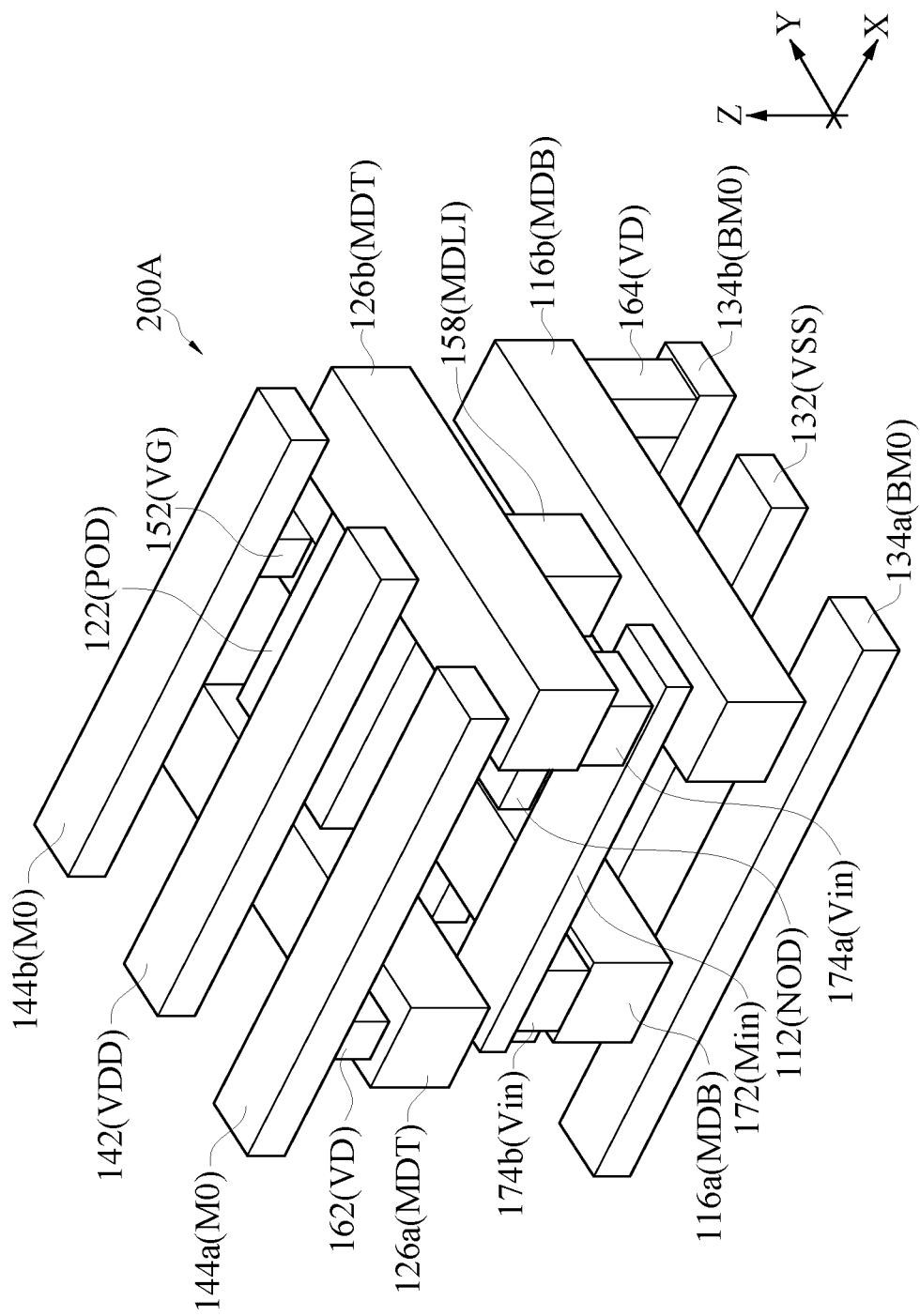
FIG. 2A is a perspective view of a semiconductor device, in accordance with some embodiments of the present disclosure.
Figure 2C:
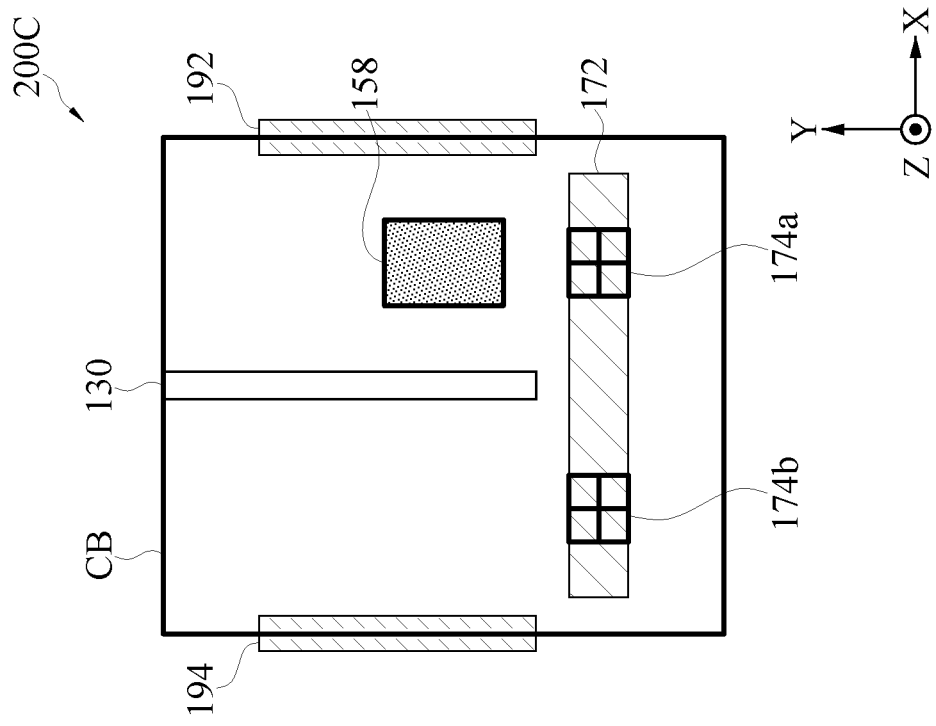
FIGS. 2B to 2D are schematic design layouts of the semiconductor device shown in FIG. 2A, in accordance with some embodiments of the present disclosure.
Figure 2B:
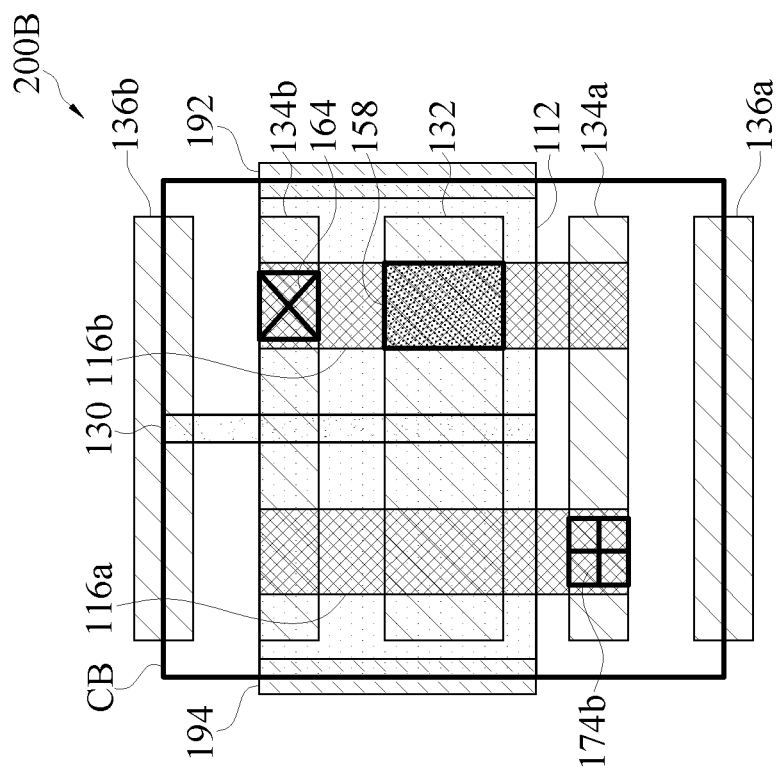
Figure 2D:
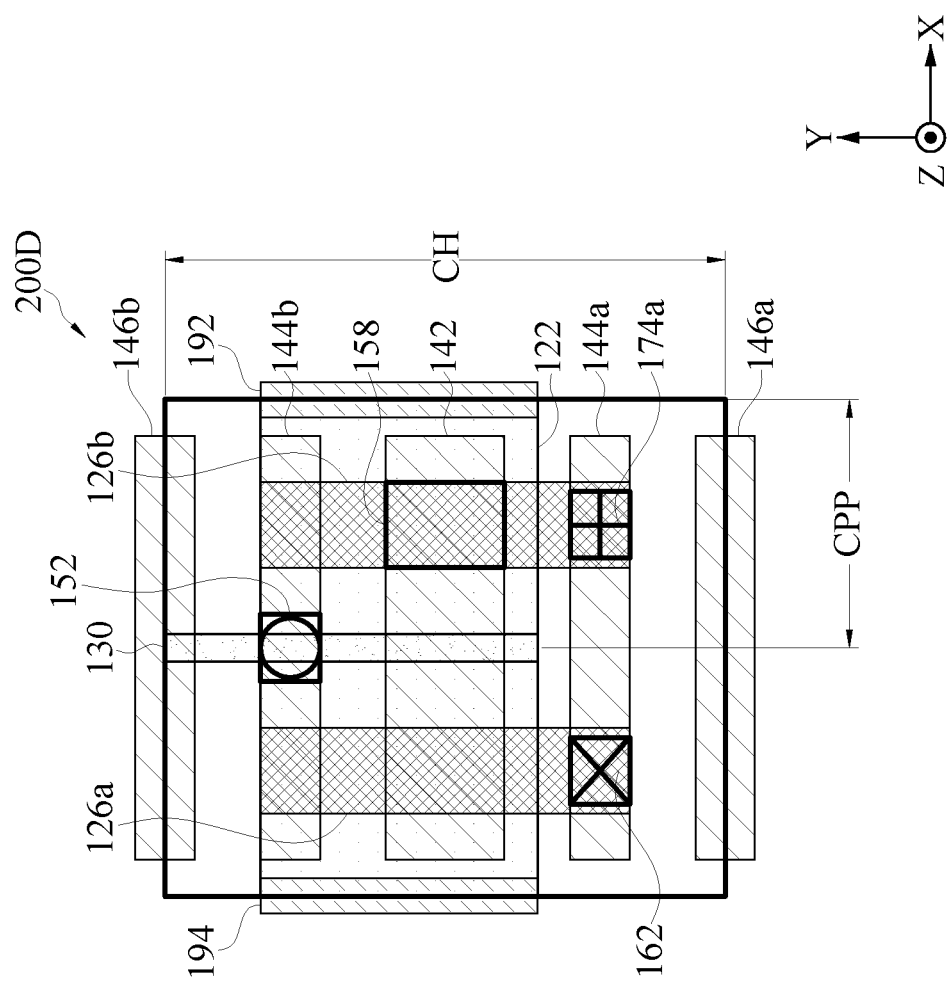

FIG. 2A is a perspective view of a semiconductor device 200A, in accordance with some embodiments of the present disclosure. The semiconductor device 200A includes the semiconductor device 100 shown in FIG. 1A and additional routing structures. The routing structures shown in FIG. 2A include as many types of connection scenarios in the semiconductor device 200A and are for illustrative purposes only. Any semiconductor device can take advantage of part of the routing structures shown in FIG. 2A as desired. FIGS. 2B to 2D are design layouts 200B, 200C and 200D, respectively, illustrating features in different layers of the semiconductor device 200A. The gate 130 in FIG. 1 is absent from FIG. 2A in order not to obscure the routing structure and is separately illustrated in FIG. 2E. In some embodiments, the semiconductor device 200A is associated with a cell 200A during a design stage and the design layouts 200B to 200D show different parts of the cell 200A. As seen from FIGS. 2B to 2D, the cell 200A is defined by a cell boundary CB.

Figure 2E:
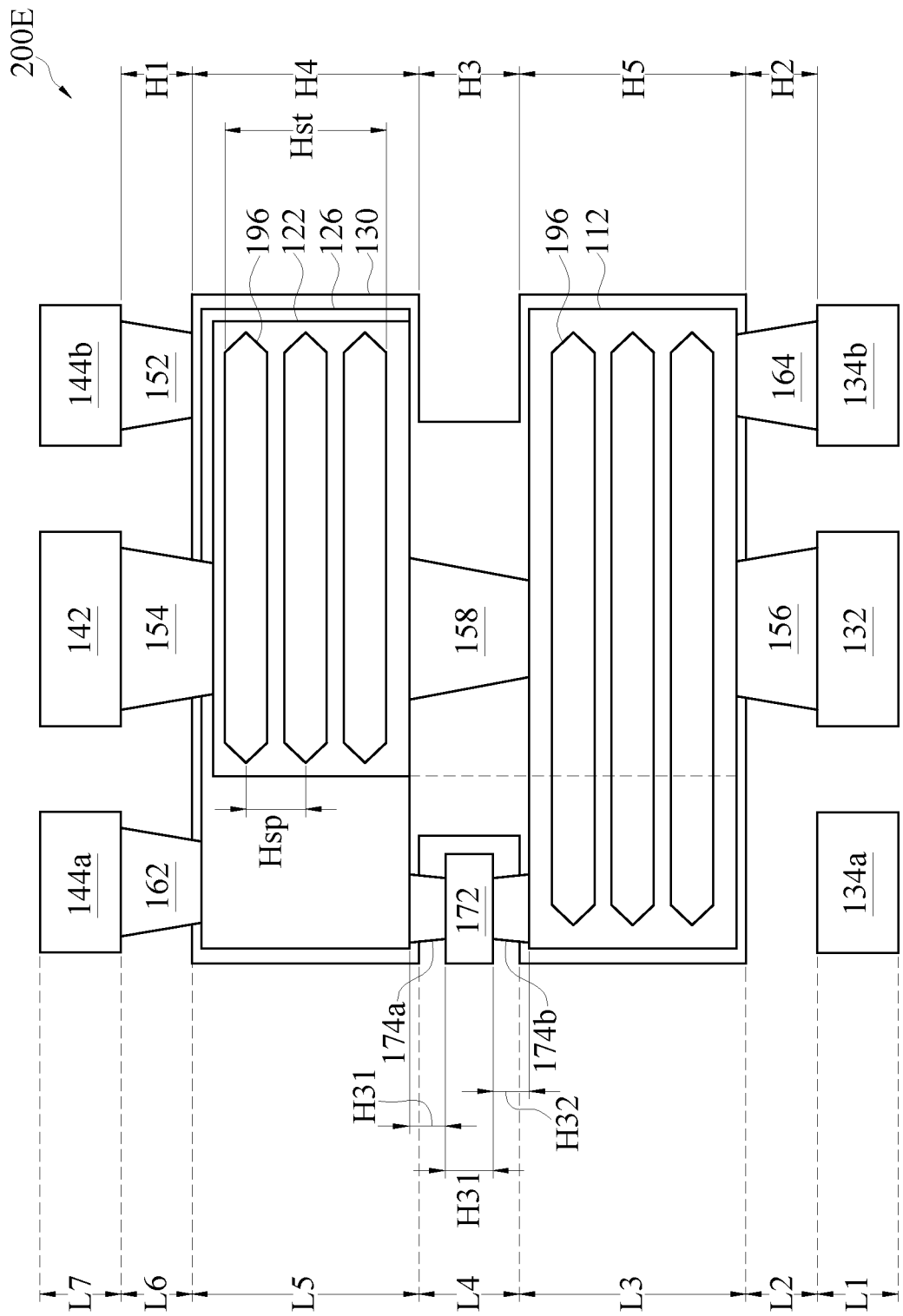
FIG. 2E is a schematic diagram showing dimensions of various parts in the semiconductor device shown in FIG. 2A, in accordance with some embodiments of the present disclosure.

FIG. 2E shows a cross-sectional view 200E illustrating dimensions of various parts in the semiconductor device 200A shown in FIG. 2A, in accordance with some embodiments of the present disclosure. Referring to FIG. 2E, the semiconductor device 200A includes a bottom metal line layer L1 arranged underlying a lower layer L3, in which the FET 110 resides, and a top metal line layer L7 arranged overlying an upper layer L5, in which the FET 120 resides. An intermediate layer L4 is located between the lower layer L3 and the upper layer L5 and the proposed IIS is formed in the intermediate layer L4.

Referring to FIGS. 2A, 2B and 2E, the bottom metal line layer L1 includes a first power rail 132 (VSS), two conductive lines (BM0) 134 and two conductive lines (BM0) 136 in parallel and extending along the x-direction. A conductive line 134a and a conductive line 136a are arranged on a first side of the first power rail 132; a conductive line 134b and a conductive line 136b are arranged on a second side of the first power rail 132.

Likewise, referring to FIGS. 2A, 2D and 2E, the top metal line layer L7 includes a second power rail 142 (VDD), two conductive lines (M0) 144 and two conductive lines (M0) 146 in parallel and extending along the x-direction. A conductive line 144a and a conductive line 146a are arranged on a first side of the second power rail 142; a conductive line 144b and a conductive line 146b are arranged on a second side of the second power rail 142.

In some embodiments, the power rails 132, 142 are configured to supply power to the semiconductor device 200A while the conductive lines 134, 136, 144 and 146 are configured as data rails for conveying data signals. In some embodiments, the power rails 132 and 142 are configured to supply a first voltage and a second voltage, respectively, or vice versa. In some other embodiments, the first voltage and the second voltage may be configured depending upon the conductivity types of the active regions 112 and 122. In the depicted example, the first voltage is a positive voltage (VDD) and the second voltage is ground (VSS).

The semiconductor device 200A further includes various conductive vias for providing electrical connectivity between the aforementioned features in different layers. A gate via (VG) 152 is disposed in a conductive via layer L6 between the layers L5 and L7 and configured to electrically connect the gate 130 to a conductive line, e.g., conductive line 144*b*, in the layer L5. A first drain via (VD) 162 is disposed in the conductive via layer L6 and configured to electrically connect a conductive line, e.g., the conductive line 126*a*, in the layer L5 to a conductive line, e.g., conductive line 144*a*, in the layer L7. A second drain via (VB) 164 is disposed in a conductive via layer L2 between the layers L1 and L3 and configured to electrically connect a conductive line, e.g., the conductive line 116*b*, in the layer L2 to a conductive line, e.g., the conductive line 134*b*, in the layer L1. An MD-local-interconnect via (MDLI) 158 is disposed in the intermediate layer L4 and configured to electrically connect conductive lines in layers L3 and L5, e.g., conductive lines 126*b* and 116*b*.

In some embodiments, the active regions 122 and 112 are electrically connected to the power rails 142 and 132 through drain vias 154 and 156, respectively, as shown in FIG. 2E.

In some embodiments, the conductive lines 134, 144 and the conductive vias 154, 156, 158 are collectively referred to as the outer interconnect structure for the semiconductor device 200A.

In some embodiments, only the conductive lines 134 or 144 immediately adjacent to the power rail 132 or 142 are functioning, and therefore the conductive lines 136 or 146 are configured as dummy or shielding conductive lines. Referring to FIGS. 2B and 2D, the power rails 132, 142 have a first line width measured along the y-direction and the conductive lines 134, 136, 144 and 146 have a second line width, measured along the y-direction, less than the first line width since a power rail is typically made wider than a data rail to minimize electrical resistance. Since the power rails 132 and 142 need to be of a greater line width than that for the conductive lines 134, 136, 144 and 146, the arrangement of disposing the power rails 132 and 142 in different metal line layers L1 and L7 provides greater space for accommodating wider power rails 132 and 142.

In some embodiments, the power rails 132 and 142 overlap each other from a top-view perspective. In some embodiments, the power rails 132 and 134 overlap the active regions 112 and 122 from a top-view perspective. In some embodiments, the first and second voltages correspond to a p-type FET and an n-type FET of the CFET, and the voltages supplied by the power rails 132 and 142 are determined according to the conductivity types of the FETs 110 and 120. In other words, the power rail 132 or 142 are so arranged so as to provide the first and second voltages to the active region 112 or 122 as closely as possible, thereby minimizing the power supply path and the electrical resistance.

Referring to FIGS. 2A, 2C and 2E, an inner conductive line 172 (Min) is arranged in the intermediate layer L4 and configured to electrically connect a conductive line on a first side of the gate 130, e.g., the conductive line 126*b*, to another conductive line on the other side of the gate 130, e.g., the conductive line 116*a*. In some embodiments, the inner conductive line 172 extends in a direction parallel to the active region 112 or 122. In addition, an inner conductive via 174*a* (Vin) is arranged in the layer L4 over the inner conductive line 172 and configured to electrically connect the inner conductive line 172 to the conductive line 126*b*. An inner conductive via 174*b* (Vin) is arranged in the layer L4 below the inner conductive line 172 and configured to electrically connect the inner conductive line 172 to the conductive line 116*a*. The inner conductive line 172 and the inner conductive vias 174 are collectively referred to herein as the IIS of the semiconductor device 200A.

In some embodiments, since the inner conductive line 172 or 174 is arranged in the layer L4 between the layers L3 and L5 where the active regions 112 and 122 resides, the inner conductive line 172 or 174 is laterally spaced apart from the active regions 112 and 122 for electrically insulation. In some embodiments, the first IIS or the second IIS is non-overlapped with the active region 112 or 122, such as the channel region 115 or 125 in FIG. 1, from the top-view perspective.

In some embodiments, the gate 130 includes an upper portion, a lower portion and a middle portion arranged between the upper portion and the lower portion, where the middle portion is a recessed portion having a width less than a width in the x-direction of the upper portion and the lower portion in the x-direction. In some embodiments, the first IIS and the second IIS cross the middle portion and electrically insulated from the gate 130. In some embodiments, an insulation film 202 is formed on sidewalk of the middle portion of the gate 130 to electrically insulate the gate 130 from the inner conductive line 172. In some embodiments, an insulation film 204 is formed on sidewalls of the middle portion of the gate 130 to electrically insulate the gate 130 from the inner conductive line 172. In some embodiments, an insulation film 206 is formed on sidewalls of the middle portion of the gate 230 to electrically insulate the gate 130 from the inner conductive line 272.

In some embodiments, the power rails 132, 142 and the conductive lines 134, 136, 144, 146, 172, and conductive vias 152, 154, 156, 174 are formed of conductive materials, such as doped polysilicon, copper, tungsten, aluminum, titanium, tantalum, titanium nitride, tantalum nitride, alloys thereof, or the like.

The semiconductor device 200A further includes dummy gates 192 and 194 (not shown in FIG. 2A but illustrated in FIGS. 2B to 2D) extending in the y-direction and arranged on two sides of the active regions 112 and 122, respectively. In some embodiments, the dummy gates 192 and 194 are formed with the similar materials to those for forming the gate 130; however, the dummy gates 192 and 194 are not functioning in forming the FETs 110 and 120 of the semiconductor device 200A. In some embodiments, the cell 200A has a quadrilateral shape and the cell boundary CB includes an upper cell side, a lower cell side, a left cell side and a right cells side. The upper cell side and the lower cell side are aligned with centerlines of the topmost and bottommost conductive lines 146*b* and 146*a* (or 136*b* and 136*a*), respectively. The left cell side and the right cell side of the cell boundary CB are aligned with centerlines of the left dummy gates 194 and 192, respectively.

Referring to FIG. 2E, the active region 112 or 122 includes three exemplary nanosheets 196 stacked over one another. A pitch Hsp of the nanosheets 196 is measured between the centerlines of two adjacent nanosheets 196. In some embodiments, a height Hst of the total nanosheets 196 is in a range between Hsp and four times the pitch Hsp.

In some embodiments, the active region 112 or 122 may have different OD widths in the y-direction and is electrically connected to the adjacent conductive line without any intervening features or through a conductive via. For example, as shown in FIG. 2E, the active region 122 is non-overlapped with the conductive line 144*a*, and thus the active region 112 is arranged to electrically connect to the conductive line 144*a* through the extended conductive line 126 and the drain via 162. In another example, as shown in FIG. 2E, the active region 112 extends to be directly over the conductive line 134b, and thus the conductive line 126 may be arranged vertically between the conductive line 134b and the drain via 164. In some embodiments, the cells 210, 220 and 230 have a substantially equal cell height CH1 in the y-direction. The cell height CH1 may be in a range between about 60 nm and about 100 nm. In some embodiments, the OD widths Ws1 or Ws2 of the active regions 112, 212 and 312 are in a range between about 10 nm and about 60 nm.

In some embodiments, the gate via 152 or drain vias 154, 162 have a via height H1 in a range between about one half the height Hsp and about three times the height Hsp. In some embodiments, the drain via 156 or 164 has a via height H2 in a range between about one half the height Hsp and about three times the height Hsp. In some embodiments, the MDLI via 158 has a via height H3 in a range between about 0.9 times the height Hsp and about 1.2 times the height Hsp. In some embodiments, the conductive line 116 has a height H5 in a range between about the height Hsp and about 1.2 times the height Hsp. In some embodiments, the conductive line 126 has a height H4 in a range between about the height H5 and about 1.2 times the height H5.

Referring to FIGS. 2B and 2D, in some embodiments, the conductive lines 116 and 126 extend in the y-direction substantially perpendicular to the direction in which the active region 112 or 122 extends and substantially parallel to the direction in which the gate 130 extends from a top-view perspective. In some embodiments, the gate 130 is shortened in the gate direction, i.e., along the y-direction, on one side of the active region 112 or 122 while still fully wrapping around the active regions 112 and 122. As such, at least one of the conductive lines 116 and 126, e.g., the conductive line 116a or 126a, is offset from the gate 130 in the y-direction. In some embodiments, at least one of the conductive lines 116 and 126 is not fully overlapped with the gate 130 in the y-direction due to the shortened gate 130. In some embodiments, the gate 130 and the conductive line 116a extends toward opposite directions (e.g., positive y-axis and negative y-axis) along the y-direction. In some embodiments, at least one of the conductive lines 116 and 126 extend beyond one end of the gate 130 in the y-direction due to the shortened gate 130.

Figure 2F:
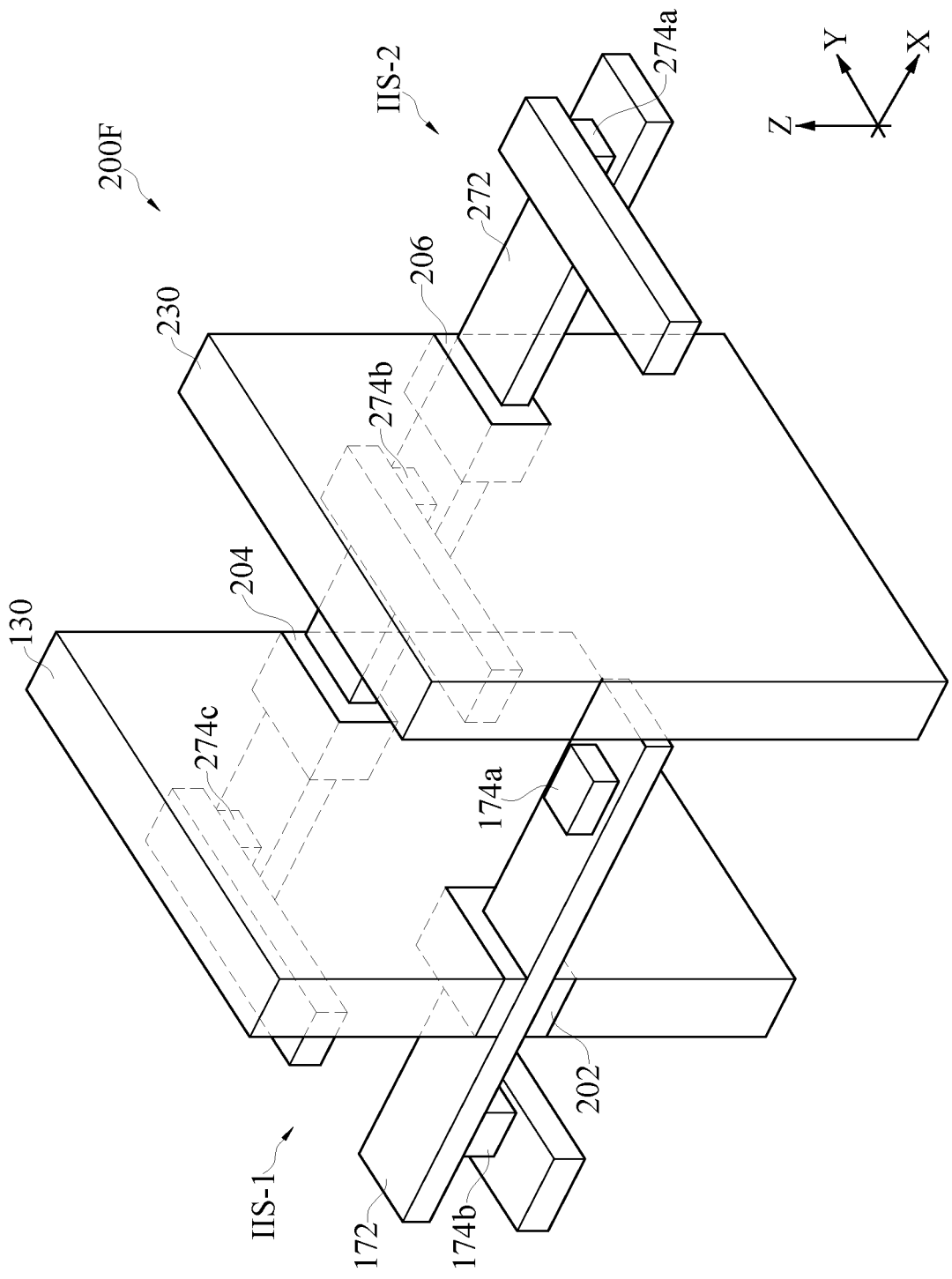
FIG. 2F is a perspective view showing an inner interconnect structure of the semiconductor device in FIG. 2A, in accordance with some embodiments of the present disclosure.

FIG. 2F is a perspective view 200F showing an IIS of the semiconductor device 200A, in accordance with some embodiments of the present disclosure. The perspective view 200F illustrates two CFETs (the details of the CFETs are not fully shown for clarity) defined and controlled by gates 130 and 230, in which the gates 130 and 230 extend in parallel along the y-direction.

In some embodiments, the semiconductor device 200A has two inner interconnect structures, as shown in the cross-section view 200E. The first inner interconnect structure IIS-1 includes the inner conductive line 172 and inner conductive vias 174a, 174b, while the second inner interconnect structure IIS-2 includes an inner conductive line 272 and inner conductive vias 274a, 274b, 274c. In some embodiments, the two sets of inner interconnect structures are formed on opposite sides of the active region 112 or 122 and overlap the gate 130 in the z-axis from a top-view perspective. In some embodiments, referring to FIG. 2E, the inner conductive line 172 or 272 has a line height H31 in a range between about 0.5 times the height Hsp and about the height Hsp. Likewise, in some embodiments, the inner conductive vias 174 and 274 has a via height H32 in a range between about 0.2 times the height Hsp and about the height Hsp.

The first inner interconnect structure IIS-1 extends through the gate 130 and includes the inner conductive lines 172 and inner conductive vias 174a, 174b configured to interconnect two source/drain regions arranged on two sides of the gate 130 in an upper FET and a lower FET of different CFETs. The second inner interconnect structure IIS-2 extends through the gates 130 and 230 and includes the inner conductive line 272 and inner conductive vias 274a, 274b, 274c configured to interconnect three source/drain regions in the upper FETs of the two CFETs. The dimensions, configuration and number of the inner conductive vias 174, 274 of the IISs shown herein are illustrative only, Other variants of the IISs modified by those embodiments illustrated herein are also within the contemplated scoped of the present disclosure.

Figure 2G:
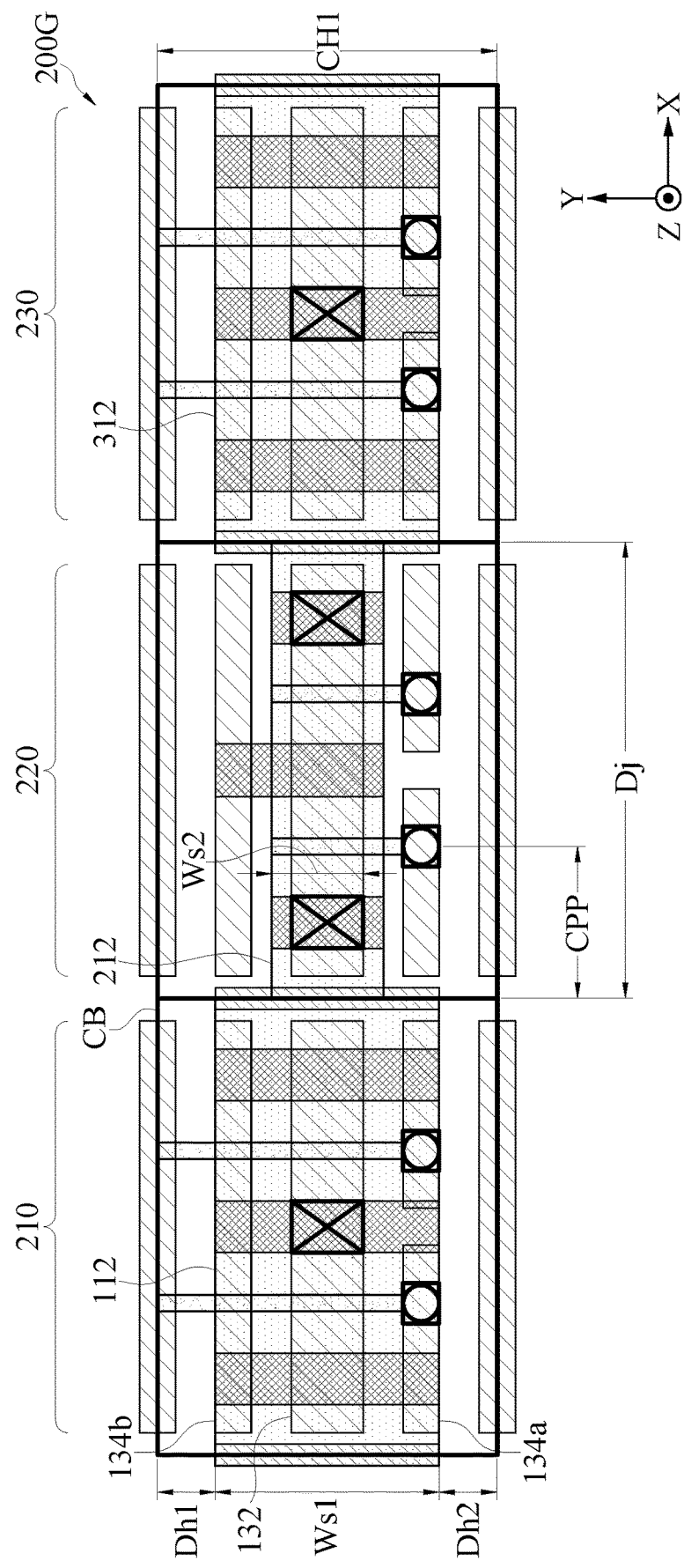
FIG. 2G is a schematic design layout of a semiconductor device, in accordance with some embodiments of the present disclosure.

FIG. 2G is a schematic design layout of a semiconductor device 200G, in accordance with some embodiments of the present disclosure. The semiconductor device 200G includes three cells 210, 220 and 230 arranged in a same row, in which each of the cells 210, 220 and 230 may be similar to the cell associated with the semiconductor device 200A. The cells 210, 220, 230 respectively include active regions 112, 212, 312 formed from a same contiguous active region extending in the x-direction. In some embodiments, the active regions 112, 212, 312 have different widths OD Ws in the y-direction. For example, the active regions 112 and 312 have an OD width Ws1 and the active region 212 has an OD width Ws2 different from, e.g., less than, the OD width Ws1. An inter-OD jog is identified in the boundary between the active regions 112 and 212 or between the active regions 212 and 312. The different OD widths Ws of the active regions 112, 212 and 312 may provide greater design flexibility for adjacent cells with different performance goals. For example, the cells 210 and 230 having larger active regions 112 and 312 may possess greater device speed while the cell 220 having a smaller active region 212 may enjoy power consumption advantages.

The aforementioned contiguous active regions arranged in a row with variable OD widths will cause an inter-OD jog to occur in the interface of two abutting active regions with different widths. In some embodiments, two adjacent jogs in the active regions are arranged to be spaced by a minimal distance Dj. In some embodiments, the minimal distance Dj is set as two times the distance CPP, wherein the distance CPP is defined as the pitch between two adjacent gates 130. Taking the active region 212 as example, if the adjacent jogs on two sides of the active region 212 are spaced by less than two times CPP, it would be difficult, if not impossible, to manufacture the active regions 112, 212 and 312 with a sufficient sharp rectangular boundary due to limitations of lithographic processes or other operations.

In some embodiments, the active regions 112, 212 and 312 have a clearance distance Dh between one side of the active region and a cell side. For example, the active region 112 has a first clearance distance Dh1 between the upper cell side and the upper side of the active region 112 and a second clearance distance Dh2 between the lower cell side and the lower side of the active region 112. The clearance distances Dh1 and Dh2 may be in a range between about 14 nm and about 20 nm. If the clearance distances Dh1 and Dh2 are made greater than about 20 nm, area utilization of the cell may not fulfill the design requirements and the device performance would be adversely impacted. If the clearance distances Dh1 and Dh2 are made less than about 14 nm, there would be insufficient separation between the active region 112 and an adjacent active region in an adjacent row. A device failure may occur accordingly.

Figure 2H:
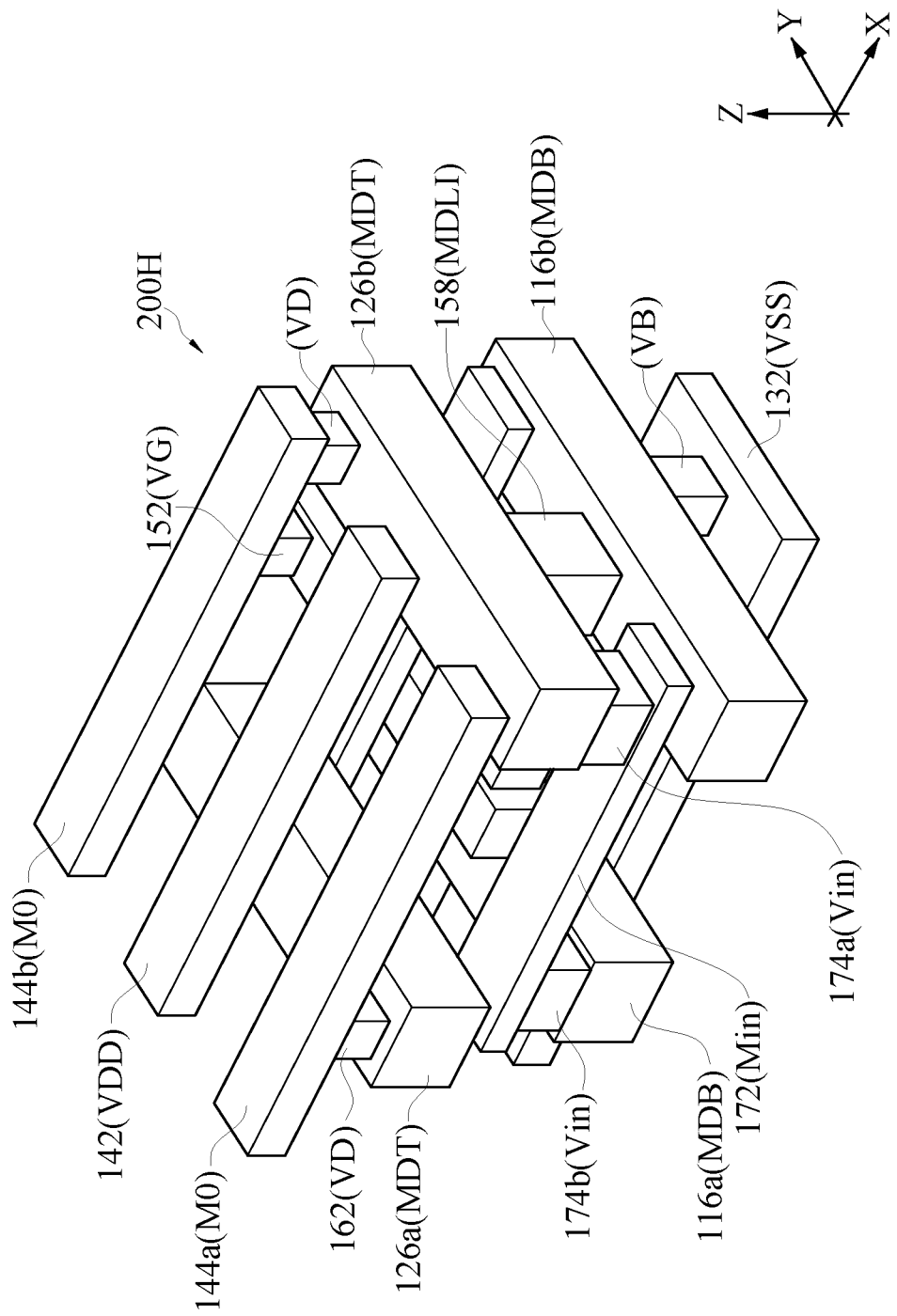
FIG. 2H is a schematic design layout of a semiconductor device, in accordance with some embodiments of the present disclosure.

FIG. 2H is a schematic design layout 200H of a semiconductor device, in accordance with some embodiments of the present disclosure. The semiconductor device shown in the layout 200H may be similar to that in the design layout 200A shown in FIG. 2A, except that the conductive lines 134a and 134b are absent from the bottom metal layer L1. In some embodiments, the conductive line 134a or 134b is not required due to the introduction of the IIS, and hence the one or both of the conductive lines 134a, 134b are removed from the bottom metal line layer L1 without adversely impacting the device performance. Accordingly, the power rail 132 can be made wider than the scenario where the conductive lines 134a, 134b are present. In some embodiments, a width ratio of the first line width of the power rail 132 and the second line width of the conductive line 134 is between about one and about 5.

Based on the above discussion, conventional circuit design methods generally utilize the outer interconnect structure to form the interconnect paths. However, the outer interconnect structure may not be efficient in electrically connecting the conductive lines 116 or 126 on two sides of the gate 130. Further, when the drain vias 162, 164 are configured to electrically connect to the conductive lines in different layers on opposite sides of the active region 112 or 122, such drain vias 162, 164 may extend across the layer L3 or L5 where the active region 112 or 122 resides, thereby hindering the active region 112 or 122 from expansion in the y-direction.

In contrast, the proposed IIS is suitable for a shorter interconnect path in place of the outer interconnect structure, thereby reducing the electrical resistance. In addition, the IIS is arranged within the layer L4, and therefore the likelihood of the tall drain vias 162 and 164 extending across the layers L3 and L5 is reduced. The active regions 112 and 122 can be expanded in the y-direction more easily. The variable OD widths of the active regions 112 and 122 further improves design flexibility in addressing both the requirements of speed and power of a device.

Figure 3A:
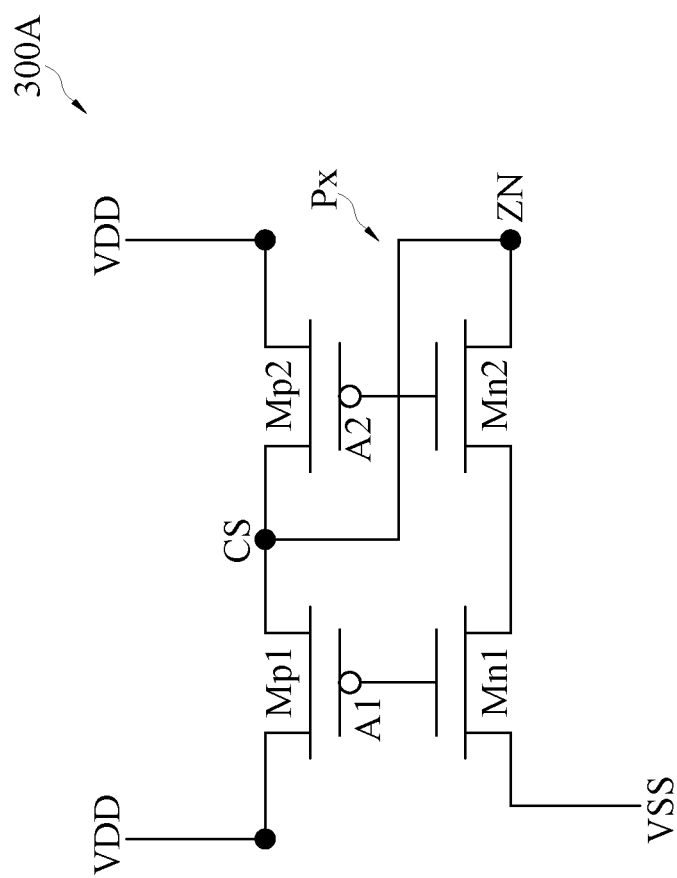
FIG. 3A is a circuit diagram of a semiconductor device, in accordance with some embodiments of the present disclosure.

FIG. 3A is a circuit diagram of a semiconductor device 300A, in accordance with some embodiments of the present disclosure. The semiconductor device 300A is a two-input NAND device in the present embodiment. The semiconductor device 300A includes two P-FETs Mp1 and Mp2 connected in series and two N-FETs Mn1 and Mn2 connected in series, in which an input node A1 is coupled to gate terminals of the FETs Mp1 and Mn1, an input node A2 is coupled to gate terminals of the FETs Mp2 and Mn2, and a common drain terminal of the P-FETs Mp1 and Mp2 are electrically connected to the drain terminal of the N-FET Mn2 at an output node ZN. During operation, the semiconductor device 300A is biased to the first voltage VDD at source terminals of the respective P-FETs Mp1 and Mp2, and biased to the second voltage VSS at the source terminal of the N-FET Mn1.

Figure 3B:
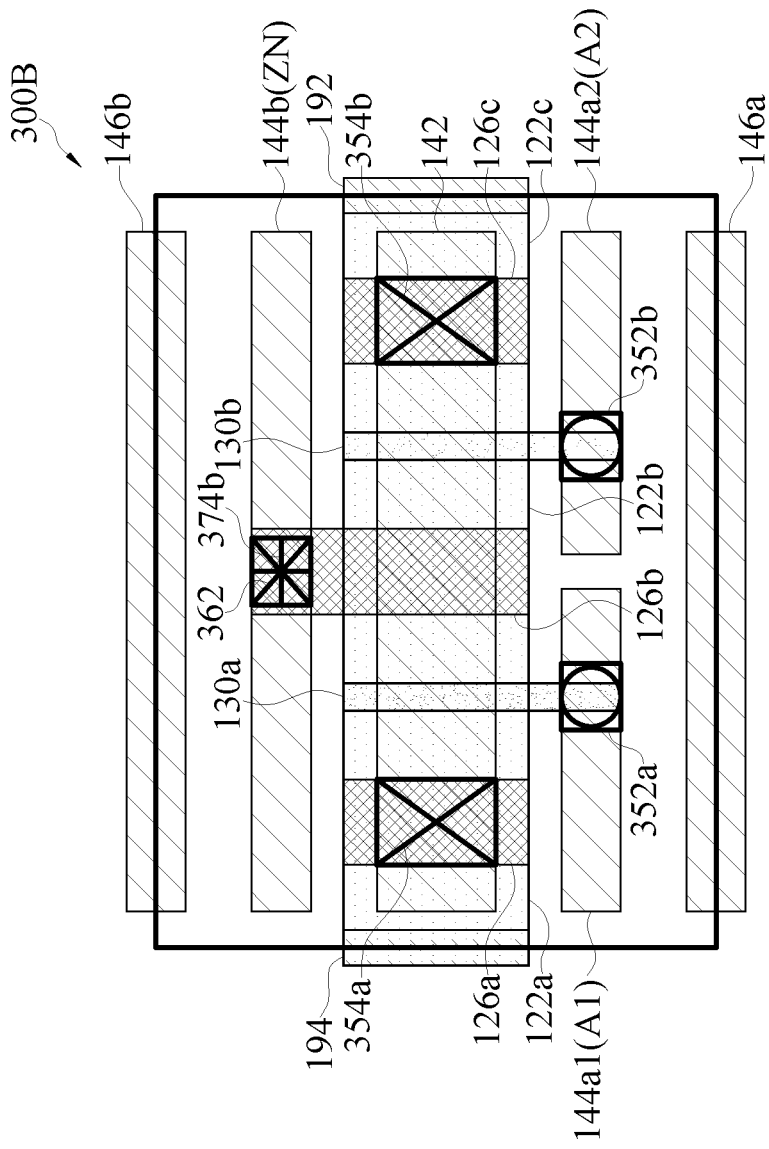
FIGS. 3B to 3D are design layouts of the semiconductor device shown in FIG. 3A, in accordance with some embodiments of the present disclosure.
Figure 3C:
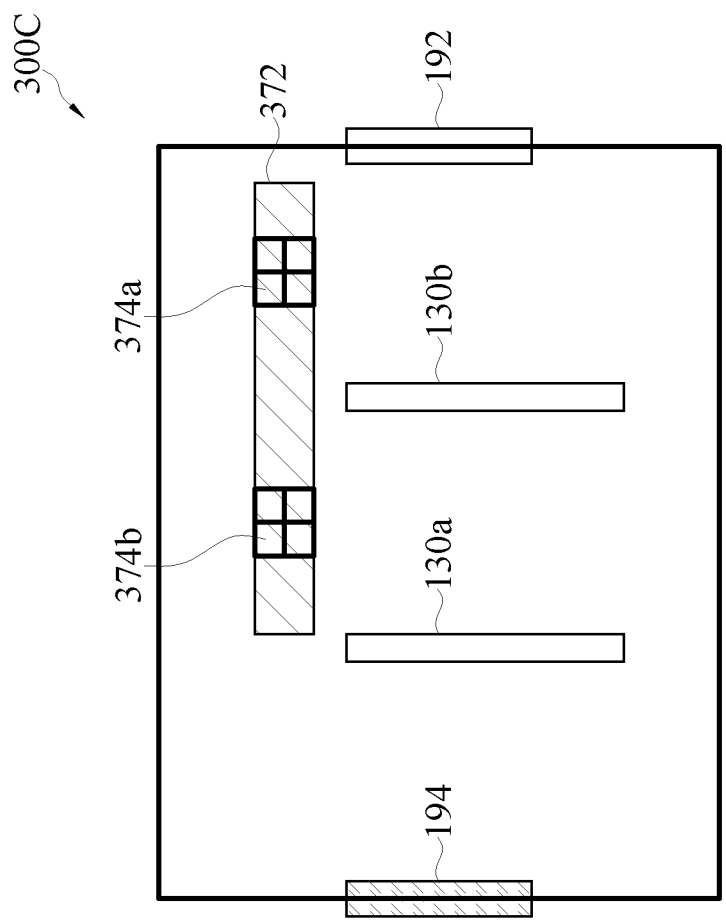
Figure 3D:
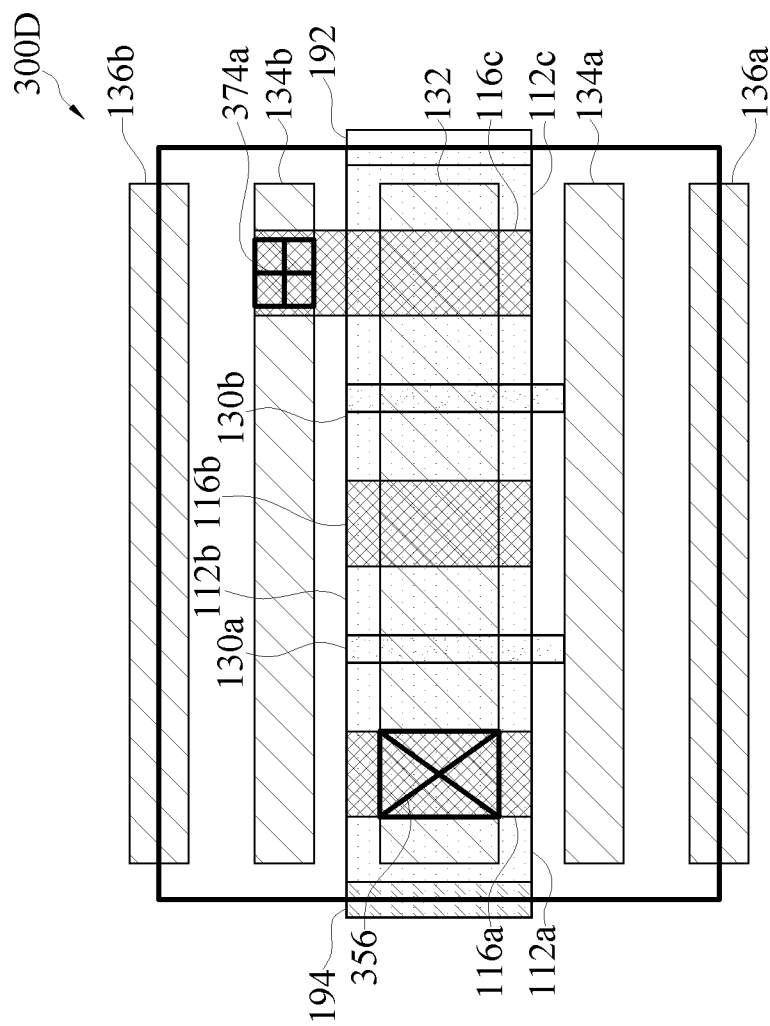
Figure 3E:
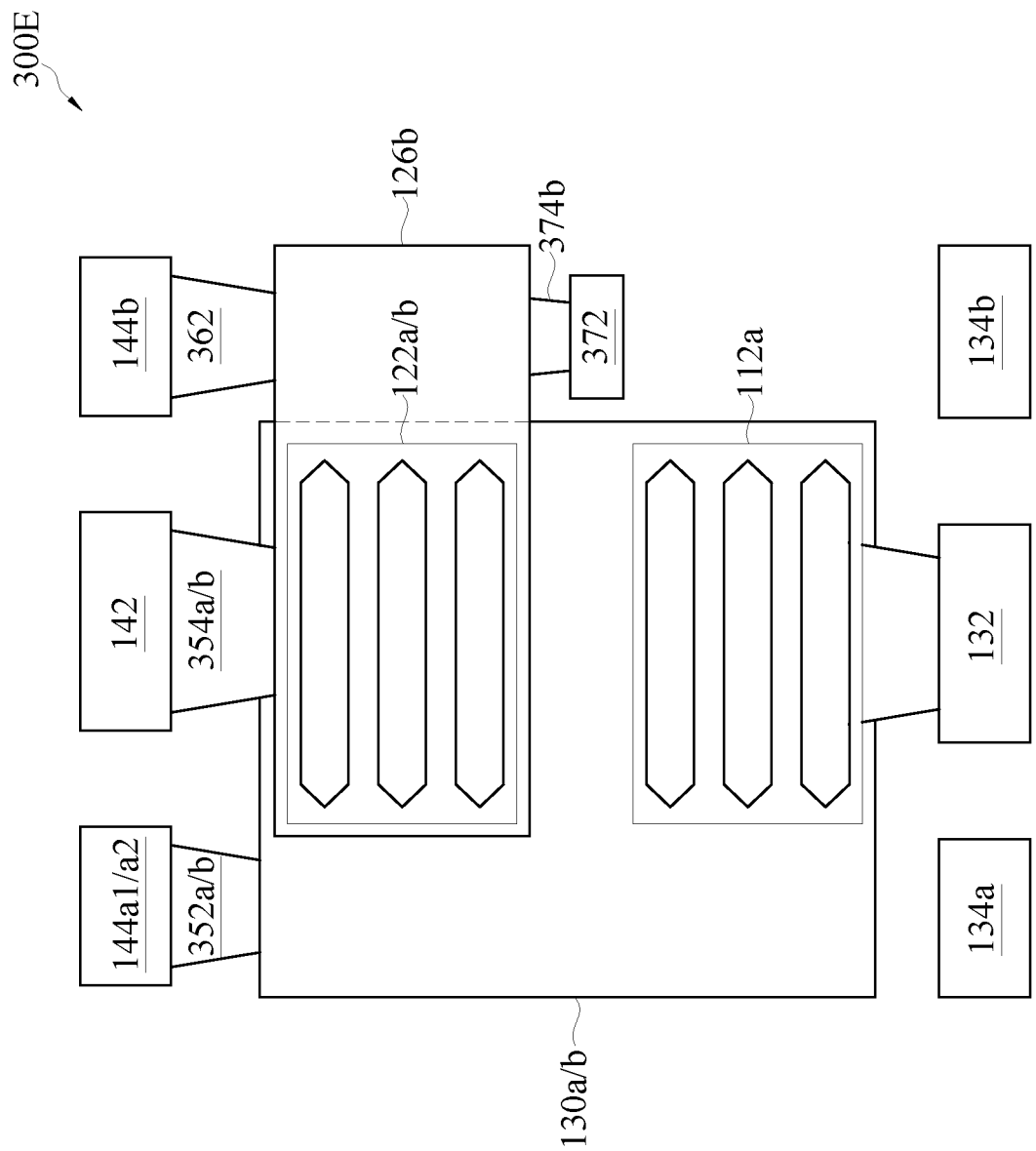
FIGS. 3E and 3F are cross-sectional views of the semiconductor device shown in FIG. 3A, in accordance with some embodiments of the present disclosure.
Figure 3F:
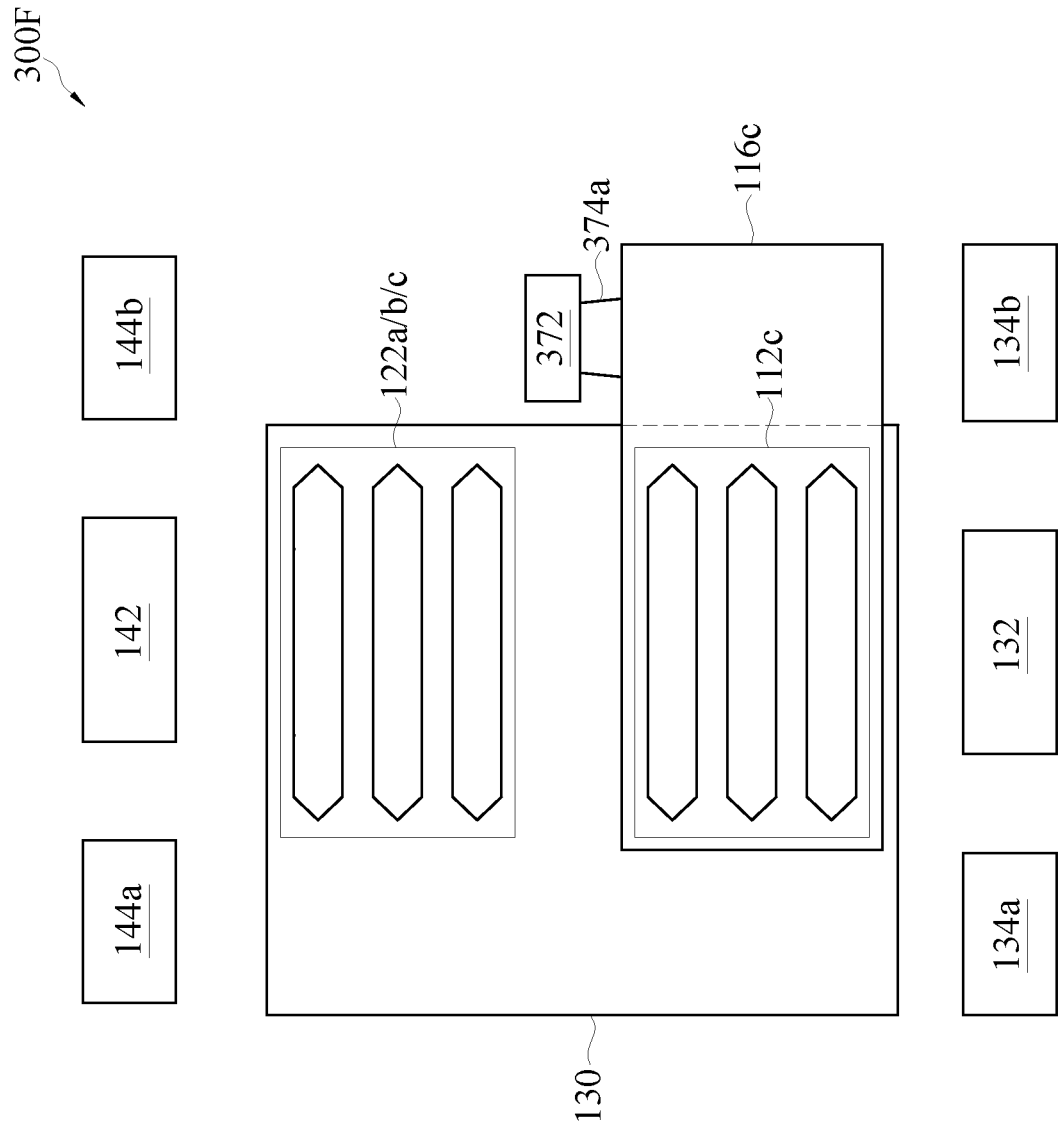

FIGS. 3B, 3C and 3D are design layouts 300B, 300C and 300D, respectively, of the semiconductor device 300A, in accordance with some embodiments of the present disclosure. In some embodiments, the semiconductor device 300A is implemented as a cell, and the design layouts 300B to 300D show different layers of the cell 300A. FIGS. 3E and 3F are cross-sectional views of the semiconductor device 300A, in accordance with some embodiments of the present disclosure.

Referring to FIGS. 3A, 3B and 3D, gates 130a and 130b partition the active region 122 into source/drain regions 122a, 122b and 122c of the P-FETs Mp1 and Mp2 and partition the active region 112 into source/drain regions 112a, 112b and 112c of the N-FETs Mn1 and Mn2. The conductive line 144a is partitioned into conductive lines 144a1 and 144a2, which serve as input pins A1, A2 and are electrically connected to the gates 130a and 130b through gate vias 352a and 352b, respectively. The conductive line 144b serves as an output pin ZN and is electrically connected to the source/drain region 122b through the drain via 362 and the respective conductive line 126b.

The power rail 142 is electrically connected to the active regions 122a, 122c through drain vias 354a, 354b and respective conductive lines 126a, 126c. The power rail 132 is electrically connected to the active region 112a through a drain via 356 and the conductive line 116a.

Referring to FIGS. 3A to 3C, 3E and 3F, a connection path Px shown in FIG. 3A is implemented by an IIS formed between the source/drain regions 122b and 112c through the conductive via 374b, the conductive line 372 and the conductive via 374a. Compared to existing methods for implementing the connection path Px, the proposed IIS shown in FIG. 3C reduces the length of the required conductive lines and conductive vias, and the electrical resistance is thus decreased.

Figure 4A:
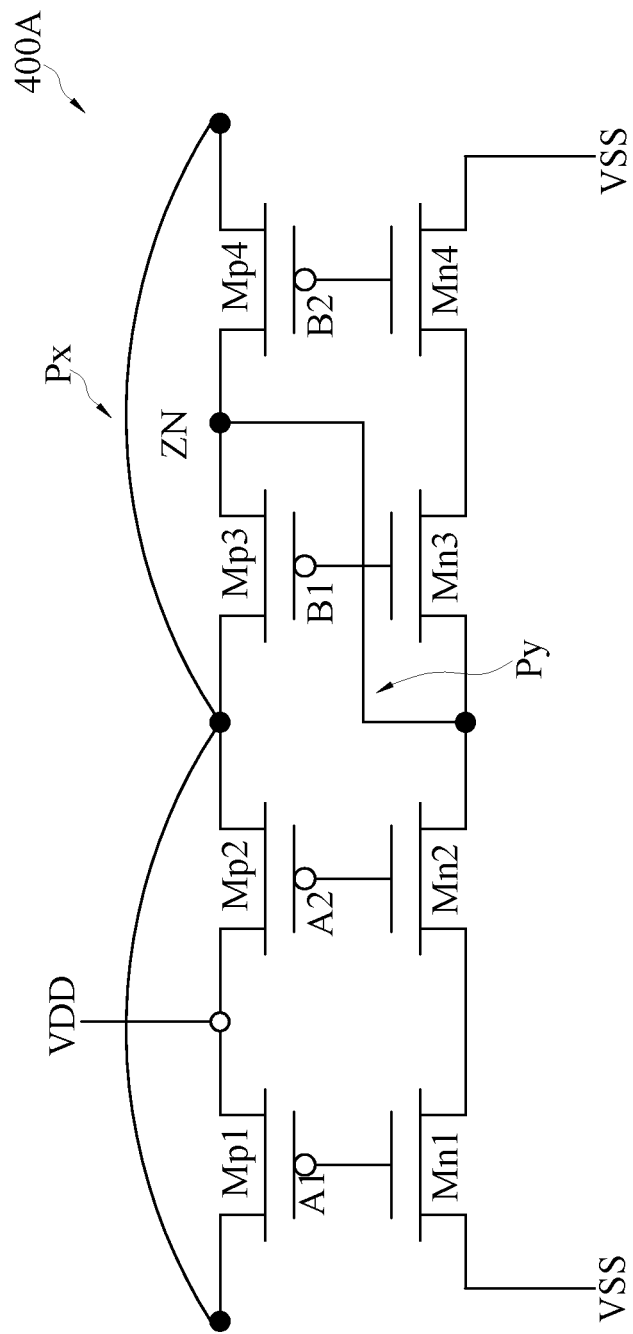
FIG. 4A is a circuit diagram of a semiconductor device, in accordance with some embodiments of the present disclosure.

FIG. 4A is a circuit diagram of a semiconductor device 400A, in accordance with some embodiments of the present disclosure. The semiconductor device 400A is a four-input And-Or-Inverter (AOI) device in the present embodiment. The semiconductor device 400A includes four P-FETs Mp1 through Mp4 connected in series and four N-FETs Mn1 through Mn4 connected in series, in which four input nodes A1, A2, B1 and B2 is coupled to gate terminals of the corresponding FETs Mpx and Mnx (x=1-4). A connection path Px is formed to electrically connect the outer source/drain terminals of the P-FETs Mp1 and Mp4 to a common source/drain terminal of the P-FETs Mp2 and Mp3, and a connection path Py is formed to electrically connect a common source/drain terminal of the P-FETs Mp3 and Mp4 to the common source/drain terminal of the N-FETs Mn2 and Mn3 at an output node ZN. During operation, the semiconductor device 400A is biased to the first voltage VDD at a common source/drain terminals of the P-FETs Mp1 and Mp2, and biased to the second voltage VSS at outer source/drain terminals of the N-FETs Mn1 and Mn4.

Figure 4B:
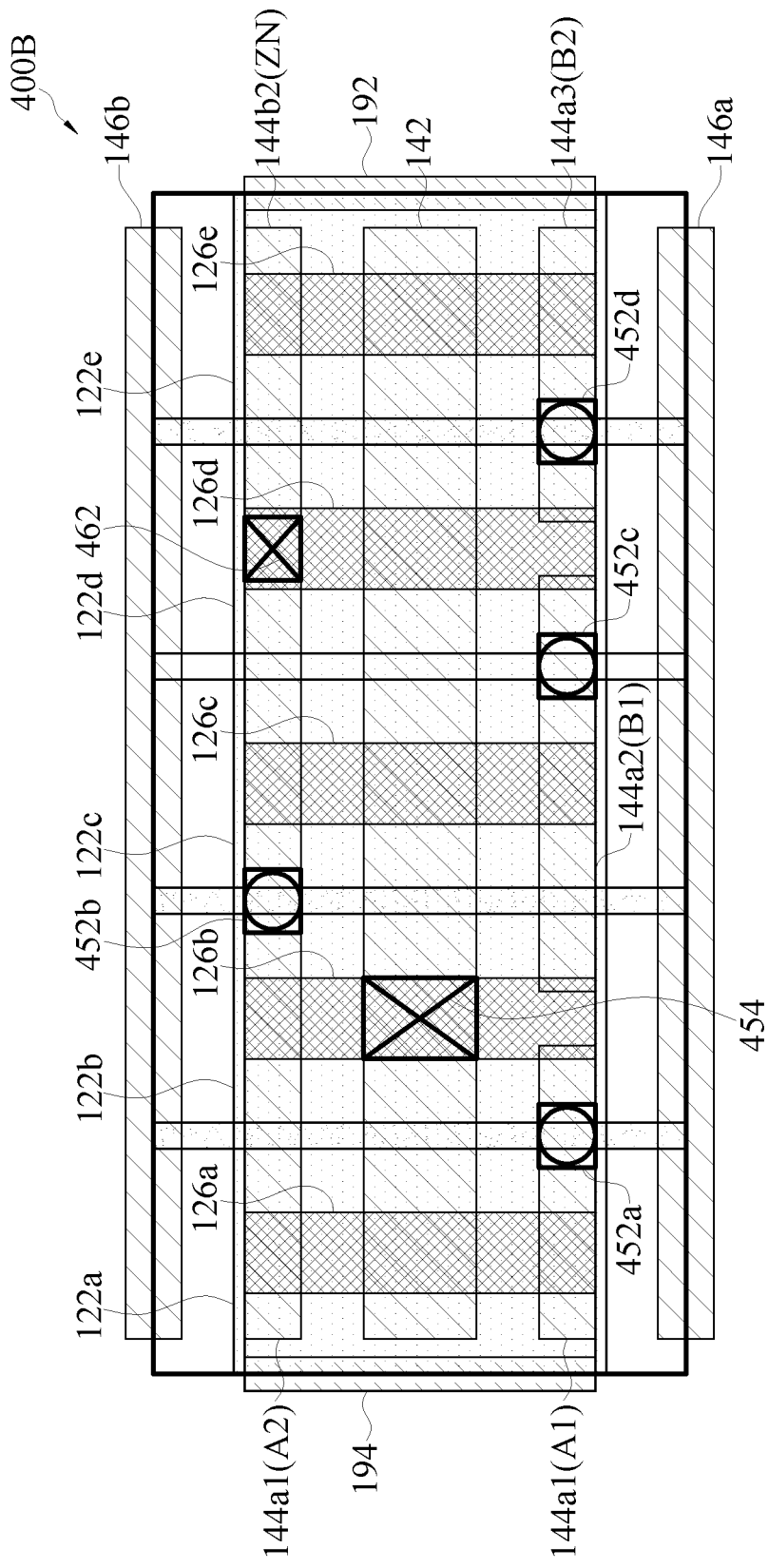
FIGS. 4B to 4D are design layouts of the semiconductor device shown in FIG. 4A, in accordance with some embodiments of the present disclosure.
Figure 4C:
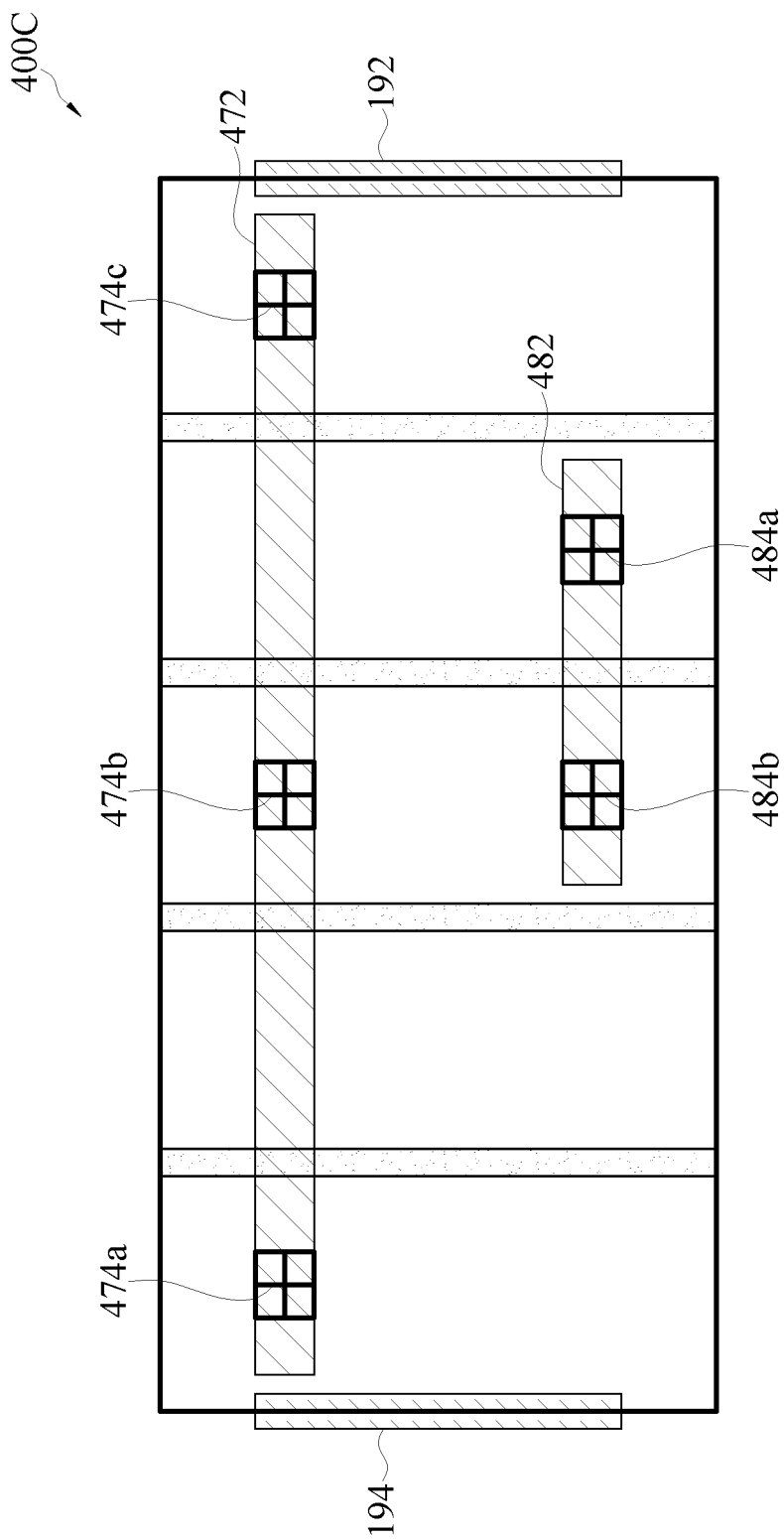
Figure 4D:
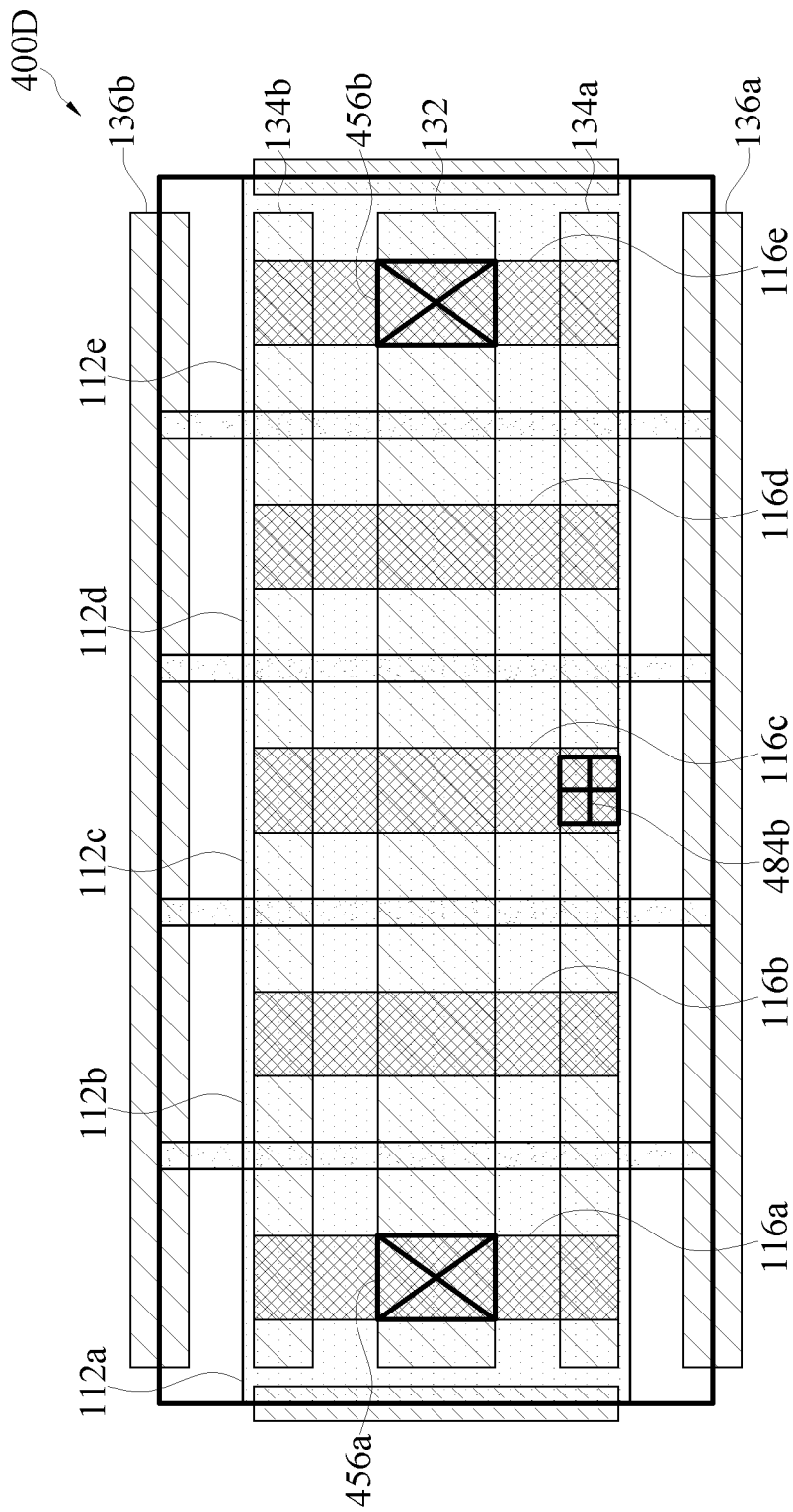
Figure 4E:
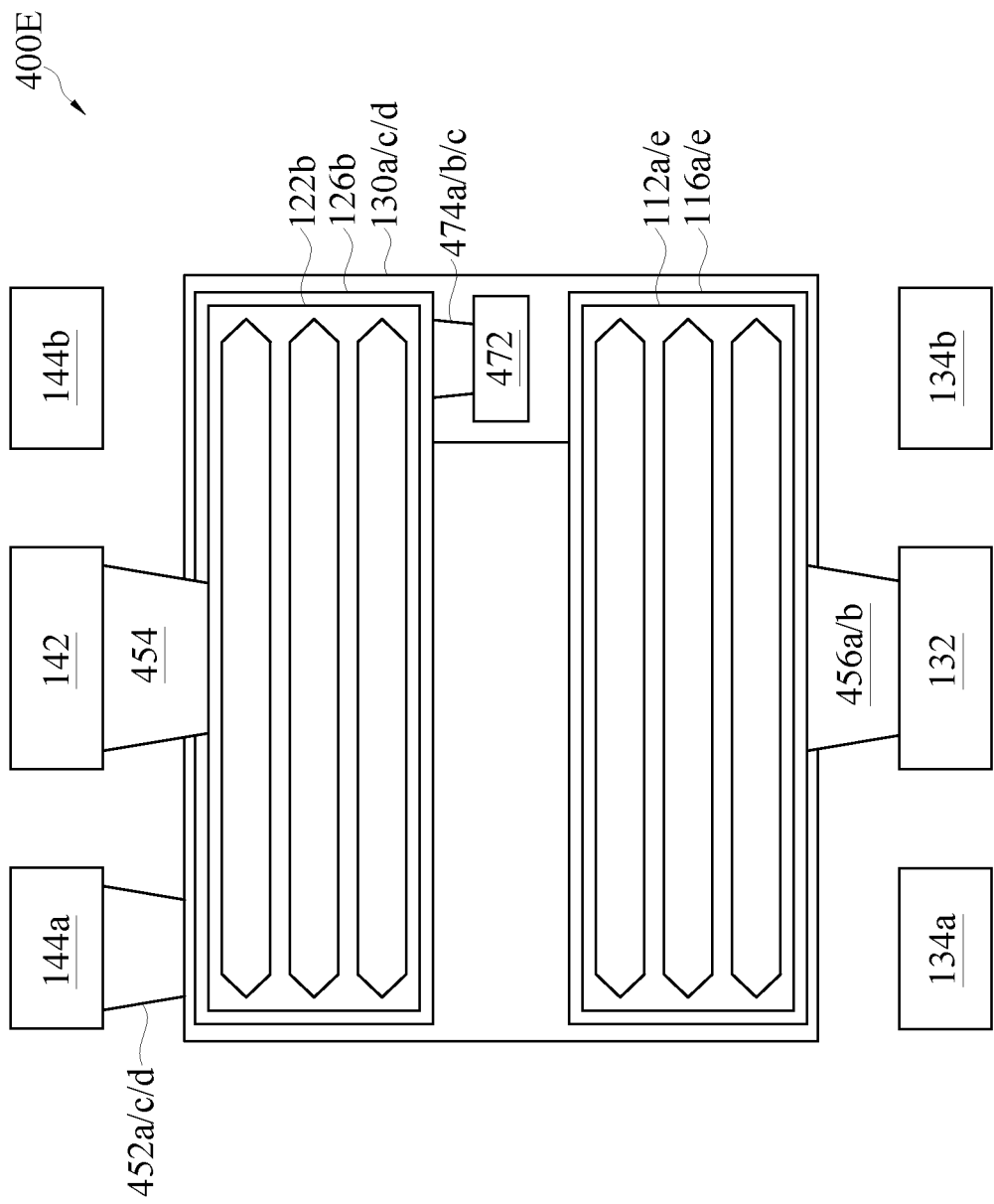
FIGS. 4E to 4G are cross-sectional views of the semiconductor device shown in FIG. 6A, in accordance with some embodiments of the present disclosure.
Figure 4F:
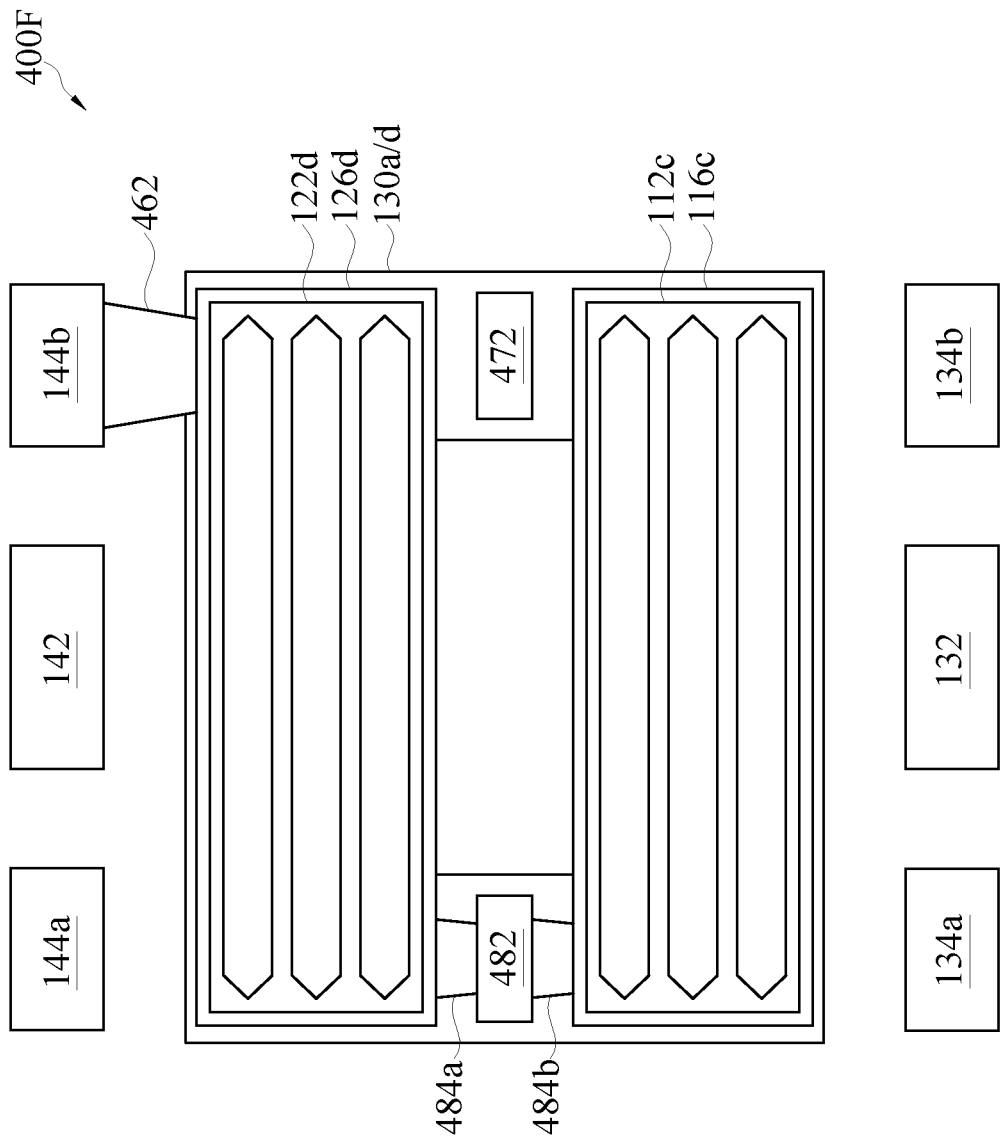
Figure 4G:
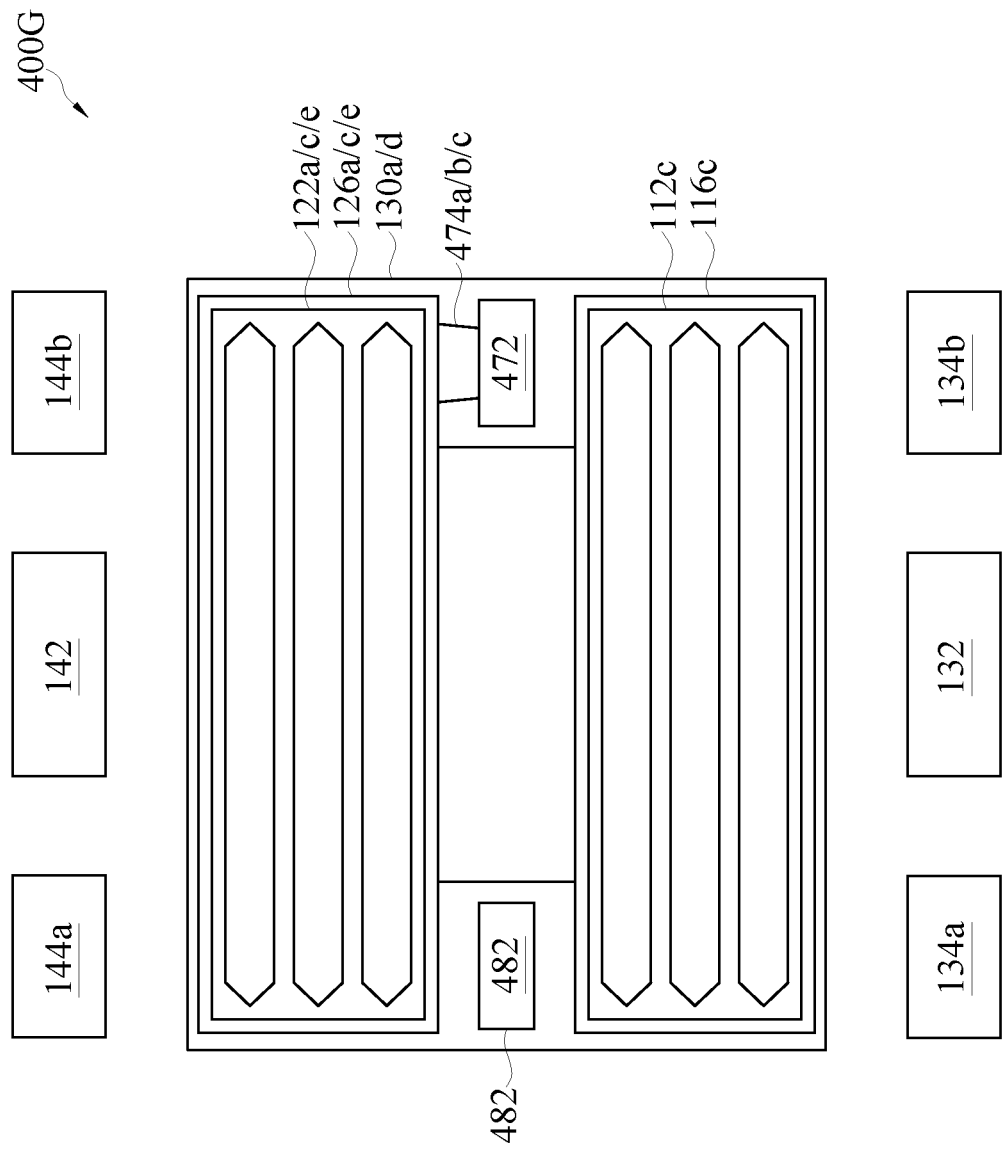

FIGS. 4B to 4D are design layouts of the semiconductor device 400A, in accordance with some embodiments of the present disclosure. In some embodiments, the semiconductor device 400A is implemented as a cell, and the design layouts 400B to 400D show different layers of the cell 400A. FIGS. 4E to 4G are cross-sectional views of the semiconductor device 400A, in accordance with some embodiments of the present disclosure.

Referring to FIGS. 4A, 4B, 4E and 4F, gates 130a, 130b, 130c and 130d partition the active region 122 into source/drain regions 122a, 122b, 122c, 122d and 122e of the P-FETs Mp1 through Mp4 and partition the active region 112 into source/drain regions 112a, 112b, 112c, 112d and 112e of the N-FETs Mn1 through Mn4. The conductive line 144a is partitioned into conductive lines 144a1, 144a2 and 144a3, which serve as input pins A1, B1 and B2 and are electrically connected to the gates 130a, 130c and 130d through gate vias 452a, 452c and 452d, respectively. The conductive line 144b is partitioned into conductive lines 144b1 and 144b2. The conductive line 144b1 serve as an input pin A2 and is electrically connected to the gate 130b through gate via 452b. The conductive line 144b2 serves as an output pin ZN and is electrically connected to the source/drain region 122d through a drain via 462 and the respective conductive line 126d.

Referring to FIGS. 4A, 4B, 4D and 4E, the power rail 142 is electrically connected to the source/drain region 122b through a drain via 454 and respective conductive line 126b. The power rail 132 is electrically connected to the source/drain regions 112a and 112e through drain vias 456a, 456b and the respective conductive lines 116a and 116e.

Referring to FIGS. 4A to 4C, 4E and 4G, a first IIS is formed by the inner conductive line 472 and conductive vias 474a, 474b, 474c. The connection path Px of FIG. 4A is implemented by the IIS shown in FIG. 4C for electrically connecting the source/drain regions 122a, 12c and 122e through the inner conductive vias 474a, 474b and 474c and the inner conductive line 472. In some embodiments, the first IIS further includes the conductive lines 126a, 126c and 126e between the source/drain regions 122a, 12c and 122e and the respective inner conductive vias 474a, 474b and 474c.

Referring to FIGS. 4A, 4C, 4D, 4F and 4G, a second IIS is formed by the inner conductive line 482 and inner conductive vias 484a, 484b. The connection path Py of FIG. 4A is implemented by the second IIS shown in FIG. 4C for electrically connecting source/drain regions 122d and 112c through the inner conductive via 484a, the inner conductive line 482, the inner conductive via 484b, and optionally the conductive line 126d and/or the conductive line 116c.

Figure 5A:
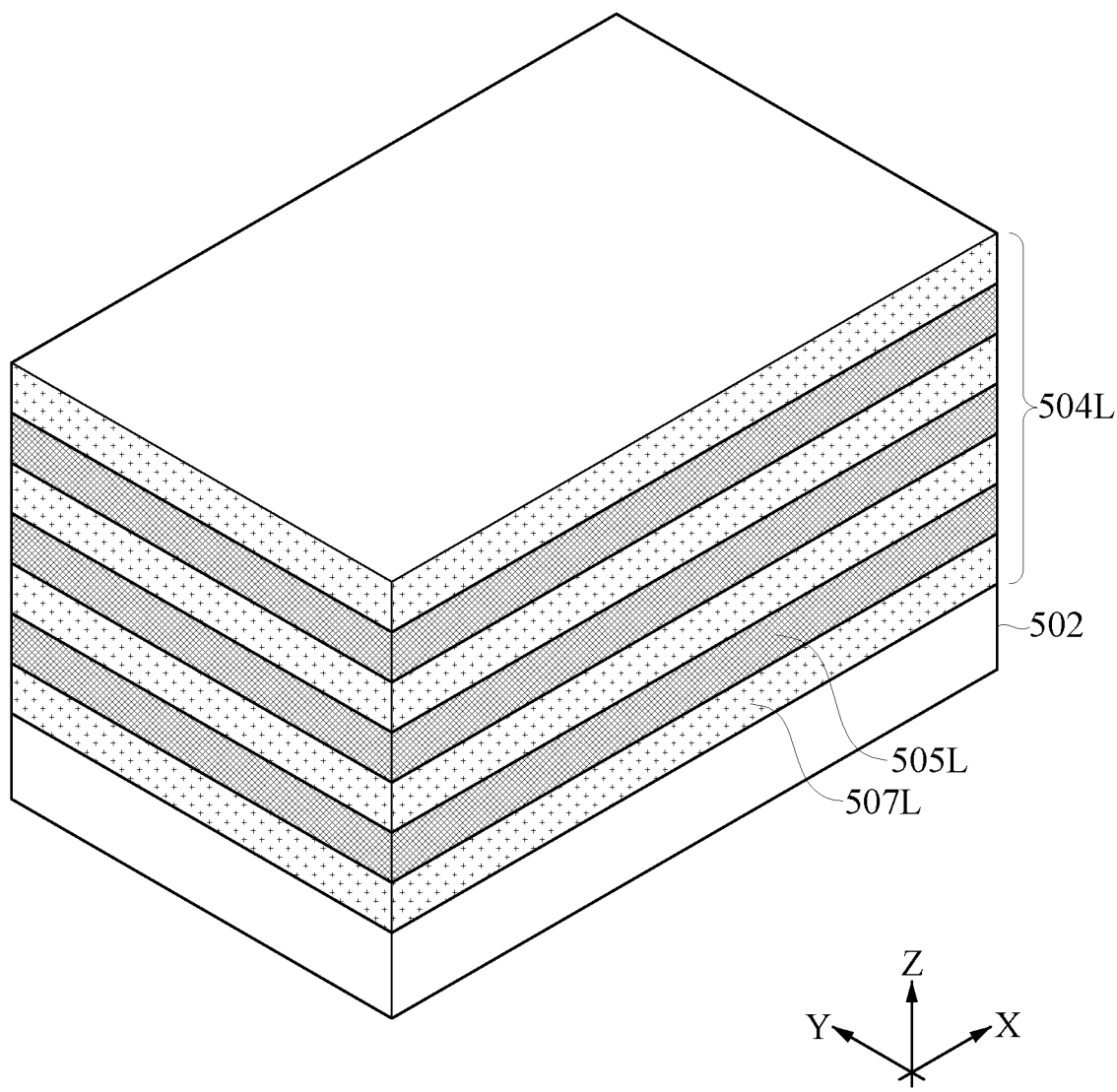
FIGS. 5A to 5P, 5Q(A) to 5Q(C), 5R(A) to 5R(C), 5S(A) to 5S(C), 5T(A) to 5T(C), 5U(A) to 5U(C), 5V(A) to 5V(C), 5W(A) to 5W(C), 5X(A) to 5X(C) and 5Y(A) to 5Y(C) are cross-sectional views and perspective views of intermediate stages of a method of manufacturing a semiconductor device, in accordance with some embodiments of the present disclosure.
Figure 5B:
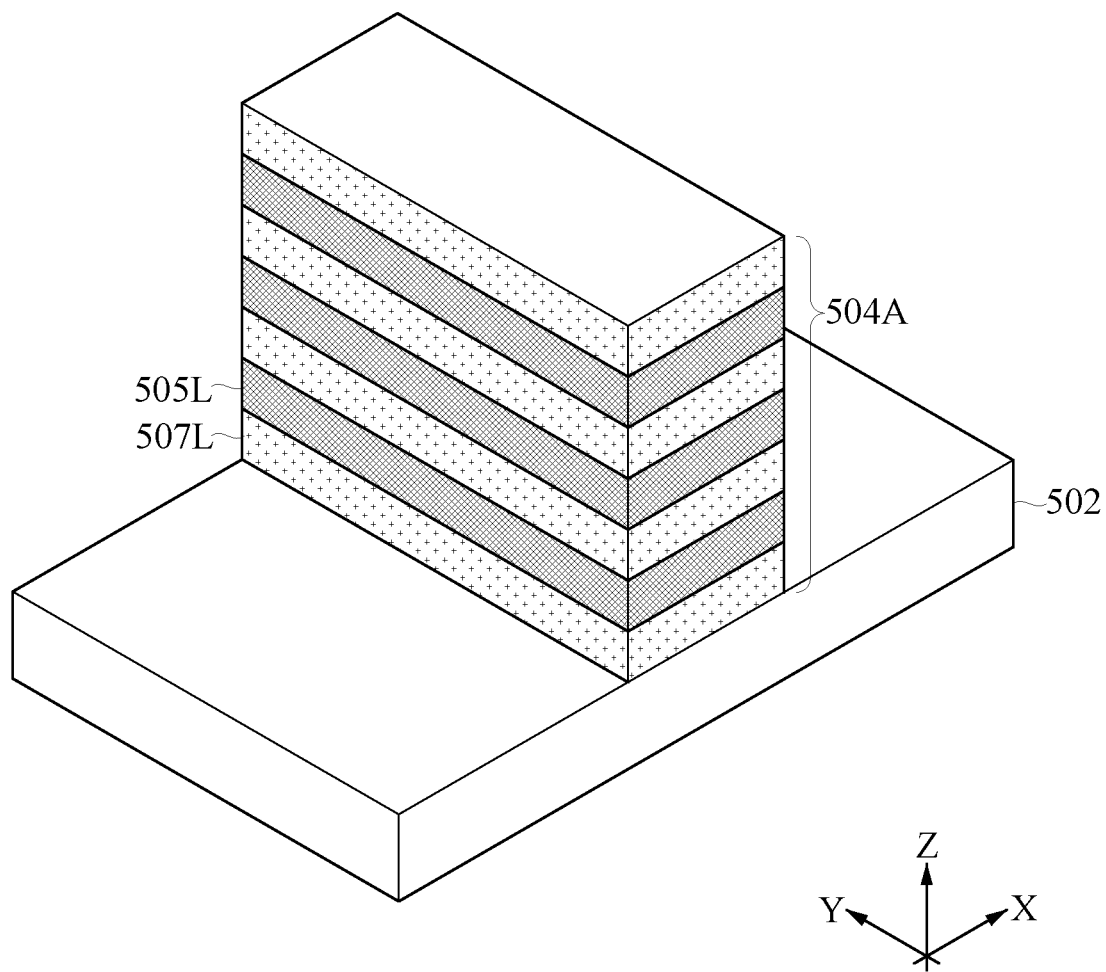
Figure 5C:
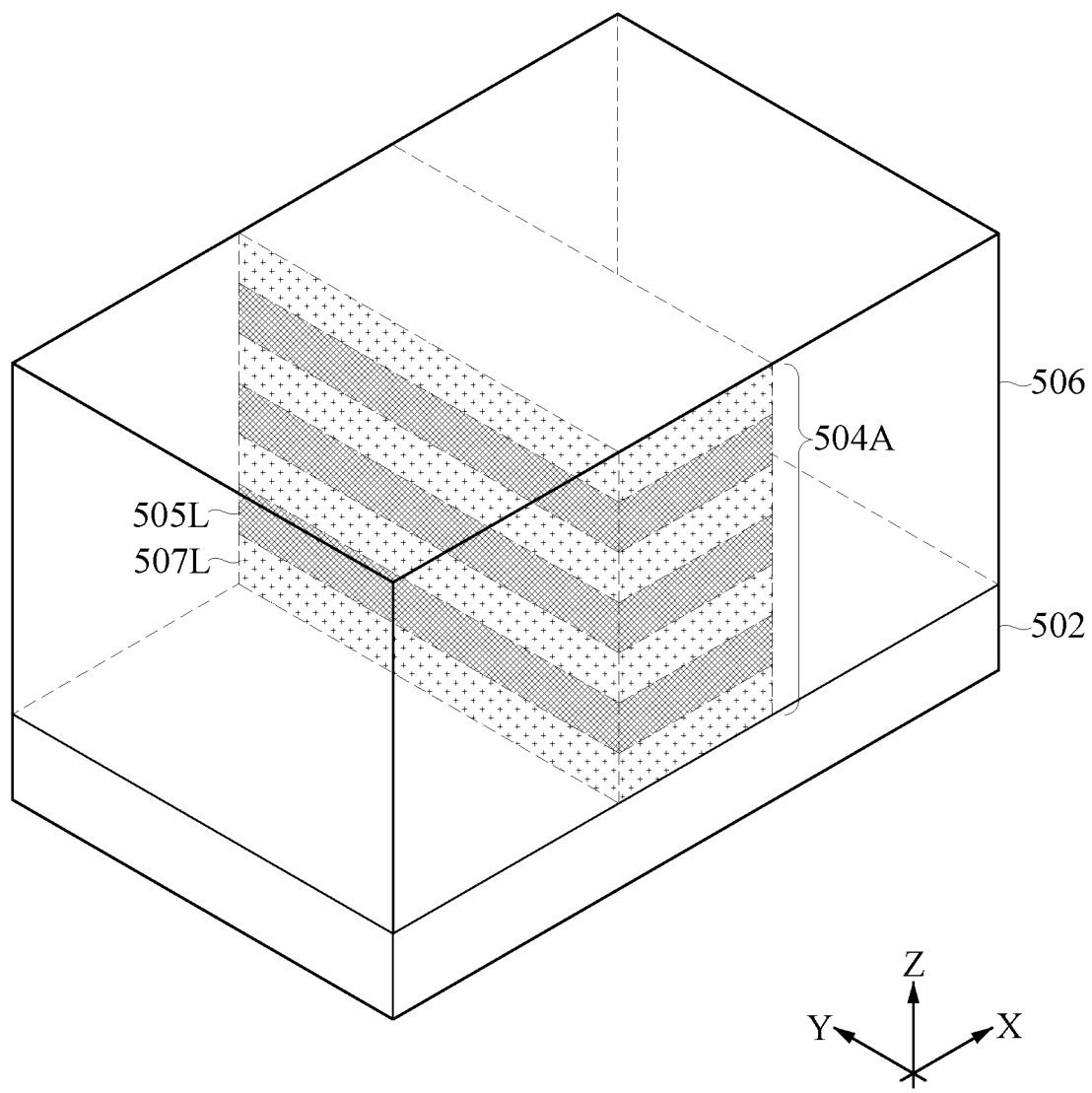
Figure 5D:
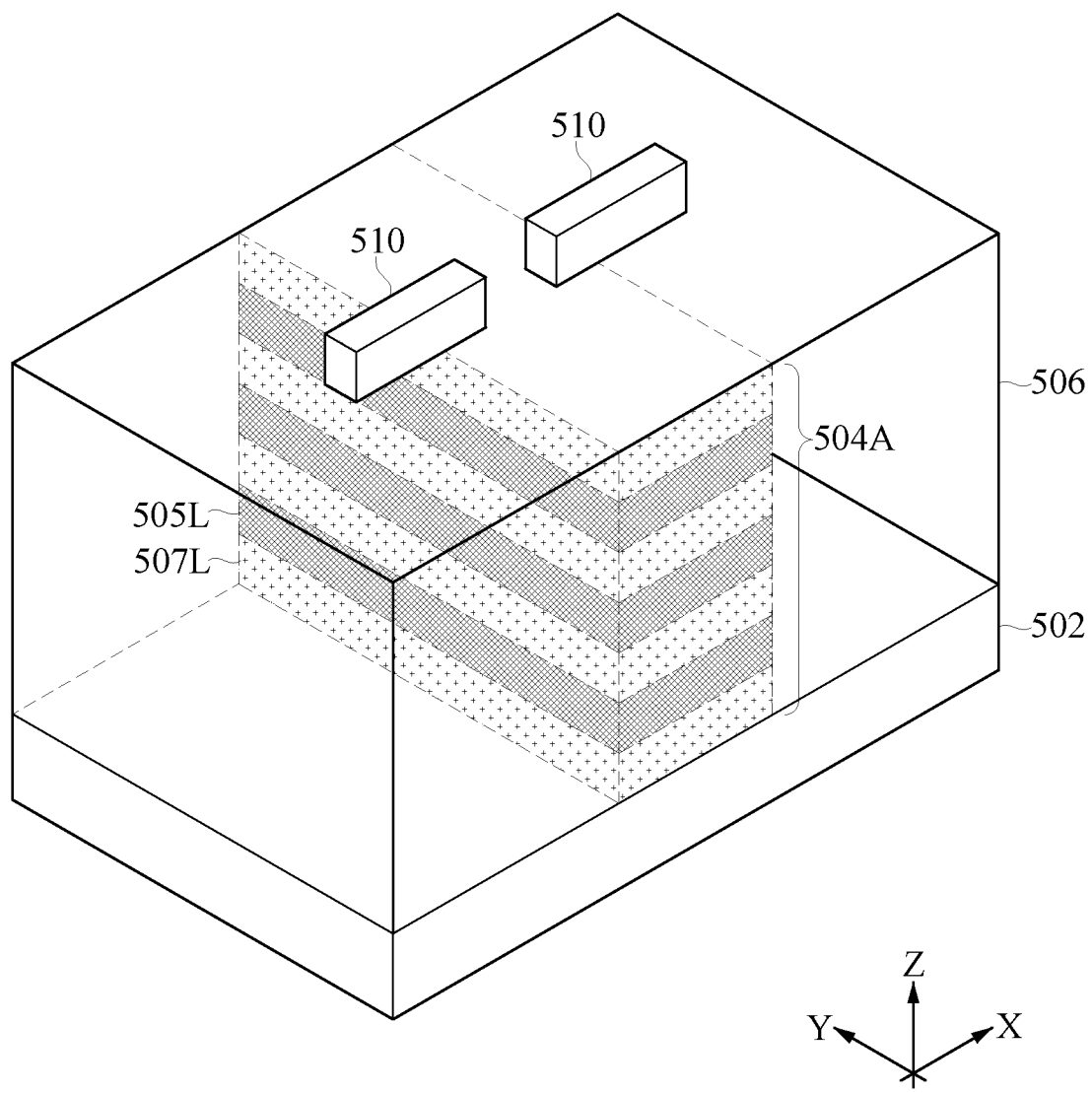
Figure 5E:
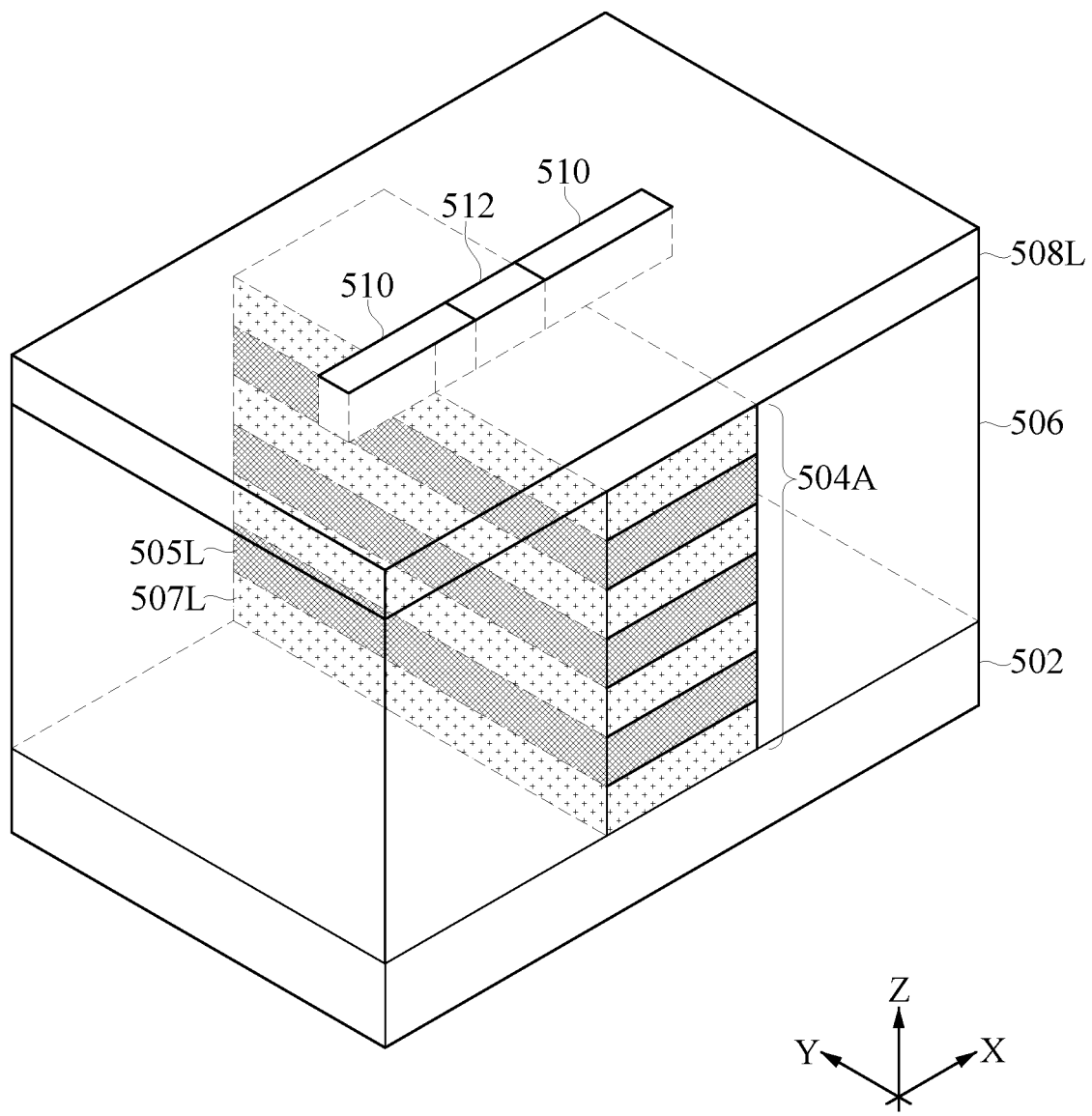
Figure 5F:
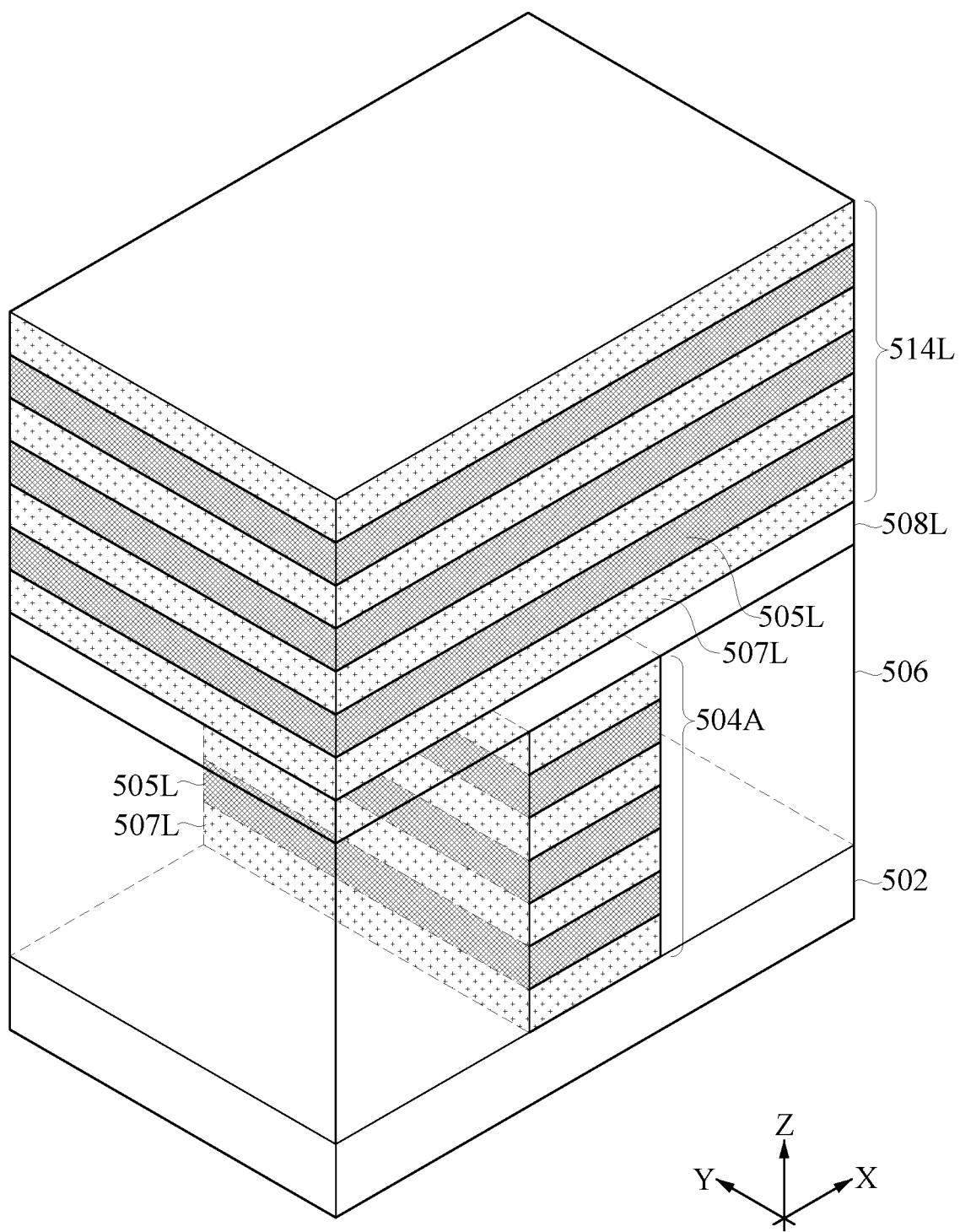
Figure 5G:
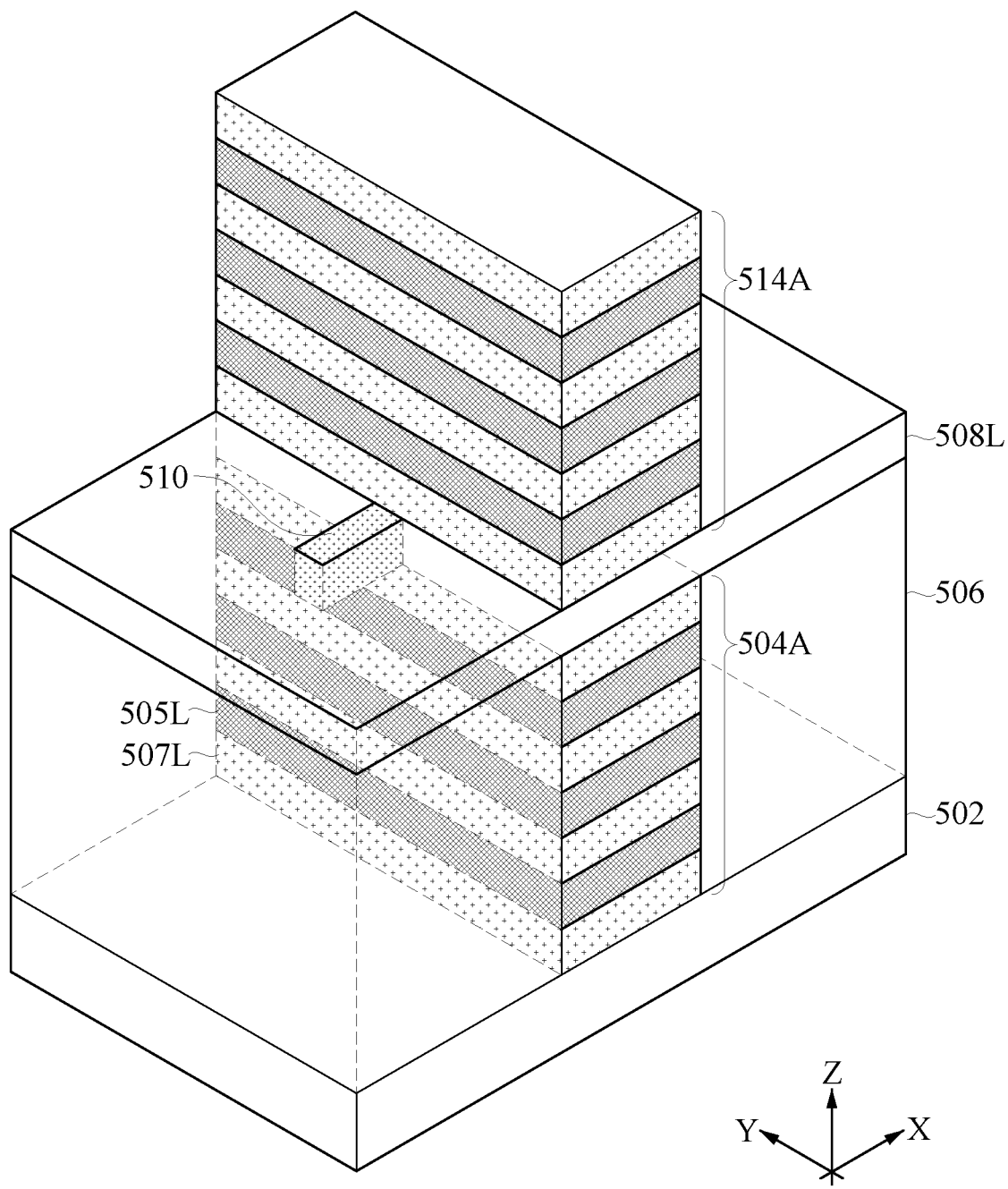
Figure 5H:
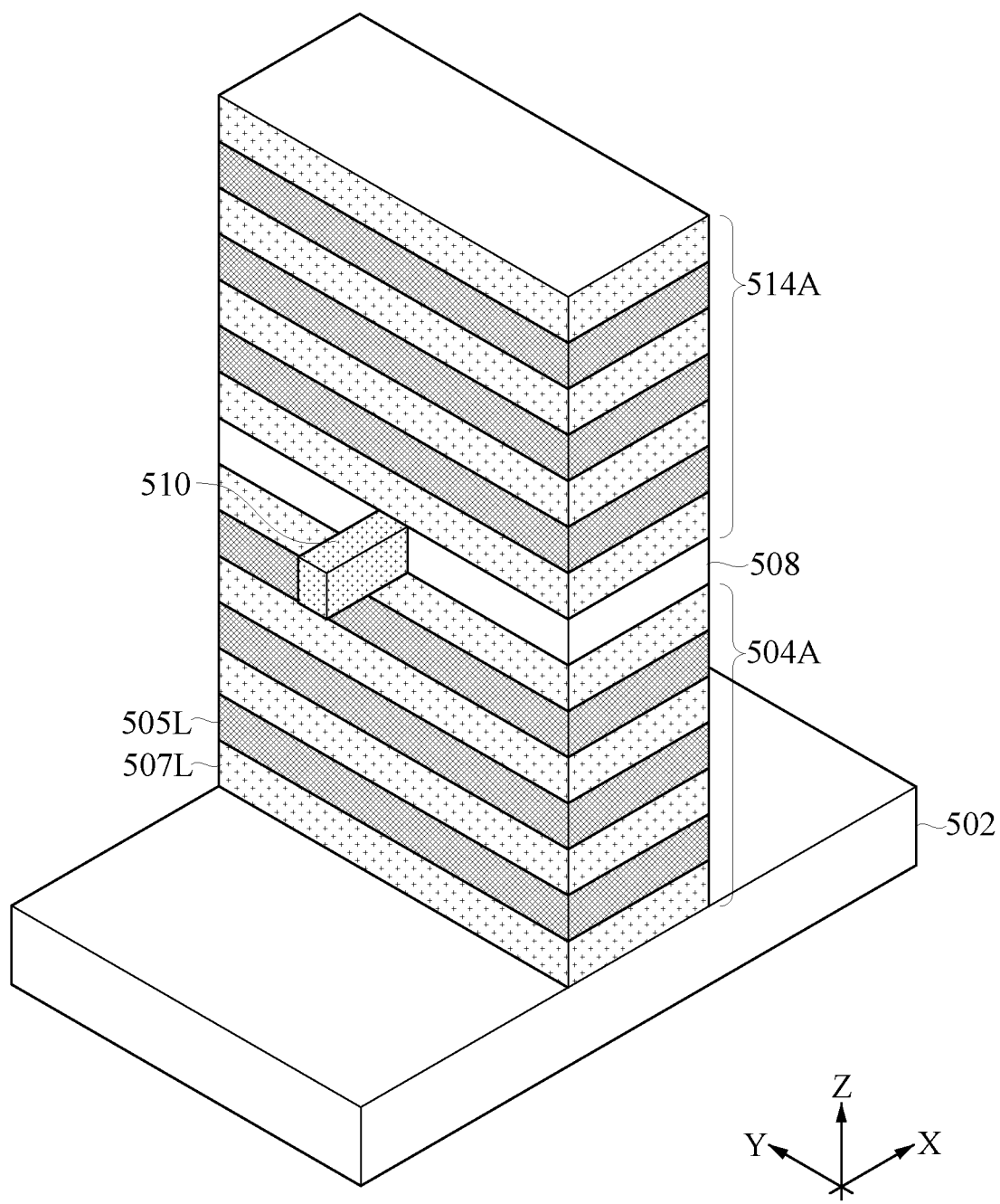
Figure 5I:
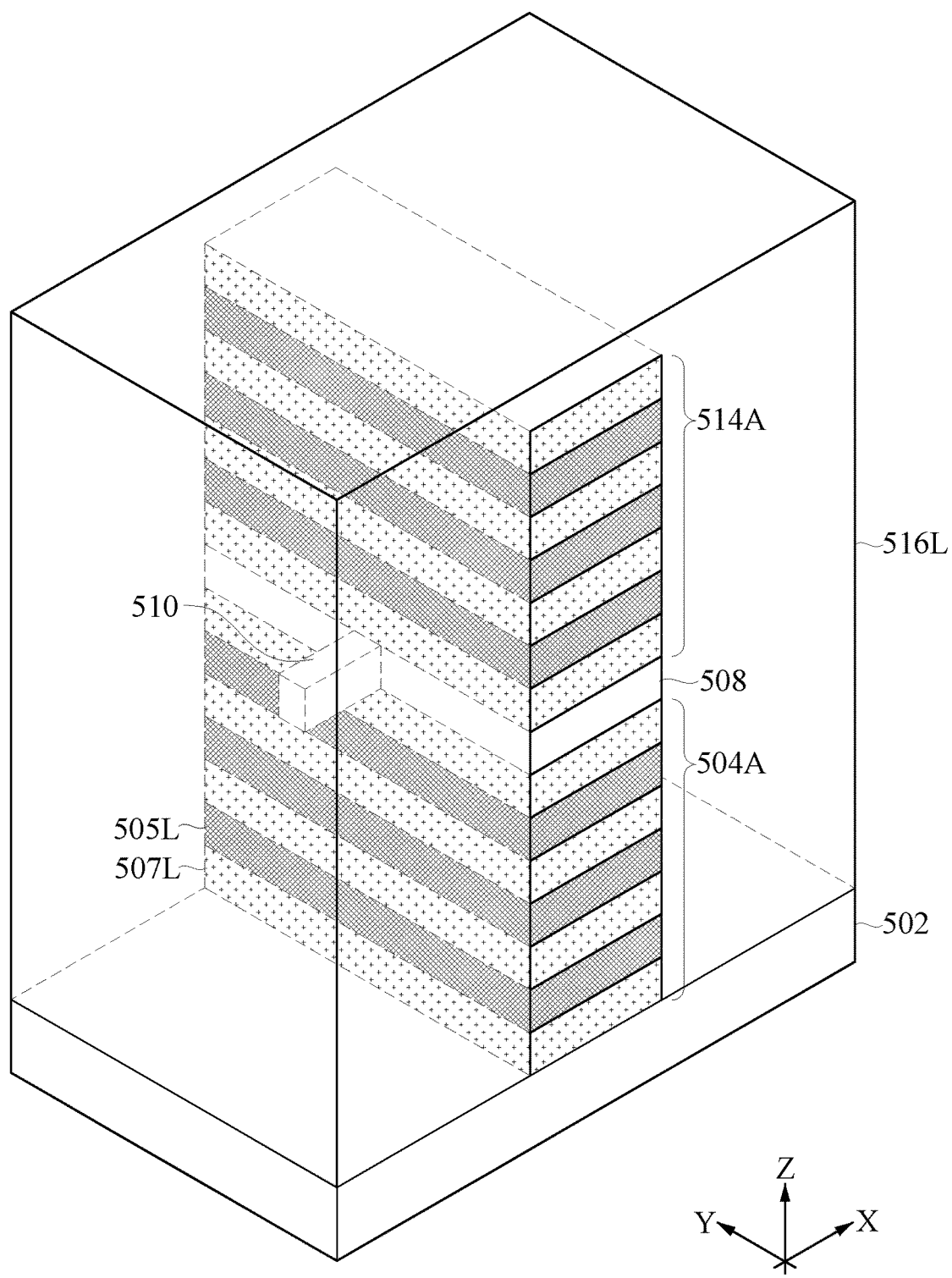
Figure 5J:
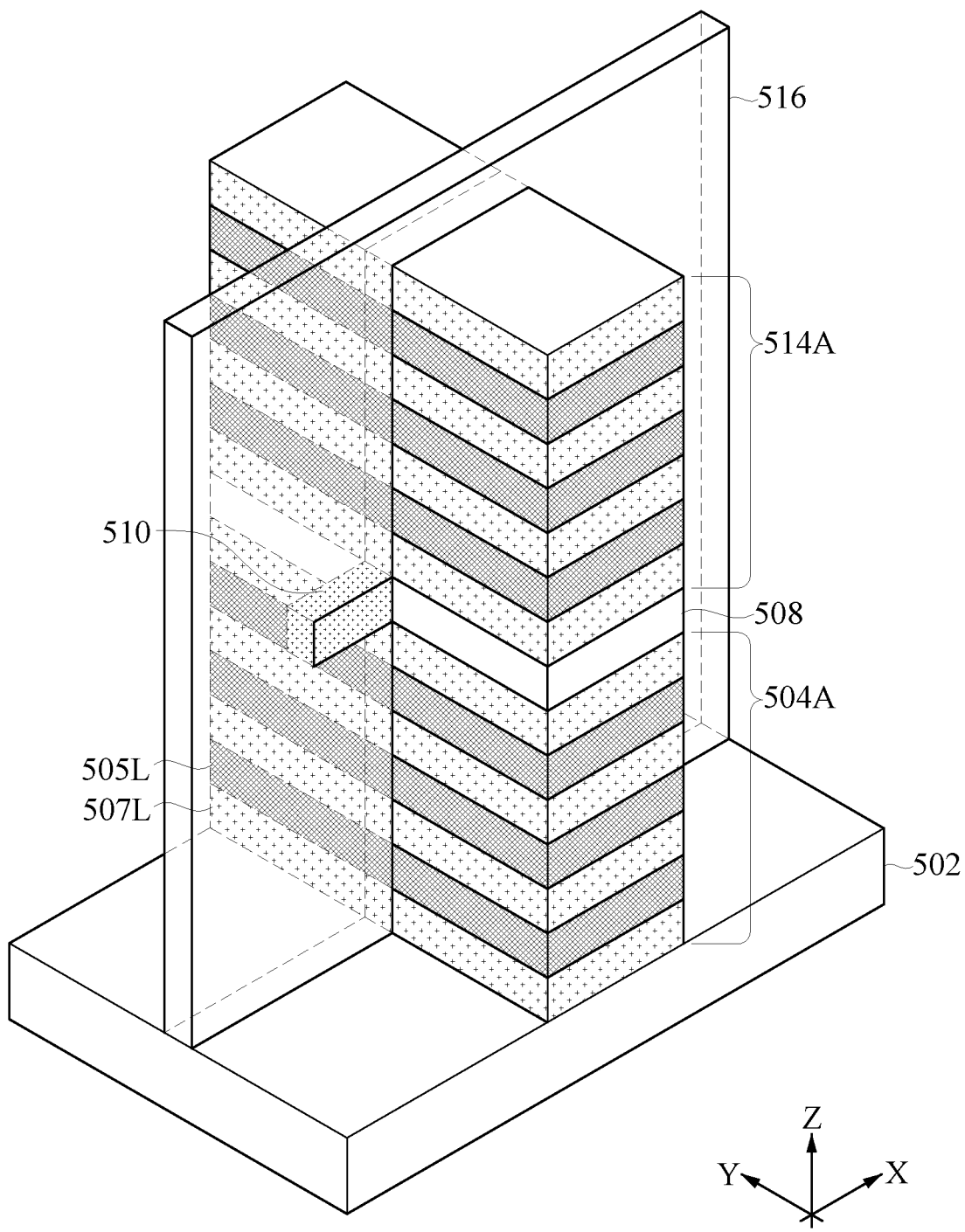
Figure 5K:
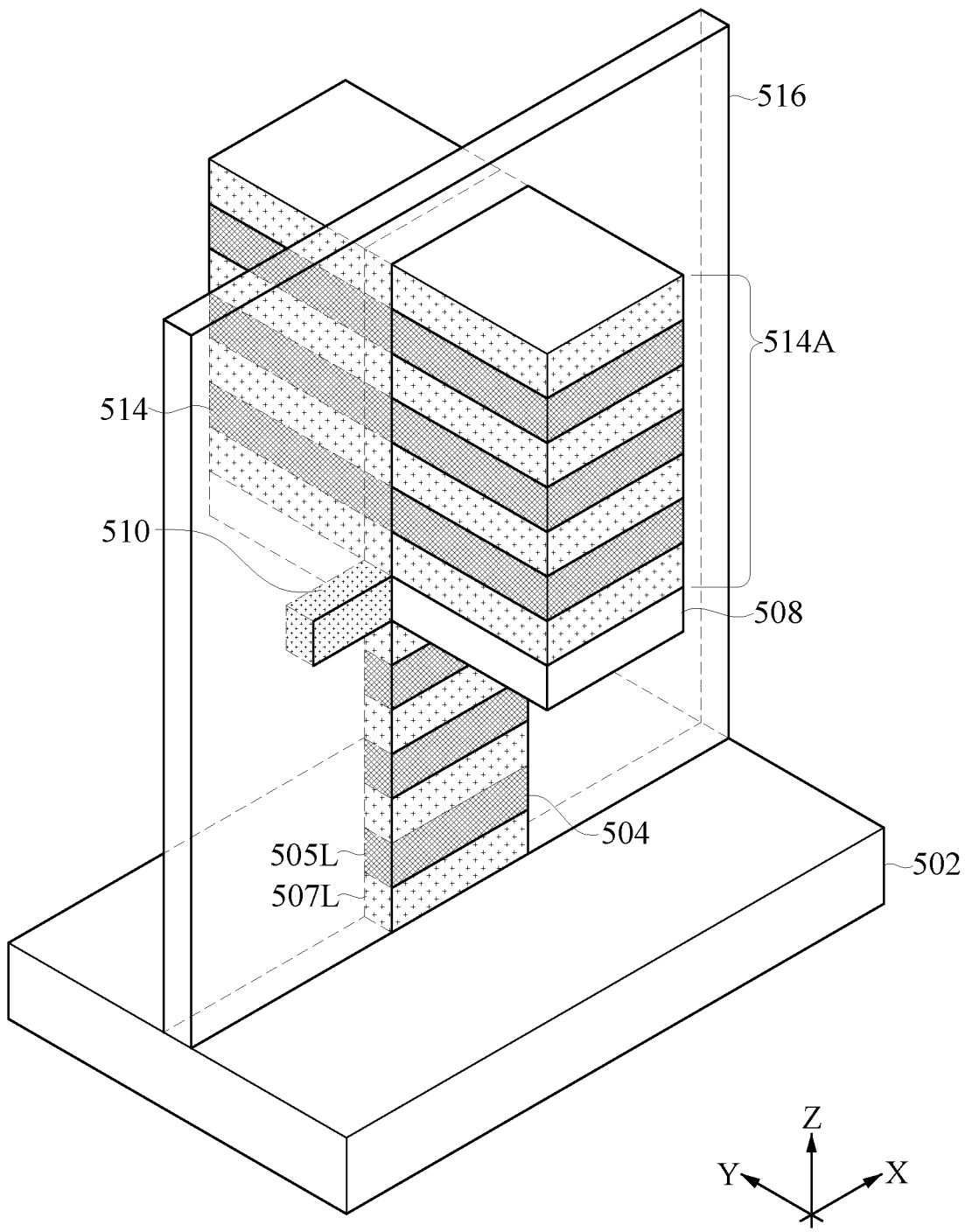
Figure 5L:
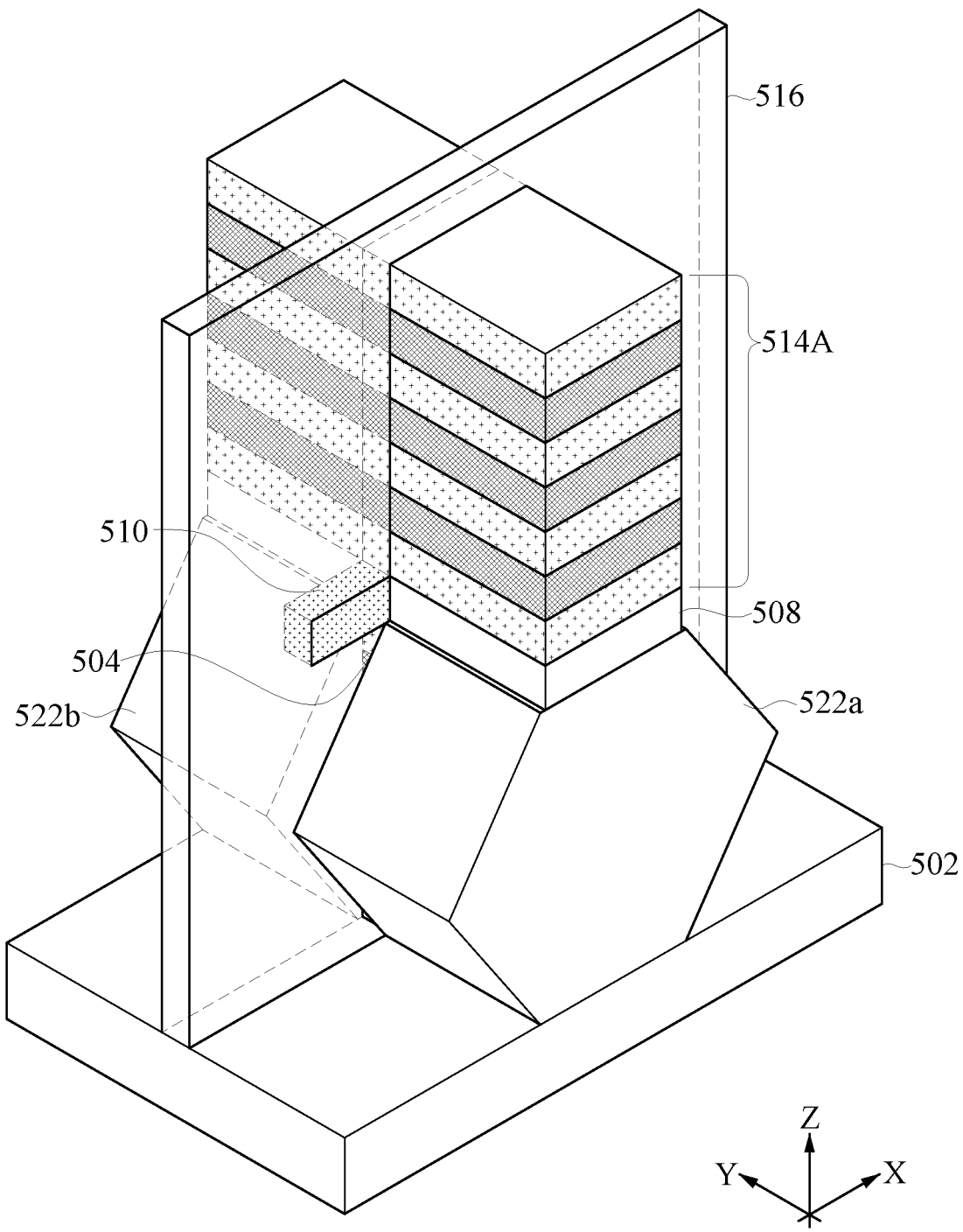
Figure 5M:
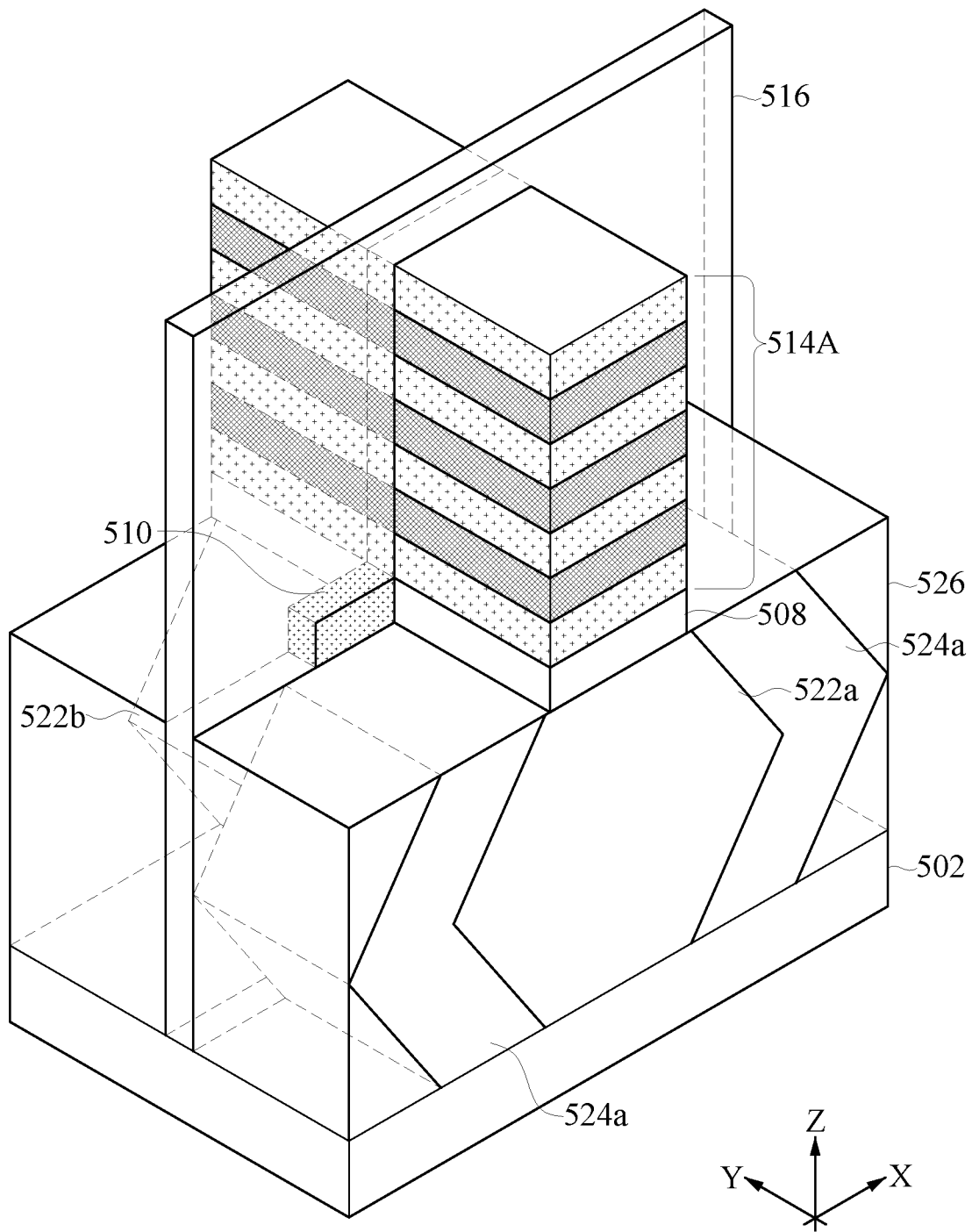
Figure 5N:
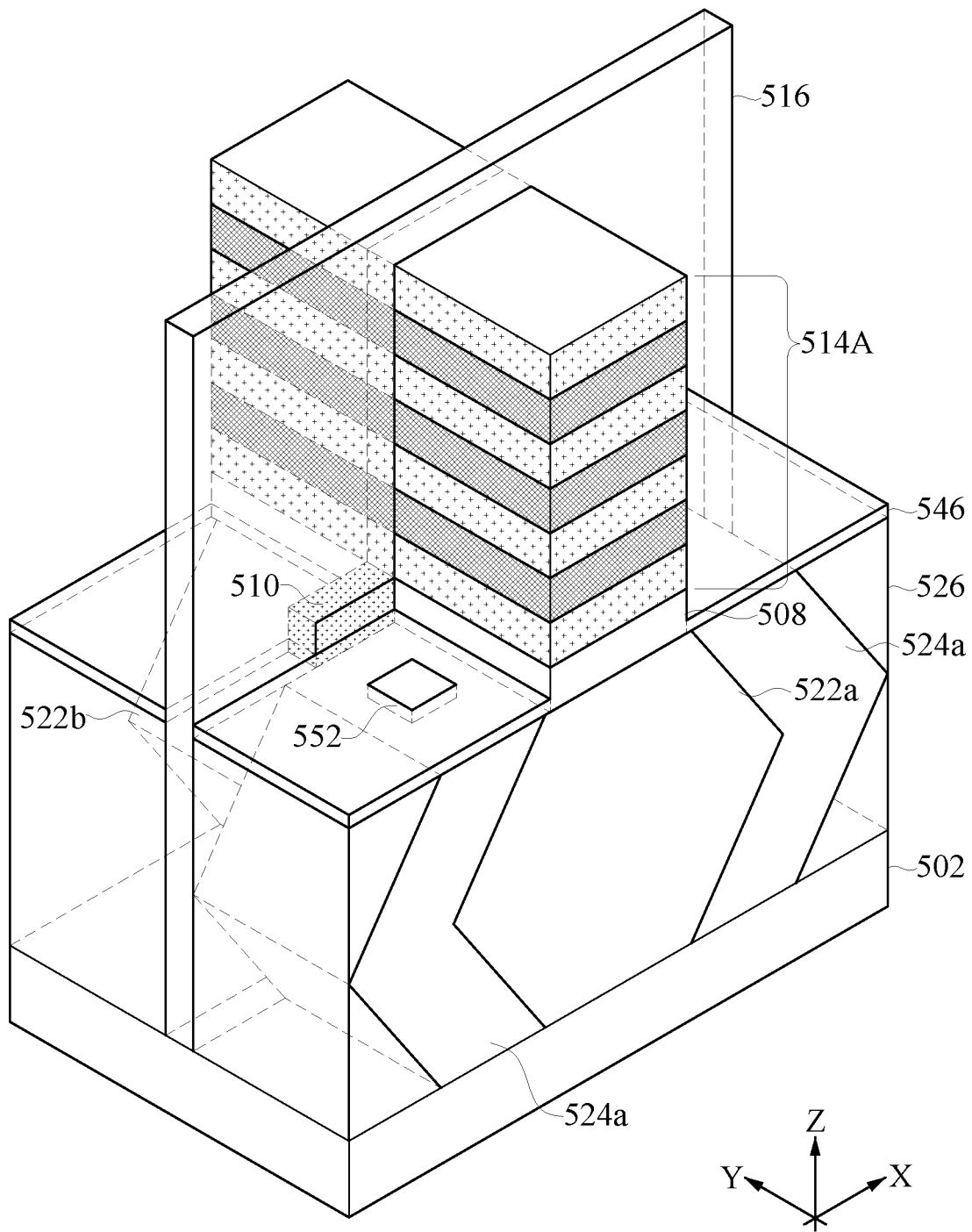
Figure 5O:
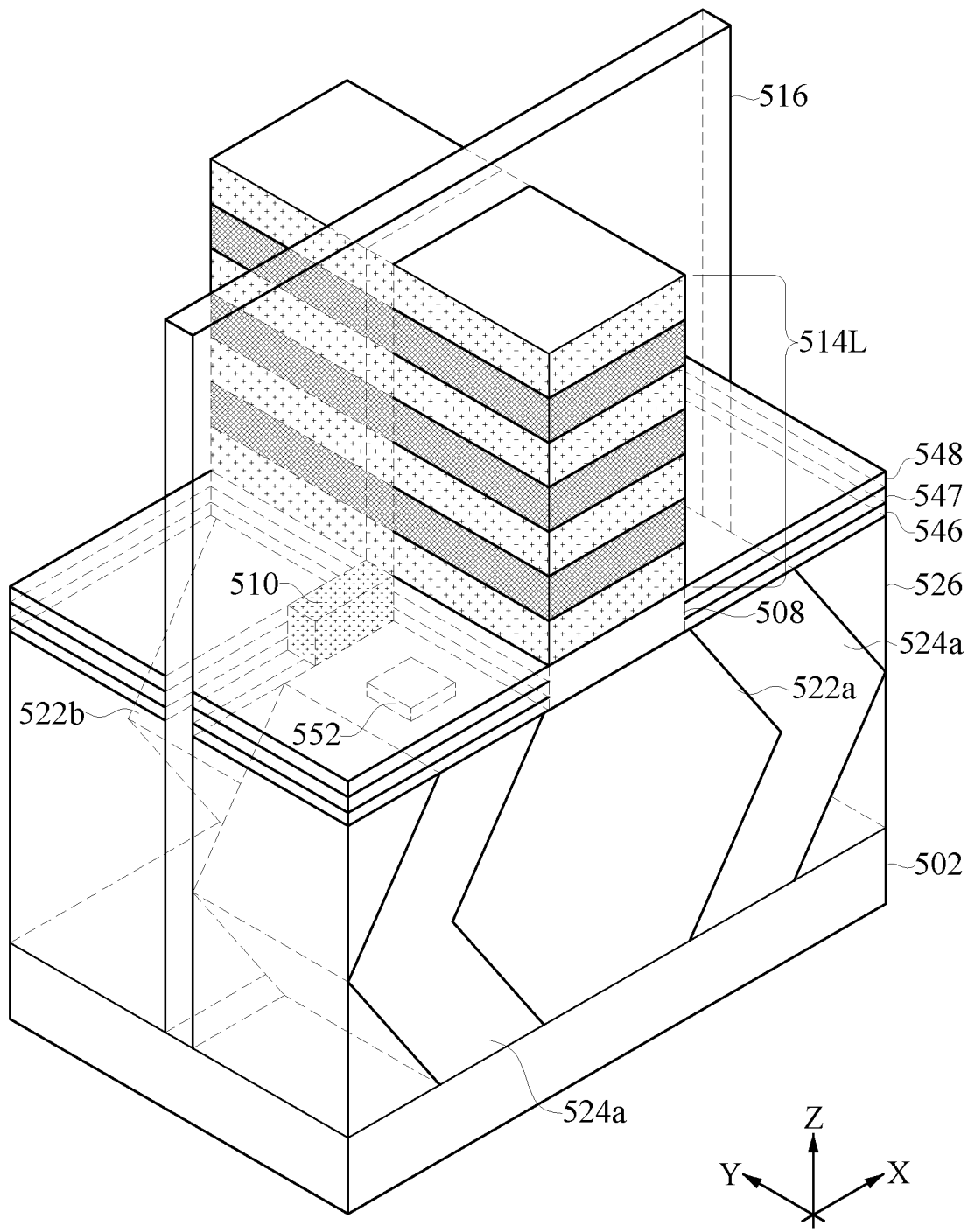
Figure 5P:
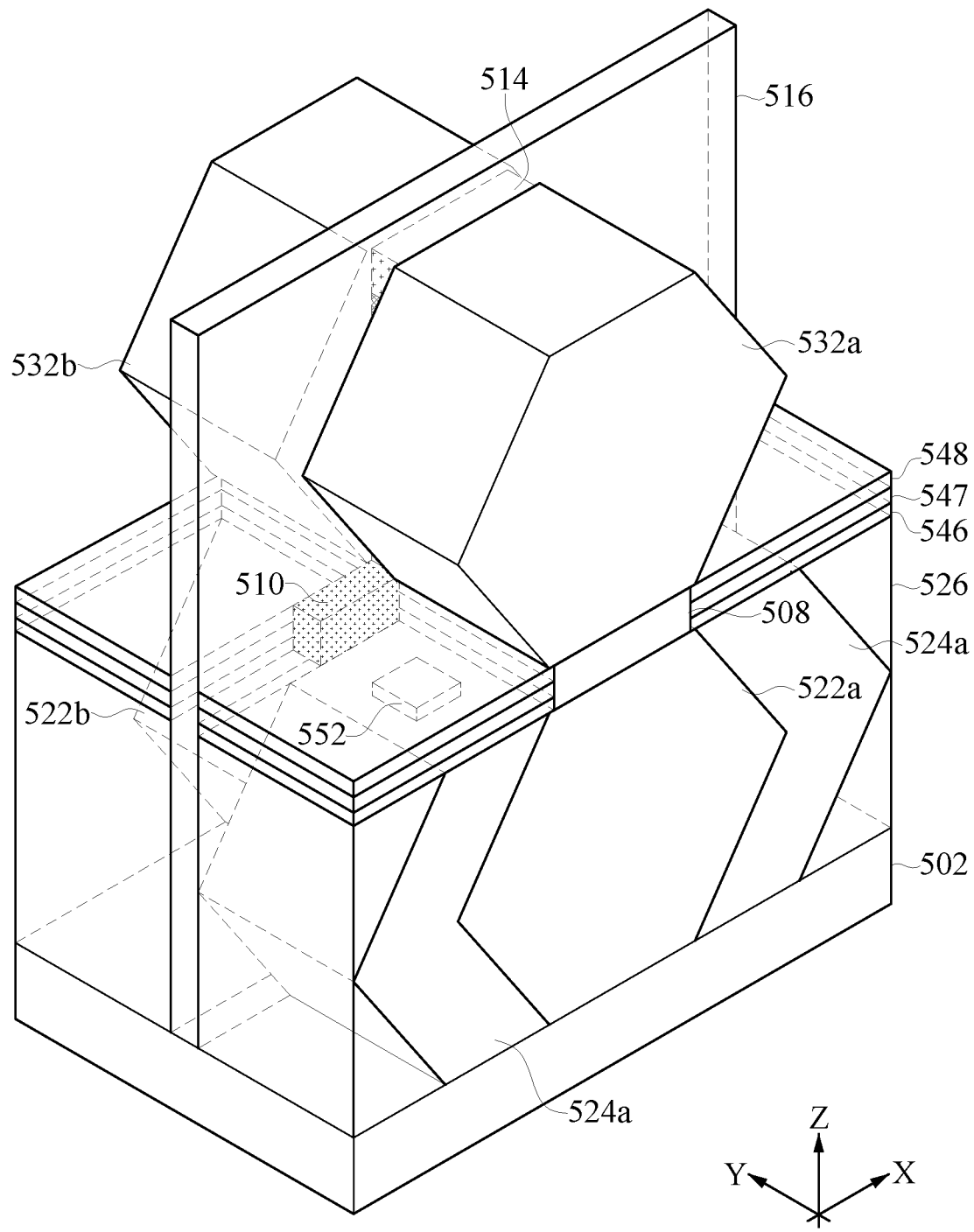
Figure 5Q:
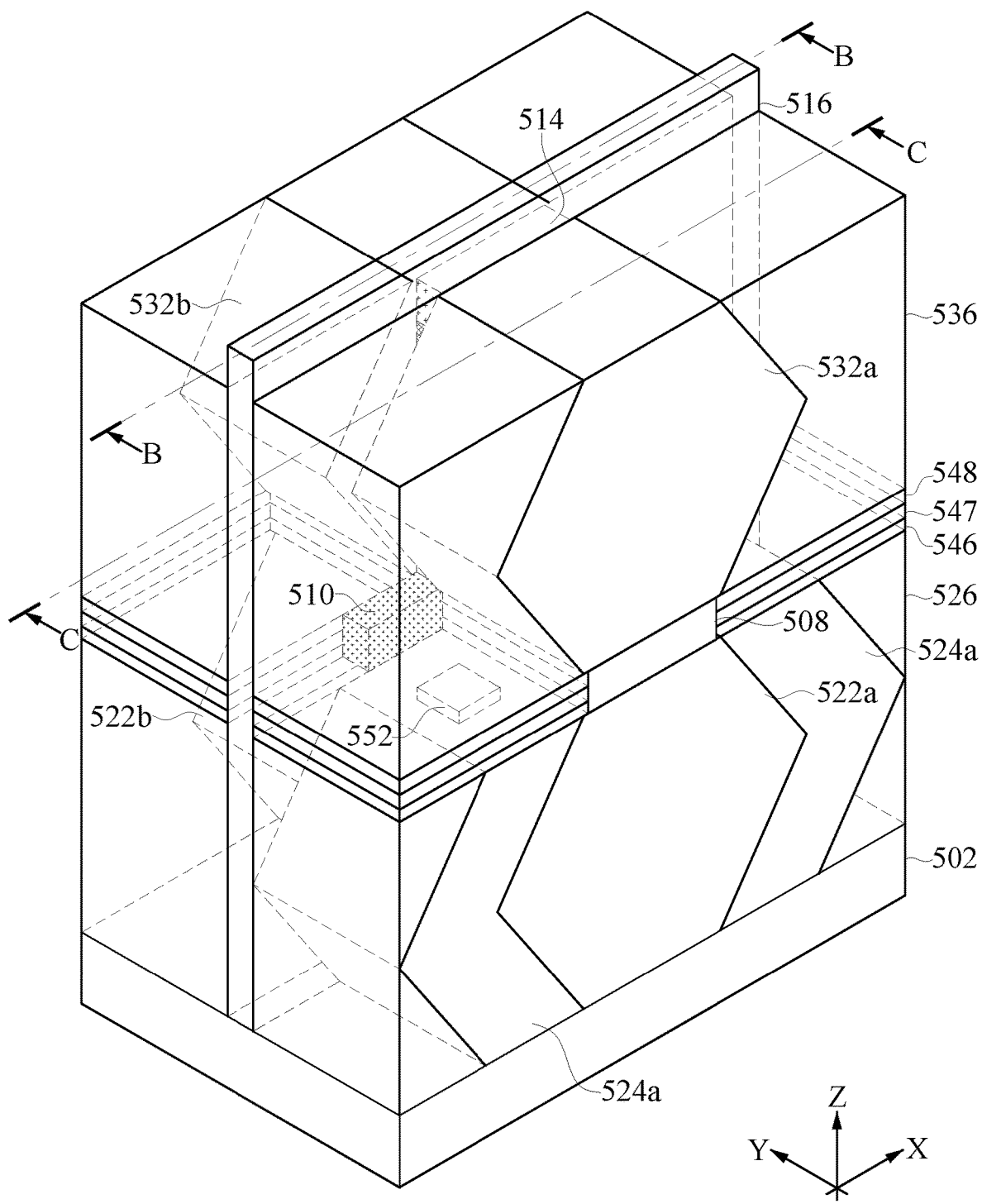
Figure 5Q:
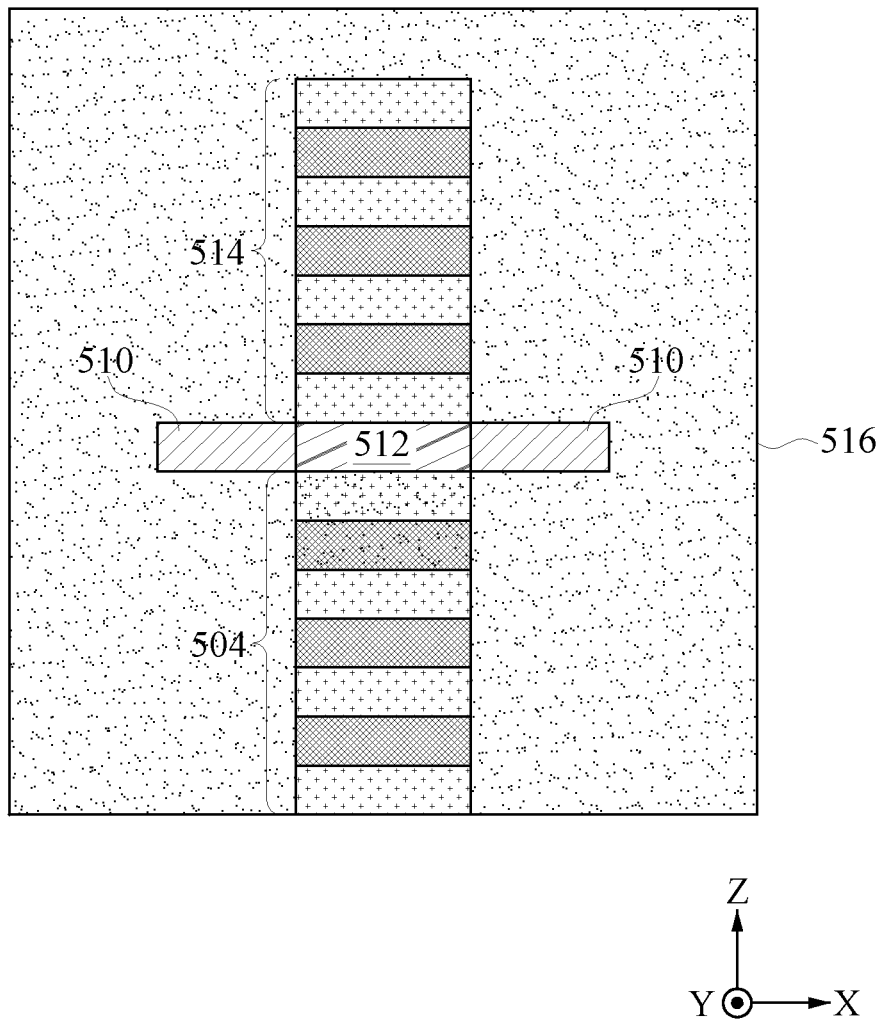
Figure 5Q:
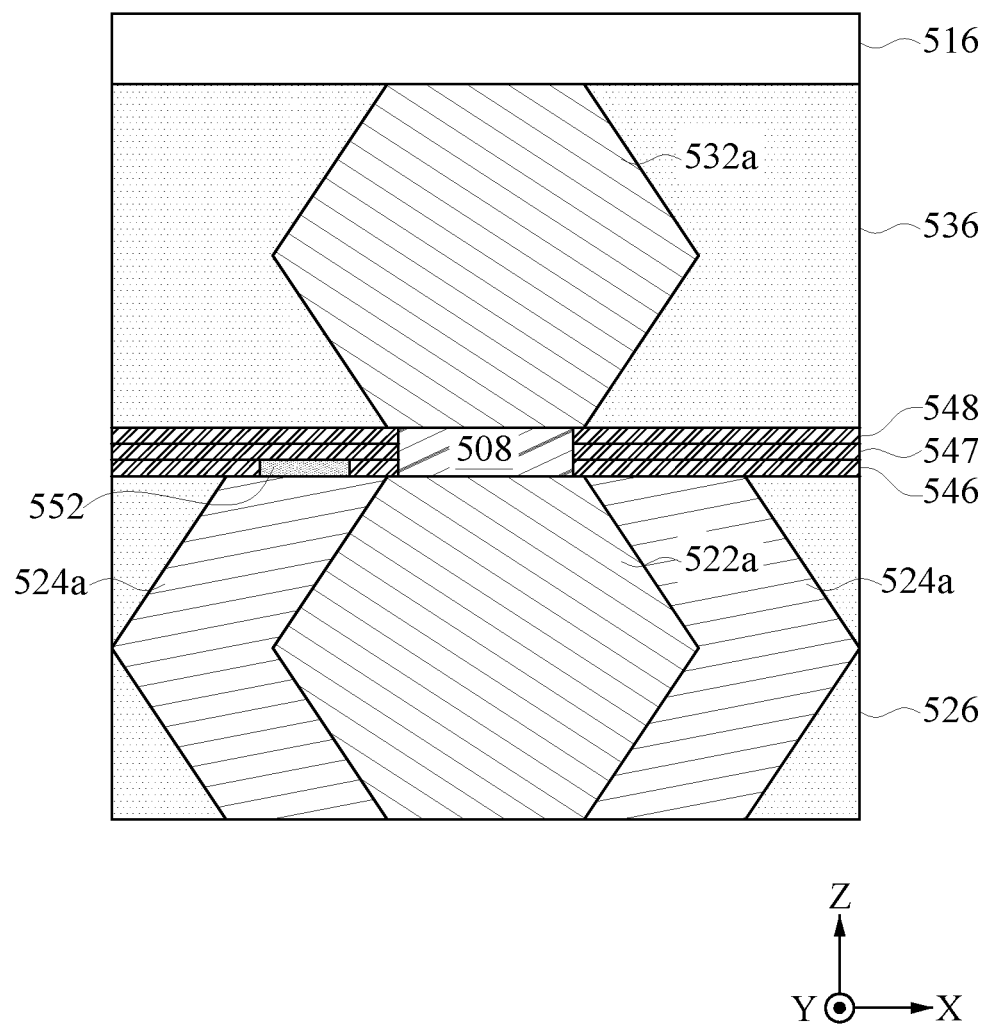

FIGS. 5A to 5P, 5Q(A) to 5Q(C), 5R(A) to 5R(C), 5S(A) to 5S(C), 5T(A) to 5T(C), 5U(A) to 5U(C), 5V(A) to 5V(C), 5W(A) to 5W(C), 5X(A) to 5X(C) and 5Y(A) to 5Y(C) are cross-sectional views and perspective views of intermediate stages of a method of manufacturing a semiconductor device 500A, in accordance with some embodiments of the present disclosure. The semiconductor device 500A may be similar to the semiconductor devices 200A, 300A and 400A. It should be understood that additional steps can be provided before, during, and after the steps shown below, and some of the steps described below can be replaced or eliminated in other embodiments. The order of the steps may be interchangeable.

Referring to FIG. 5A, a substrate 502 is received or formed. In some embodiments, the substrate 502 is formed of a semiconductor material, such as silicon, or a dielectric material, such as silicon nitride, silicon oxide, ceramic, glass, or other suitable materials. In some embodiments, the substrate 502 includes a multi-layer structure.

A first multilayer structure 504L is deposited over the substrate 502. In some embodiments, the first multilayer structure 504L includes a plurality of first semiconductor layers 505L and a plurality of second semiconductor layers 507L alternatively arranged with the plurality of first semiconductor layers 505L. In some embodiments, the first semiconductor layer 505L and the second semiconductor layer 507L have sufficient etching selectivity with respect to an etchant, e.g., the first semiconductor layer 505L is formed of silicon and the second semiconductor layer 507L is formed of silicon germanium. In some embodiments, during subsequent operations, the first semiconductor layers 505L are patterned to form channel regions of FETs of a CFET.

Referring to FIG. 5B, the first multilayer structure 504L is patterned into a first semiconductor stack 504A, in which the first semiconductor layers 505L and the second semiconductor layers 507L are patterned into first semiconductor layers 505 and second semiconductor layers 507, respectively. In some embodiments, the patterning of the first multilayer structure 504L is performed using lithographic and etching operations. In some embodiments, the etching operation includes a dry etch, a wet etch or a combination thereof, e.g., reactive ion etch (RIE). An upper surface of the substrate 502 is exposed during the patterning operation of FIG. 5B.

In some embodiments, one or more mask layers are formed over the first multilayer structure 504L and serve as an etching mask during the patterning operation. The mask layers may be removed or stripped after the pattering operation is completed.

Referring to FIG. 5C, an insulation layer 506 is formed over the substrate 502. In some embodiments, the insulation layer 506 has an upper surface level with an upper surface of the first semiconductor stack 504A. The insulation layer 506 may include a dielectric material, such as silicon nitride, silicon oxide, silicon carbide or the like. The insulation layer 506 may formed using a chemical vapor deposition (CVD), a physical vapor deposition (PVD), an atomic layer deposition (ALD), spin-on coating, or other suitable deposition methods. In some embodiments, a planarization operation, such as grinding or chemical mechanical polishing (CMP) is utilized to level the upper surface of the insulation layer 506 with an upper surface of the first semiconductor stack 504A.

Referring to FIG. 5D, two sacrificial regions 510 are formed over the insulation layer 506. The sacrificial regions 510 may have a bar shape and extend in the x-direction perpendicular to the direction (i.e., the y-direction) in which the first semiconductor stack 504A extends from a top-view perspective. The sacrificial regions 510 may overlap the first semiconductor stack 504A. In some embodiments, portions of the sacrificial regions 510 extend beyond the first semiconductor stack 504A in the x-direction. In some embodiments, the sacrificial regions 510 are formed of semiconductor materials, such as silicon, or dielectric materials, such as oxide, nitride or the like. The sacrificial regions 510 may be formed using CVD, PVD, ALD or other suitable operations.

FIG. 5E shows a formation of an intermediate region 512 between the sacrificial regions 510. In some embodiments, the intermediate region 512 has a width measured in the y-direction substantially equal to the widths of the sacrificial regions 510 measured in the y-direction. The intermediate region 512 may have an upper surface substantially level with the upper surfaces of the sacrificial regions 510. In some embodiments, the intermediate region 512 is formed of a semiconductor material having different etching selectivity from the sacrificial regions 510, and may be formed of silicon germanium. The intermediate region 512 may be formed using CVD, PVD, ALD or other suitable operations. In some embodiments, the intermediate region 512 is formed through epitaxial growth.

Subsequent to the formation of the intermediate region 512, an insulation layer 508L is formed over the insulation layer 506. The insulation layer 508L may have an upper surface level with the upper surfaces of the sacrificial regions 510 and the intermediate region 512. The insulation layer 508L may have a similar material to the insulation layer 506. The insulation layer 508L may be formed using CVD, PVD, ALD, spin-on coating, or other suitable deposition methods. In some embodiments, a planarization operation, such as grinding or chemical mechanical polishing (CMP) is utilized to level the upper surface of the insulation layer 508L.

Referring to FIG. 5F, a second multilayer structure 514L is deposited over the sacrificial regions 510, the intermediate region 512 and the insulation layer 508L. In some embodiments, the second multilayer structure 514L includes a plurality of first semiconductor layers 505L and a plurality of second semiconductor layers 507L alternatively arranged with the plurality of first semiconductor layers 505L. The deposition methods of the second multilayer structure 514L may be similar to that for depositing the first multilayer structure 504L.

Once deposited, the second multilayer structure 514L is patterned into a second semiconductor stack 514A, as shown in FIG. 5G. The patterning operation of the second multilayer structure 514L can be performed using lithographic and etching operations similar to those for patterning the first multilayer structure 504L. In some embodiments, the second semiconductor stack 514A has a width substantially equal to a width of the first semiconductor stack 504A in the x-direction. In some embodiments, the patterning operation exposes portions of the upper surfaces of the sacrificial regions 510 that are not covered by the second semiconductor stack 514A.

In some embodiments, one or more mask layers are formed over the second multilayer structure 514L and serve as an etching mask during the patterning operation. The mask layers may be removed or stripped after the pattering operation is completed.

Referring to FIG. 5H, a pattering operation is performed on the insulation layer 508L to form an insulation layer 508 between the first semiconductor stack 504A and the second semiconductor stack 514A. The sidewalls of the patterned insulation layer 508 are substantially aligned with the sidewalk of the first semiconductor stack 504A and the second semiconductor stack 514A during the patterning operation. The sacrificial regions 510 may be kept substantially intact during the patterning operation of FIG. 5H.

In some embodiments, the insulation layer 506 is removed subsequent to the patterning operation of the insulation layer 508. The substrate 502 is exposed accordingly. In some embodiments, the pattering operation of the insulation layer 508L or 506 is performed using lithographic operations and etching operation, e.g., a dry etch, a wet etch, an RIE or the like. In some embodiments, the mask layers over the second semiconductor stack 514A are removed subsequent to forming the insulation layer 508, or subsequent to removing the insulation layer 506.

FIG. 5I illustrates the formation of a gate layer 512L over the substrate 502 and the second semiconductor stack 514A. In some embodiments, the gate layer 512L covers portions of the sacrificial regions 510 that extend beyond the first and second semiconductor stacks 504A, 514A. In some embodiments, the gate layer 512L includes a polysilicon material. The gate layer 512L can be deposited using CVD, PVD, ALD, spin-on coating, or other suitable deposition methods.

Referring to FIG. 5J, a patterning operation is performed on the gate layer 512L to form a gate electrode 516 across the first and second semiconductor stacks 504A, 514A. The gate electrode 516 served as a dummy gate electrode or sacrificial gate electrode and may be replaced by a metal gate electrode during the subsequent operations. In some embodiments, the gate electrode 516 extends in the x-direction and is substantially perpendicular to the direction in which the first and second semiconductor stacks 504A and 514A extend. In some embodiments, the gate electrode 516 is aligned with the sacrificial regions 510. In some embodiments, the gate electrode 516 covers the entire exposed portions of the sacrificial regions 510 that extend beyond the first and second semiconductor stack 504A, 514A. In some embodiments, sidewalk of the sacrificial regions 510 extending in the xz-plane are exposed through the sidewalls of the gate electrode 516 during the patterning operation. In some embodiments, the gate electrode 516 is formed using lithographic and etching operations.

FIGS. 5K and 5L illustrate a formation of source/drain regions 522, in accordance with some embodiments. In FIG. 5K, portions of the first semiconductor stack 504A on two sides of the gate electrode 516 are removed, leaving the remained portion 504 serving as a channel region of a lower FET, such as an n-FET, in the CFET, in which the channel region is wrapped around by the gate electrode 516. The removal of the portions of the first semiconductor stack 504A may be performed using a dry etch, a wet etch, an RIE, or the like.

Subsequently, as shown in FIG. 5L, source/drain regions 522, including source/drain regions 522a and 522b, are grown on two sides of the gate electrode 516 and the channel region 504, in which the source/drain regions 522a and 522b serve as the two source/drain regions of the lower FET. The source/drain regions 522 may be grown in place of the removed portions of the first semiconductor stack 504A. The source/drain regions 522 may extend upwardly to the insulation layer 508. The source/drain regions 522 may have facets.

The source/drain regions 522 may include any acceptable materials, such as silicon, SiC, SiCP, SiP, SiGeB, the like, or a combination. In an example where the lower FET is an n-type FET, the source/drain regions 522 include an n-type dopant such as phosphorous, arsenic or other n-type dopants. The source/drain regions 522 may include multiple layers, in which different layers may include different materials or the same material, and may be grown in separate steps. The source/drain regions 522 may be epitaxially grown on a seed layer or in a recess (not separately shown) using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments, the source/drain regions 522 are in-situ doped during growing the epitaxial materials or are doped with suitable dopants in a separate operation.

Referring to FIG. 5M, a conductive line 524a, which correspond to the conductive lines 116 in FIG. 2A, is formed on two sides of the source/drain region 522a along one side of the gate electrode 516. Although not separately shown, a conductive line 524b can be formed on two sides of the source/drain regions 522b on another side of the gate electrode 516 opposite the conductive line 524a. In some embodiments, the conductive line 524a extends outwardly from the facets of the source/drain regions 522a. In some embodiments, the conductive line 524a includes an upper surface arranged on two sides of second semiconductor stack 514A and meeting the insulation layer 508 and the sacrificial regions 510. In some embodiments, the upper surface of the conductive line 524a is level with the lower surface of the insulation layer 508.

The conductive line 524a may include doped polysilicon or metallic materials, such as copper, tungsten, aluminum, titanium, tantalum, titanium nitride, tantalum nitride, alloys thereof, or the like. The conductive line 524a may be formed using CVD, PVD, ALD, plating, or other suitable methods.

In some embodiments, the source/drain region 522a is epitaxially grown such that the upper surface is lower than the lower surface of the insulation layer 508. Therefore, a gap exists between the source/drain region 522a and the insulation layer 508. In such circumstances, the conductive line 524a is formed extending in the gap and wrapping around the source/drain region 522a. In some embodiments, the two ends of the conductive line 524a on two sides of the source/drain region 522a are joined to fill the gap over the upper surface of the source/drain region 522.

In some embodiments, an insulation layer 526 is formed to laterally surround the source/drain regions 522 and the conductive lines 524. The insulation layer 526 may have a similar material to the insulation layer 506 or 508. The insulation layer 526 may have an upper surface level with the upper surfaces of the conductive lines 524. The upper surface of the insulation layer 526 may be arrange to be lower than or level to the lower surfaces of the sacrificial regions 510 and the insulation layer 50. In some embodiments, the insulation layer 526 is formed by depositing a dielectric material using CVD, PVD, ALD, or other suitable methods, followed by etching excess portions of the dielectric material to leave the insulation layer 526 below the insulation layer 508.

FIG. 5N illustrates a formation of a first inner conductive via 552 of a first IIS on one side of the conductive line 524a. Initially, a dielectric layer 546 is deposited over the conductive line 524a and the insulation layer 526. In some embodiments, the dielectric layer 546 includes nitride, oxide, carbide or the like, and may be formed using CVD, PVD, ALD spin-on coating or other suitable deposition methods. The dielectric layer 546 is patterned to form a first hole exposing the conductive line 524a. The patterning operation on the dielectric layer 546 may involve lithographic and etching operations.

Subsequently, a conductive material is deposited into the first hole to form the first inner conductive via 552 electrically connected to the conductive line 524a. The conductive material may include one or more of copper, silver, tungsten, titanium, nickel, tin, aluminum, or the like. In some embodiments, the deposition operation of the first inner conductive via 552 may include CND, PVD, ALD, plating, or other suitable deposition operations. In some embodiments, a planarization operation is performed to remove excess materials of the inner conductive via 552 and level the surface of the first inner conductive via 552.

Referring to FIG. 5O, two dielectric layers 547 and 548 are successively deposited over the dielectric layer 546. In some embodiments, the dielectric layers 547 and 548 include materials such as nitride, oxide, carbide or the like. The formation of the dielectric layers 547 and 548 are similar to that for forming the dielectric layer 546. In some embodiments, the material of the dielectric layer 547 is different from that of the dielectric layers 546 and 548. In some embodiments, the material of the dielectric layer 547 has a sufficient etching selectivity with respect to the dielectric layer 546 or 548 such that the dielectric layers 547 and 546 can serve as etch stop layers of the dielectric layers 548 and 547, respectively during separate etching operations. In some embodiments, the dielectric layers 546, 547, 548 are respectively formed of nitride, oxide and nitride, or respectively formed of oxide, nitride and oxide.

FIG. 5P illustrates a formation of source/drain regions 532, including source/drain regions 532a and 532b, over the dielectric layer 548 on two sides of the gate electrode 516. The materials, configurations and methods of forming of the source/drain regions 532 are similar to those for forming the source/drain regions 522 with reference to FIGS. 5K and 5L. In some embodiments, the source/drain regions 532a and 532b serve as source/drain regions of an upper FET, such as a p-FET, and may include p-type dopants such as boron. A channel region 514 of the upper FET is formed between the source/drain regions 532a and 532b during a patterning operation on the second semiconductor stack 514A. The upper FET and the lower FET collectively construct the CFET, in a similar configuration to that shown in FIG. 1, and the conductivity types of the upper FET and the lower FET can be interchanged according to application requirements.

FIG. 5Q(A) illustrates a perspective view of an intermediate stage of the method 500 for forming an insulation layer 536. FIGS. 5Q(B) and 5Q(C) are cross-sectional views of the perspective view shown in FIG. 5Q(A) along sectional lines B-B and C-C that cross the gate electrode 516 and the source/drain region 522a, respectively.

Referring to FIGS. 5Q(A) to 5Q(C), the insulation layer 536 is formed over the dielectric layer 548 and laterally surrounds the source/drain regions 532, the sacrificial regions 510 and the gate electrode 516. In some embodiments, the upper surface of the insulation layer 536 is substantially level with the upper surfaces of the source/drain regions 532. The material, configuration and method of forming of the insulation layer 536 are similar to those of the insulation layer 526, and their descriptions are omitted for brevity.

Figure 5R:
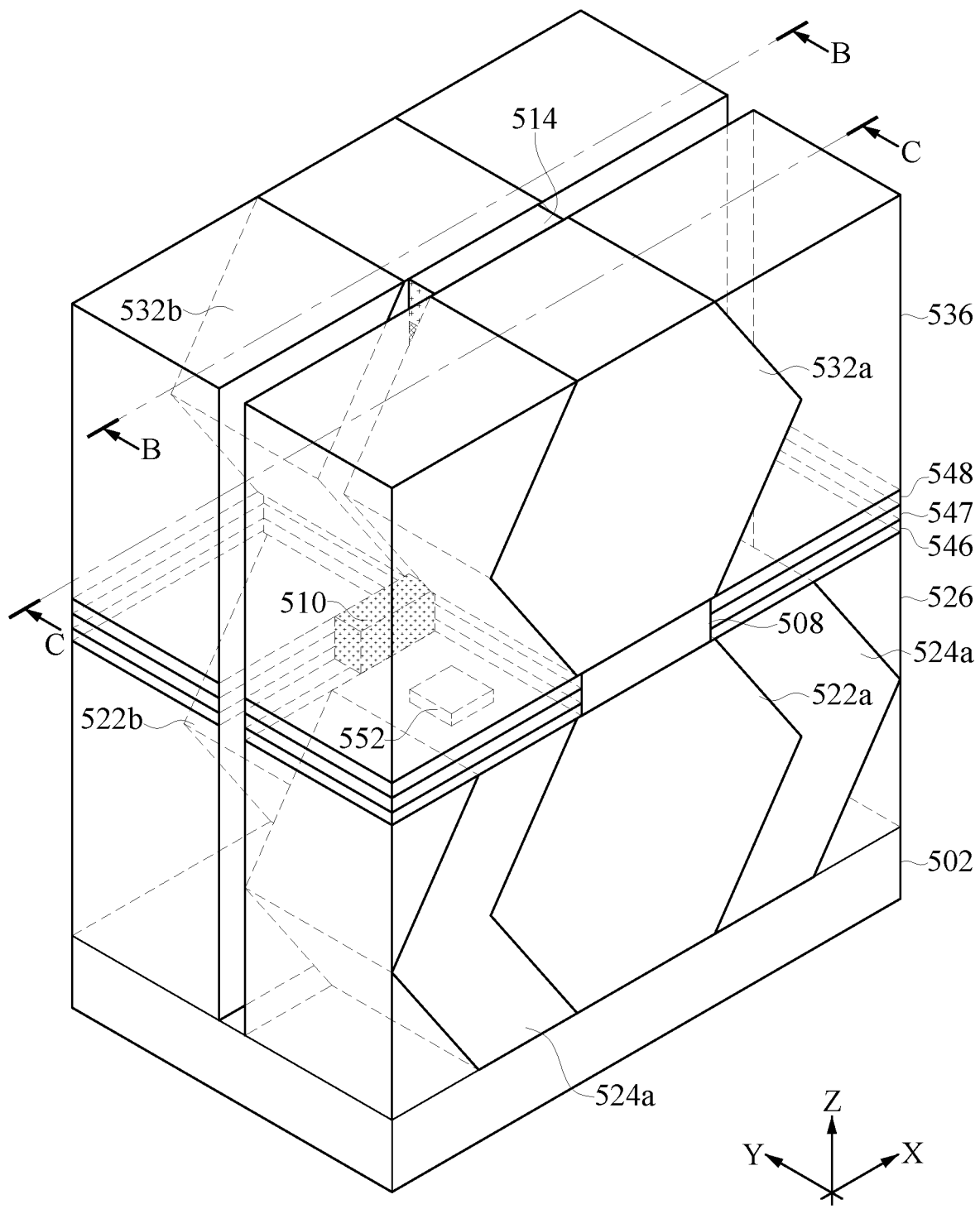
Figure 5R:
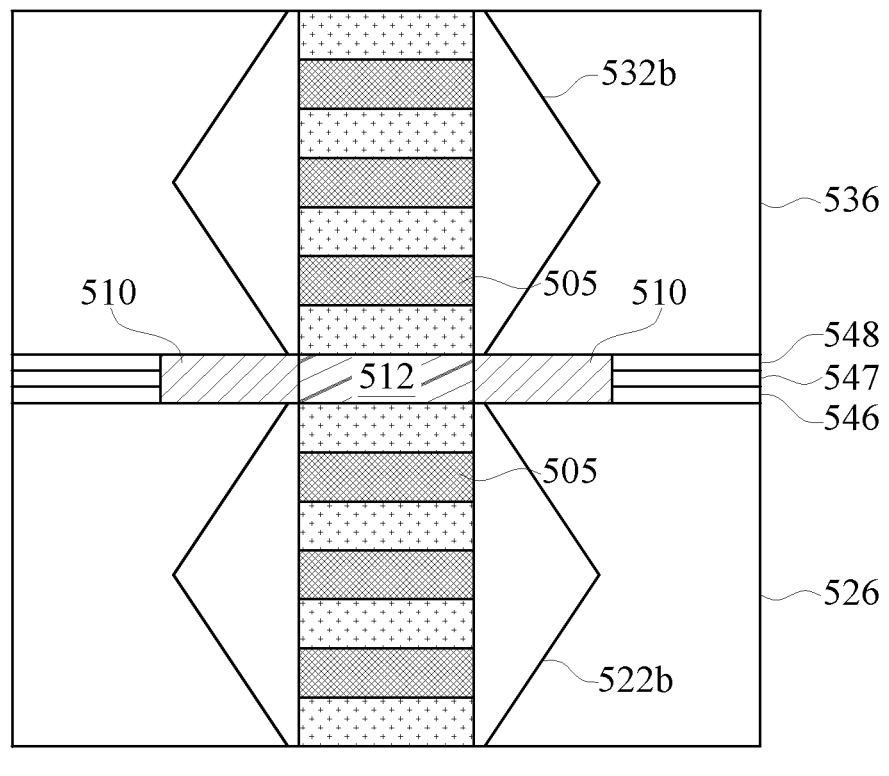
Figure 5R:
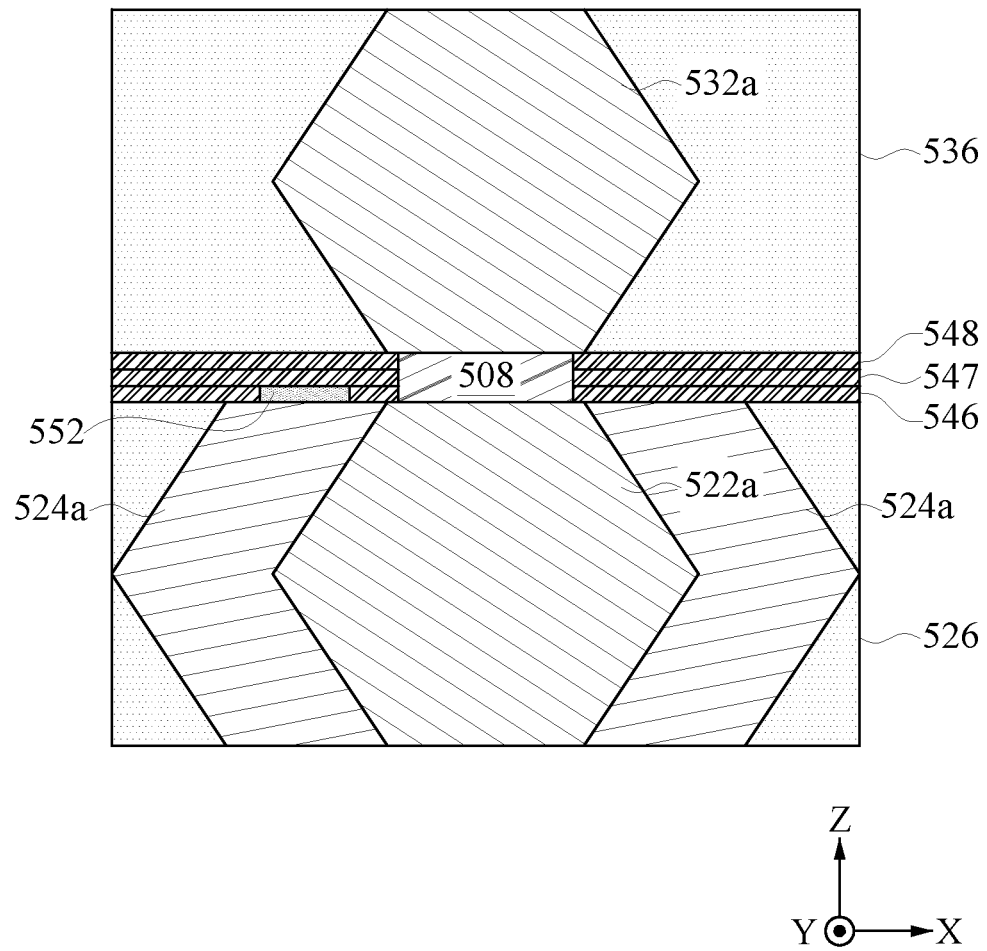

FIG. 5R(A) illustrates a perspective view of an intermediate stage of the method 500 for etching the gate electrode 516. FIGS. 5R(B) and 5R(C) are cross-sectional views of the perspective view shown in FIG. 5R(A) along sectional lines B-B and C-C that cross the original gate electrode 516 and the source/drain region 522a, respectively.

Referring to FIGS. 5R(A) to 5R(C), the gate electrode 516 is etched or removed. In some embodiments, the second semiconductor layers 507 are also removed during the etching operation of the gate electrode 516, leaving the first semiconductor layers 505 acting as the physical channel regions of the CFET. In some embodiments, the intermediate region 512 is also removed during the etching of the gate electrode 516. In some embodiments, the sacrificial regions 510 are kept substantially intact during the etching of the gate electrode 516. In some embodiments, the etching operation may be performed using a dry etch, a wet etch, an RIE, or the like.

Figure 5S:
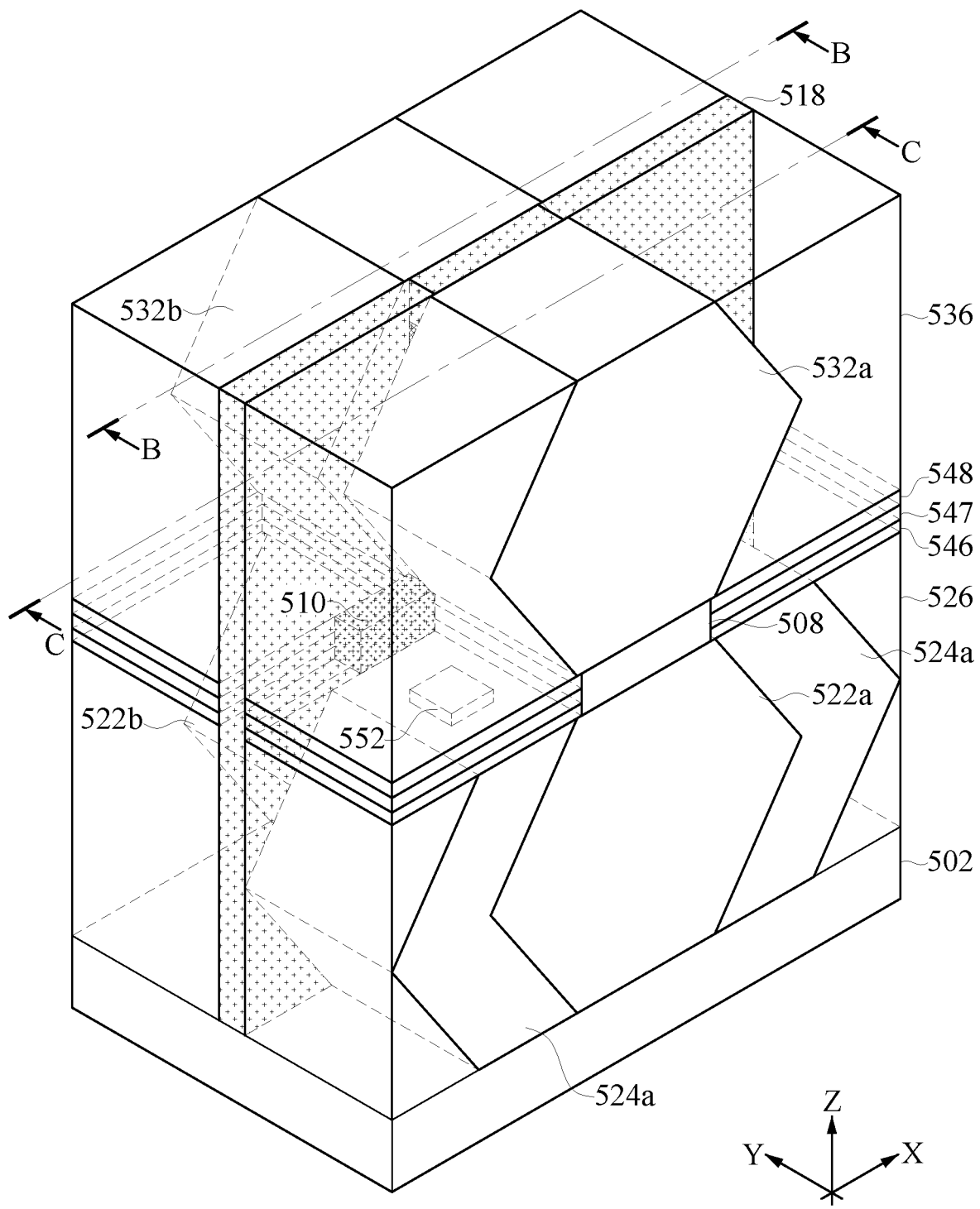
Figure 5S:
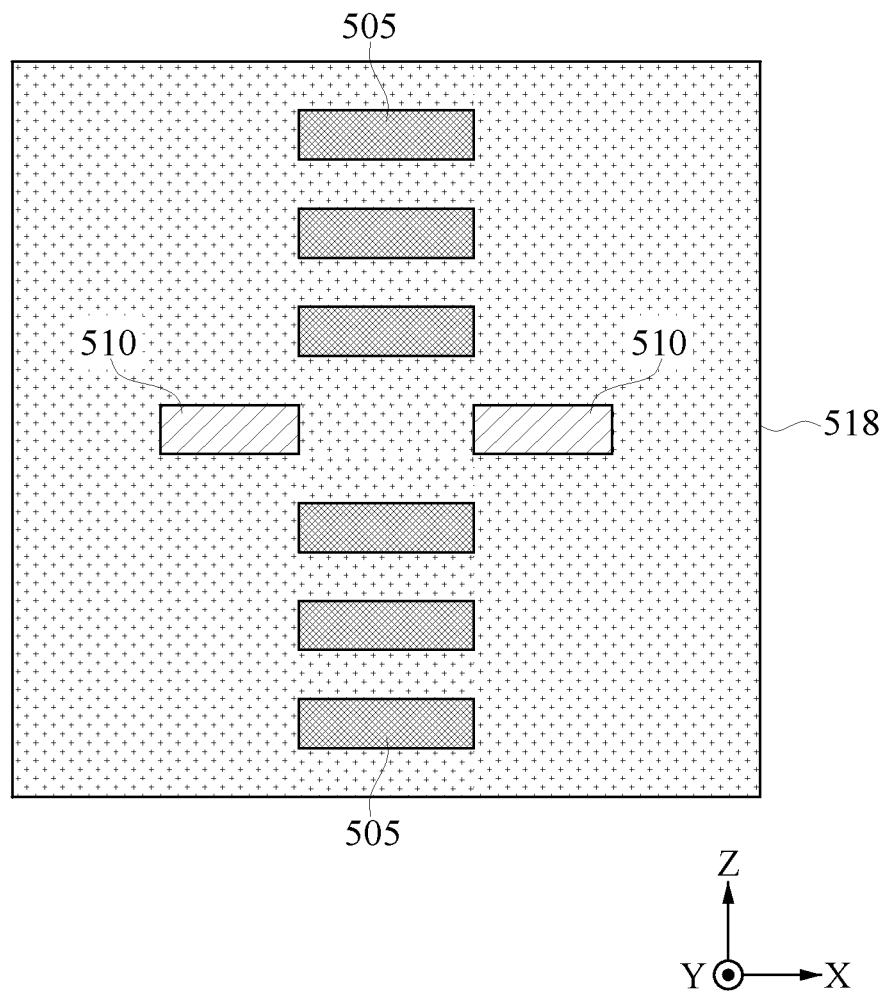
Figure 5S:
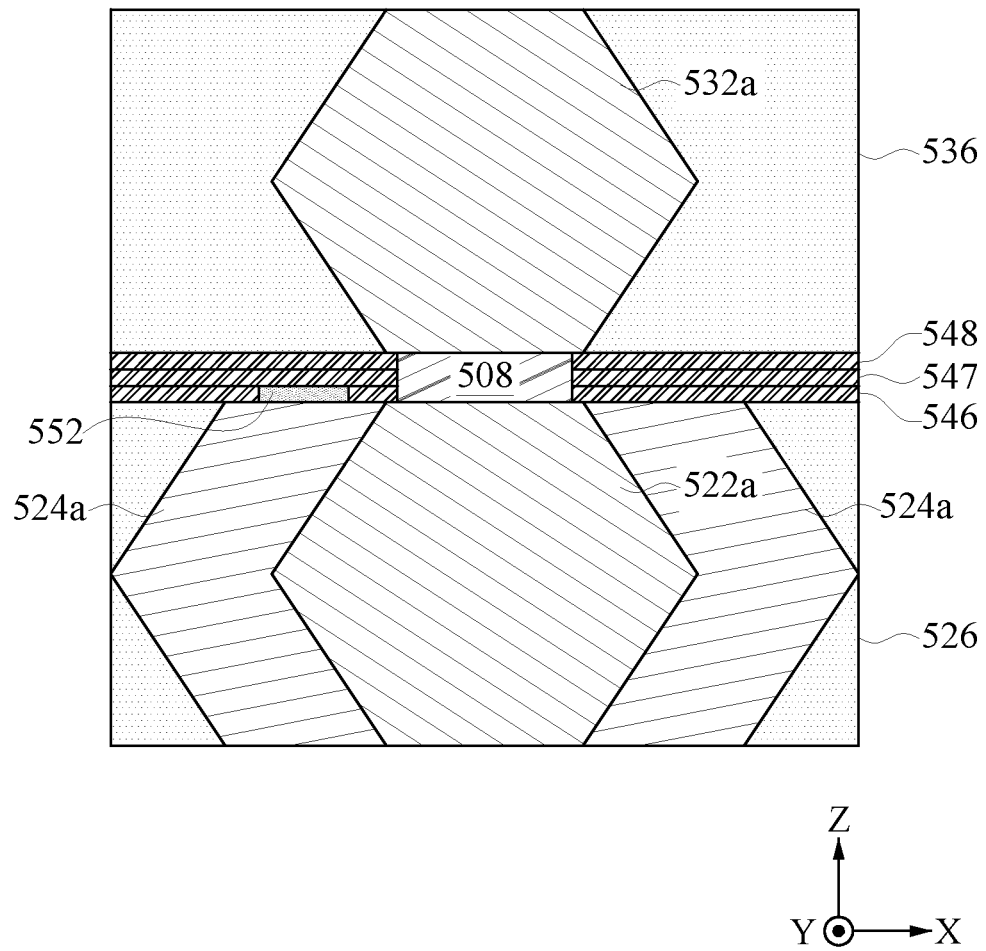

FIG. 5S(A) illustrates a perspective view of an intermediate stage of the method 500 for forming a metal gate 518. FIGS. 5S(B) and 5S(C) are cross-sectional views of the perspective view shown in FIG. 5S(A) along sectional lines B-B and C-C that cross the metal gate 518 and the source/drain region 522a, respectively.

Referring to FIGS. 5S(A) to 5S(C), the metal gate 518 fills the space left by the gate electrode 516. The metal gate 518 corresponds to the gate 130 shown in FIGS. 2B to 2F, 3B to 3E and 4B to 4G. The metal gate 518 may surround each of the first semiconductor layers 505 in the channel regions 504 and 514. The metal gate 518 may also surround the sacrificial regions 510. Although not explicitly shown, the metal gate 518 may include a multilayer structure. In some embodiments, the metal gate 518 includes one or more of a gate dielectric layer, a barrier layer, a seed layer, and a gate electrode stacked over one another in a conformal manner.

In some embodiments, the gate dielectric layer comprises silicon oxide, silicon nitride, or multilayers thereof. In other embodiments, the gate dielectric layer includes a high-k dielectric material, and may include a metal oxide or a silicate of Hf, Al, Zr, La, Mg, Ba, Ti, Pb, and combinations thereof.

The barrier layer may include an electrically conductive material such as titanium nitride, tantalum nitride, titanium, tantalum, or the like.

The work-function layers include p-type and n-type work function layers. P-type work function layers include p-type work function metals, such as TiN, TaN, Ru, Mo, Al, WN, $ZrSi_2$, $MoSi_2$, $TaSi_2$, $NiSi_2$, WN, other suitable p-type work function materials, or combinations thereof. N-type work function layers include n-type work function metals, such as Ti, Ag, TaAl, TaAlC, TiAlN, TaC, TaCN, TaSiN, Mn, Zr, other suitable n-type work function materials, or combinations thereof.

In some embodiments, the seed layer includes copper, titanium, tantalum, titanium nitride, tantalum nitride, the like, or a combination thereof.

The abovementioned gate dielectric layer, barrier layer, work function layers and the seed layer may be formed using CVD, PVD, ALD, molecular beam deposition (MBD), plasma-enhanced CVD (PECVD), sputtering, or other suitable methods.

Figure 5T:
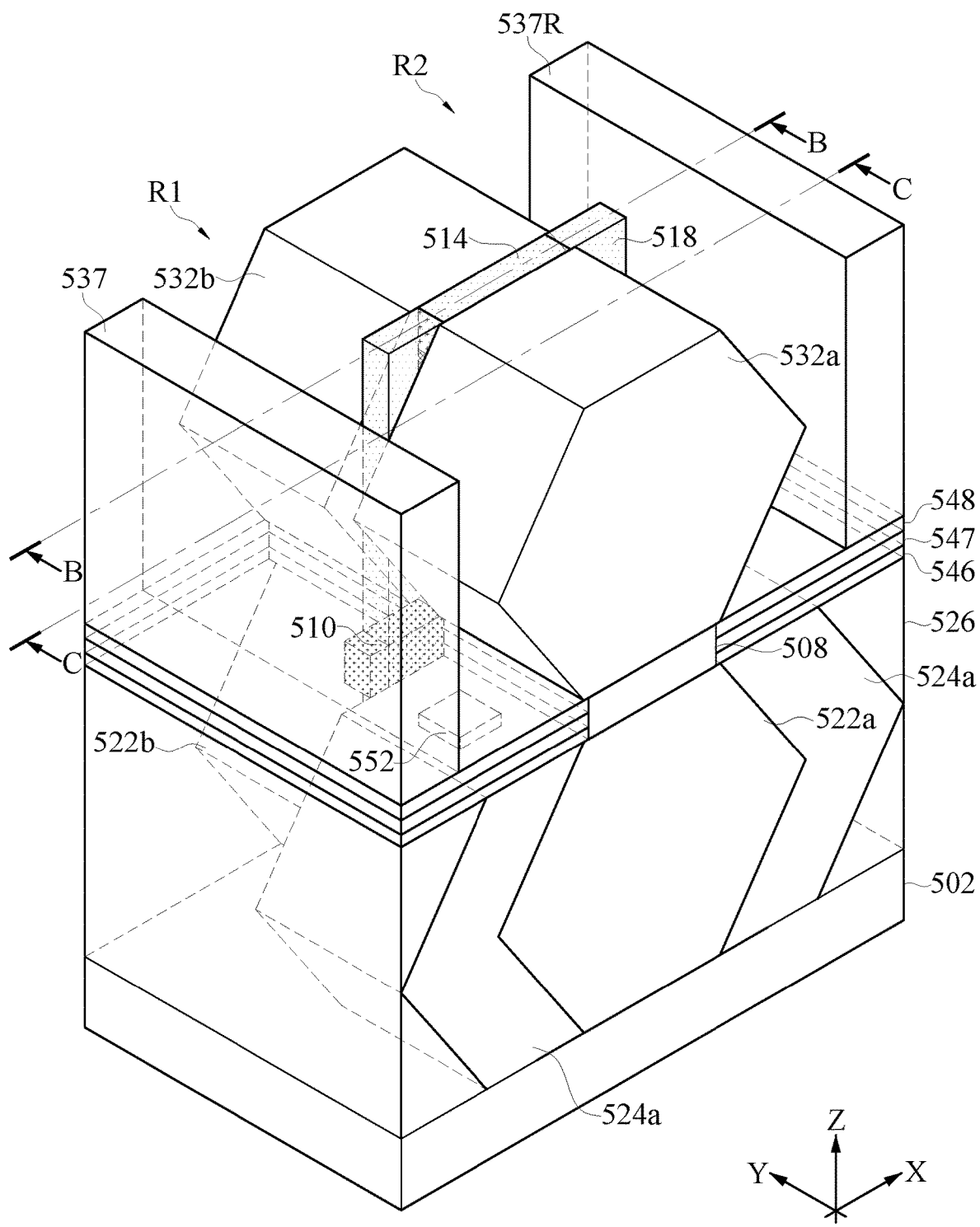
Figure 5T:
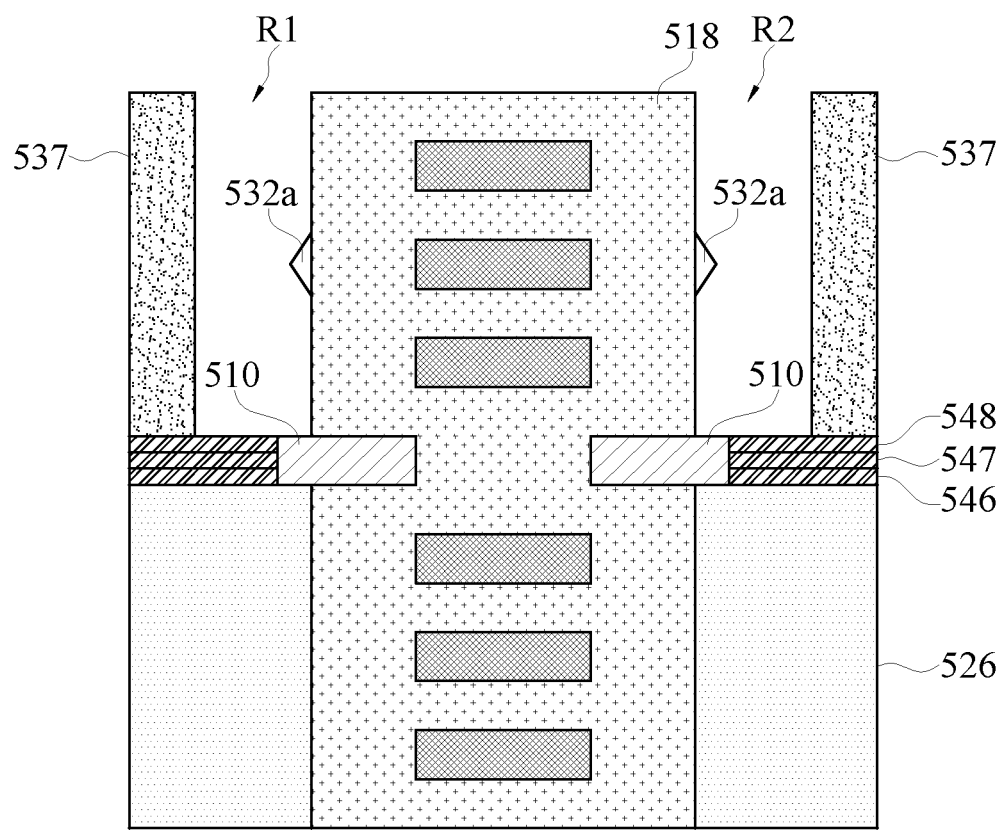
Figure 5T:
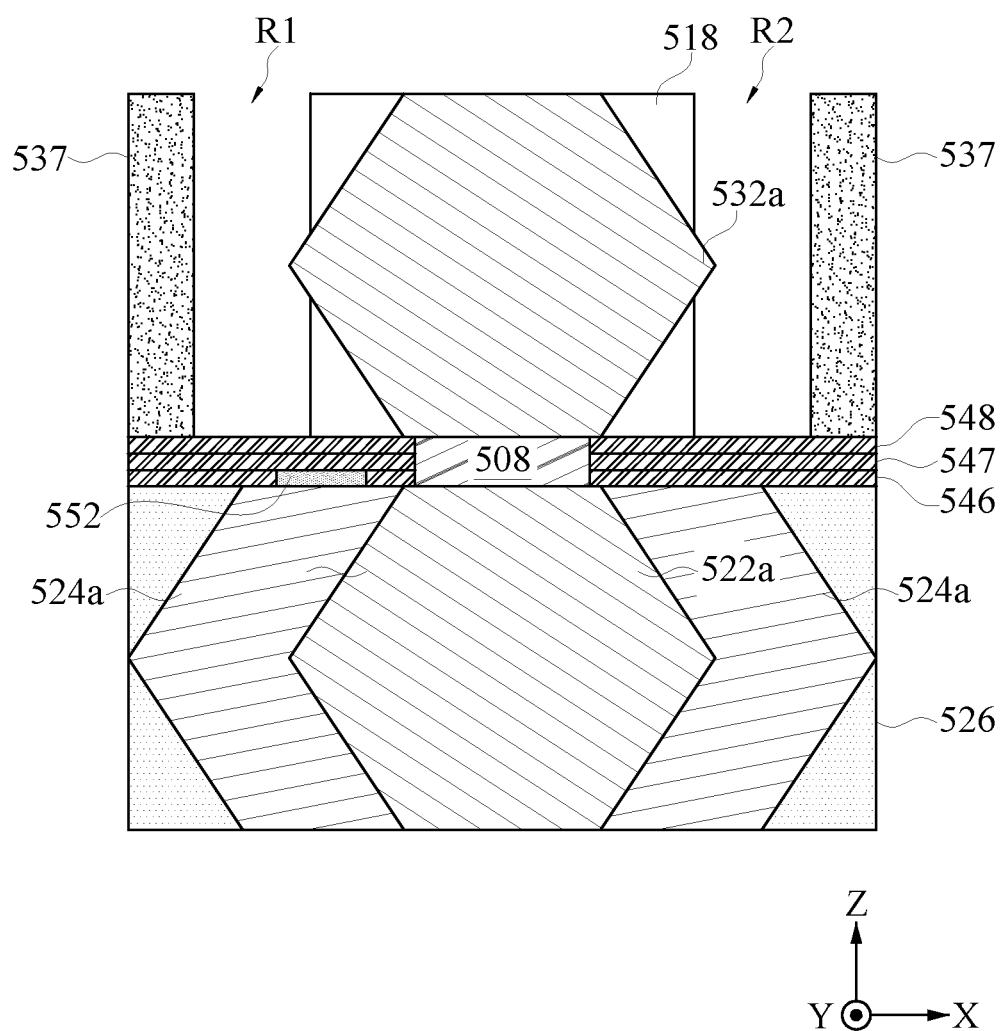

FIG. 5T(A) illustrates a perspective view of an intermediate stage of the method 500 for patterning the metal gate 518 FIGS. 5T(B) and 5T(C) are cross-sectional views of the perspective view shown in FIG. 5T(A) along sectional lines B-B and C-C that cross the metal gate 518 and the source/drain region 522a, respectively.

Referring to FIGS. 5T(A) to 5T(C), the metal gate 518 is patterned to has a reduced width in the x-direction. In some embodiments, the sacrificial regions 510 extend in the x-direction and go beyond the sidewalls of the patterned metal gate 518. In some embodiments, the patterned metal gate 518 includes a dog-bone shape. The patterned metal gate 518 may have non-uniform widths along the z-direction, e.g., the patterned metal gate 518 has a first width at the channel regions 504 and 514 greater than a second width at the sacrificial regions 510. In the depicted example, the patterned metal gate 518 has two recesses at the sacrificial regions 510 over the insulation layer 526 and defined by the sacrificial regions 510, in which the spaces occupied by the sacrificial regions 510 are reserved for the IISs to pass through. However, in some other examples, the patterned metal gate 518 may be patterned to have only one recess on one side of the metal gate 518, through which only one IIS extends.

In some embodiments, the insulation layer 536 is patterned into insulation layer 537. Trenches are formed between the patterned insulation layer 537 and the metal gate 518 and extending in the y-direction and exposing portions of the dielectric layer 548 and sidewalk of the metal gate 518 and the source/drain regions 532. The sacrificial regions 510 are exposed accordingly through the trenches. In some embodiments, the patterning of the metal gate 518 and the insulation layer 536 are performed by lithographic operations and etching operations, such as a dry etch, a wet etch, an RIE or the like.

Figure 5U:
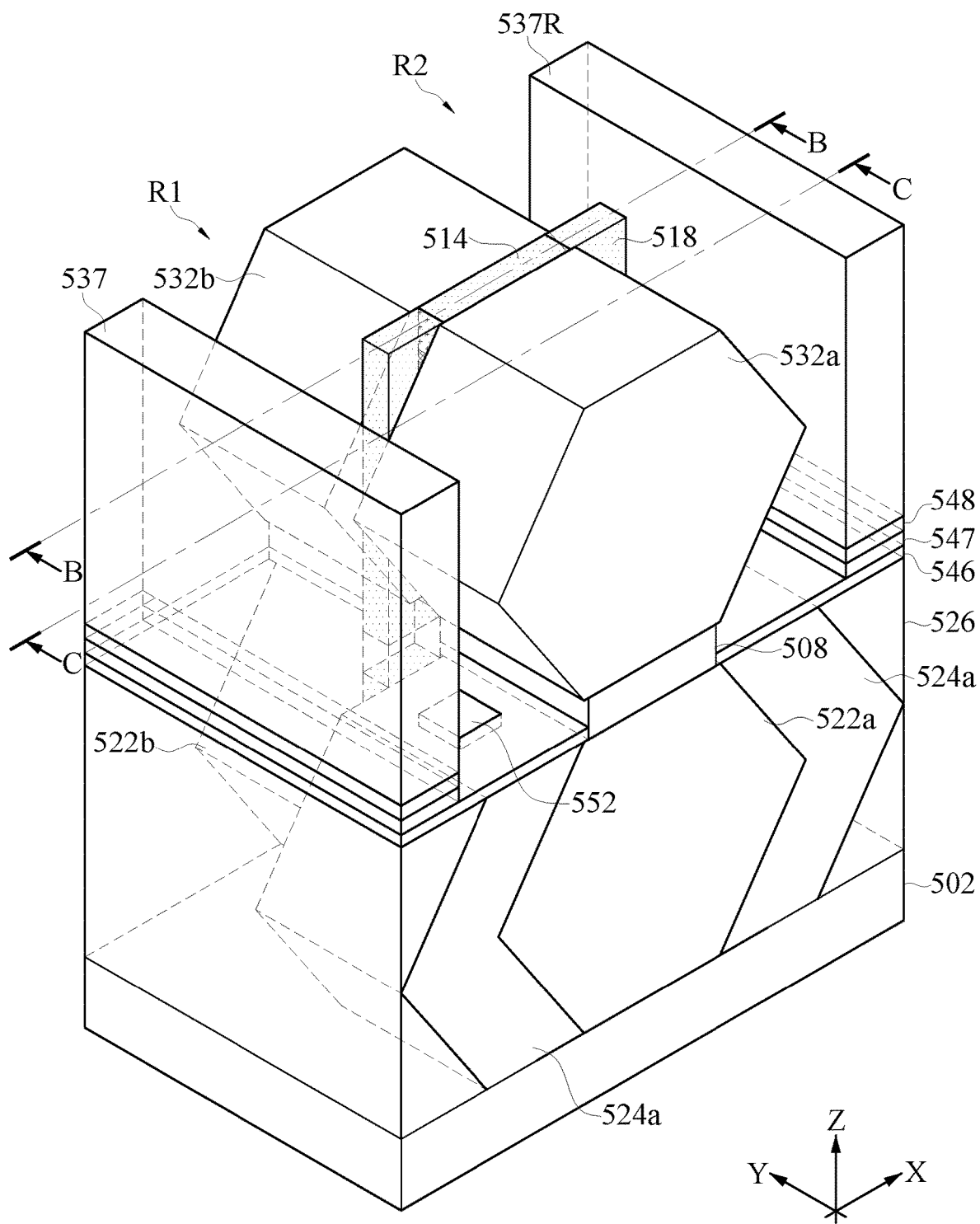
Figure 5U:
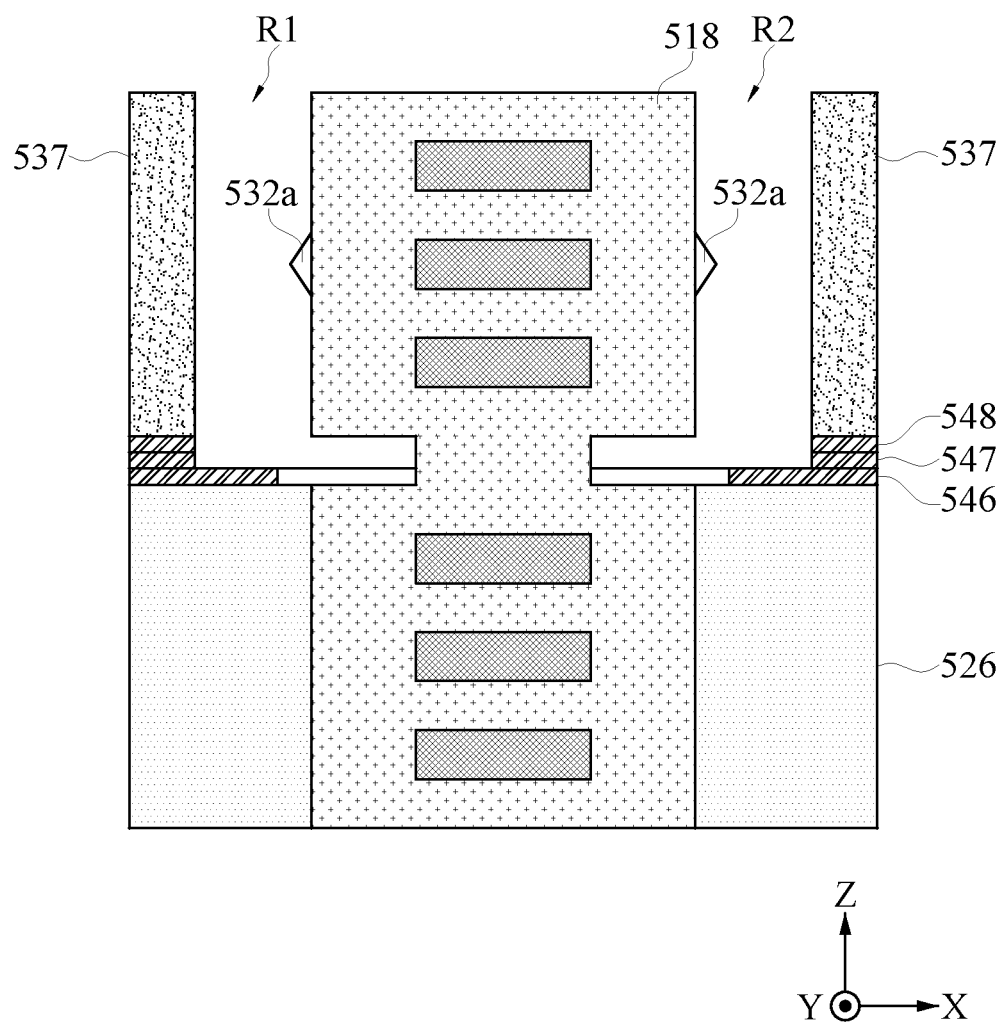
Figure 5U:
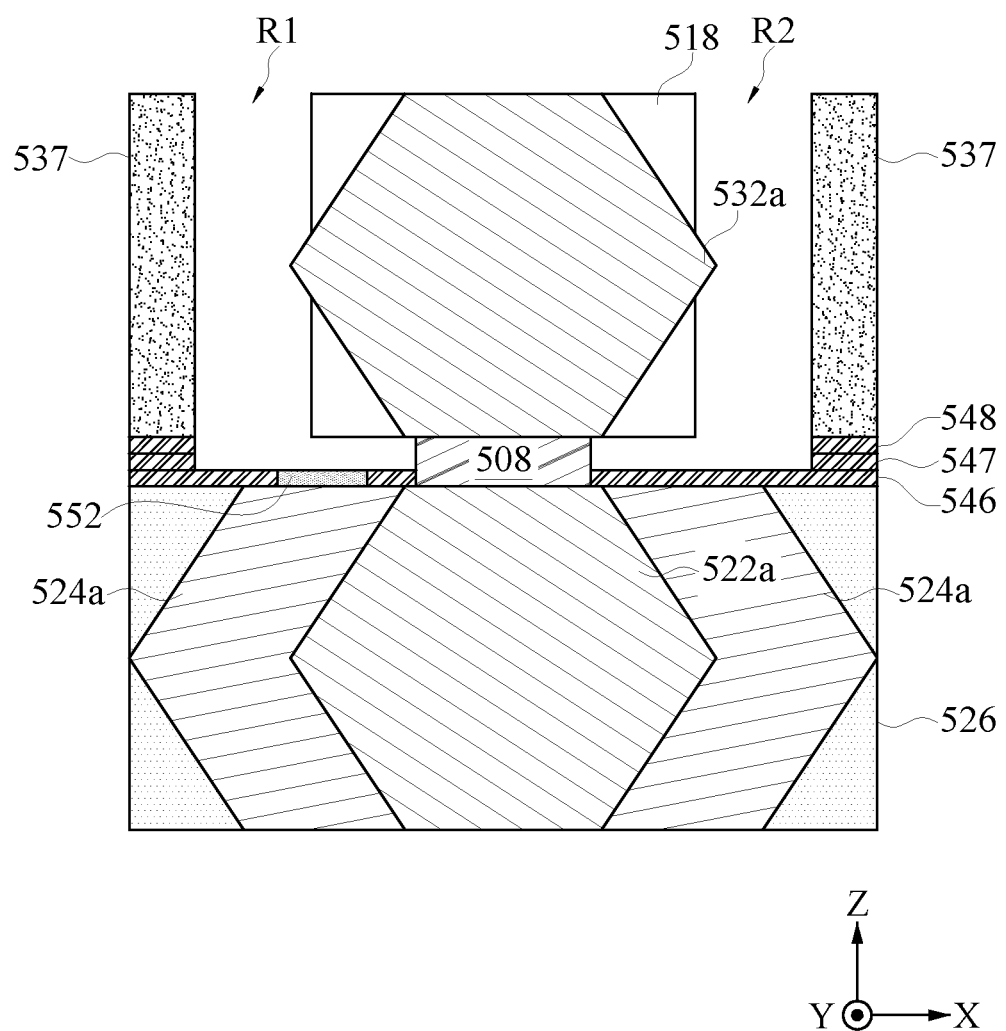

FIG. 5U(A) illustrates a perspective view of an intermediate stage of the method 500 for patterning the dielectric layers 548 and 547. FIGS. 5U(B) and 5U(C) are cross-sectional views of the perspective view shown in FIG. 5U(A) along sectional lines B-B and C-C that cross the metal gate 518 and the source/drain region 522a, respectively.

Referring to FIGS. 5U(A) to 5U(C), the dielectric layers 548 and 547 are patterned to expose the dielectric layer 546 and the first inner conductive via 552. The patterning operations of the dielectric layers 548 and 547 may involve lithographic operations and etching operations. In some embodiments, the sacrificial regions 510 are also removed by, e.g., an etching operation, during the patterning of the dielectric layers 548 and 547. An upper surface of the insulation layer 526 is thus exposed during the removal of the sacrificial regions 510. The etching operation for patterning the dielectric layers 548, 547 and the sacrificial regions 510 may include a dry etch, a wet etch, an RIE, or the like. In some embodiments, the dielectric layer 548 is etched with the dielectric layer 547 acting as an etch stop layer, in which a recess R2 is formed over the dielectric layer 547. Further, in some embodiments, the dielectric layers 548 and 547 are etched successively with the dielectric layers 547 and 546 acting as an etch stop layer, respectively, in which a recess R1 is formed over the dielectric layer 546. The recesses R1 and R2 are formed on opposite sides of the metal gate 518 for forming the second and first IISs, respectively. The first inner conductive via 552 is exposed to the recess R1.

Figure 5V:
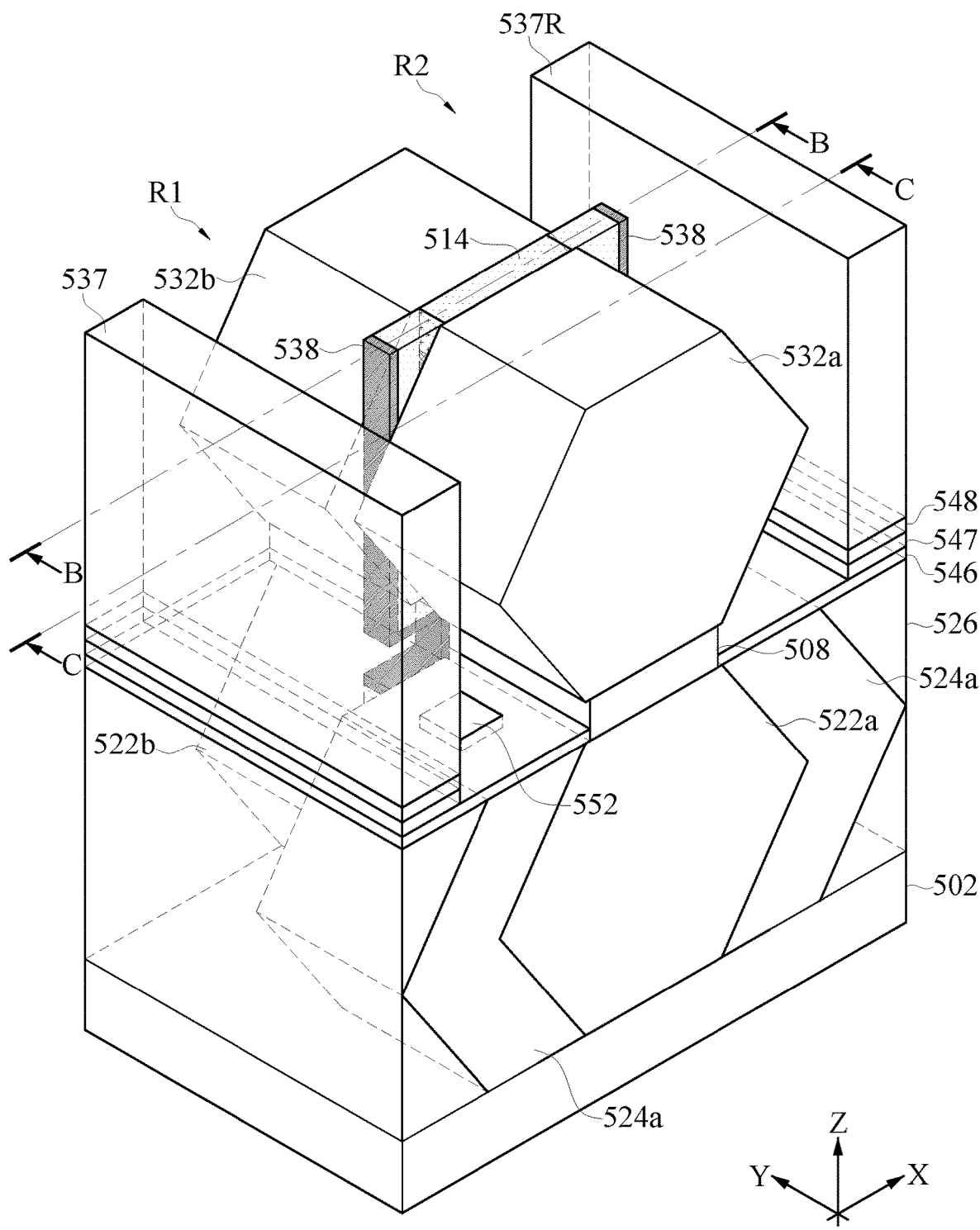
Figure 5V:
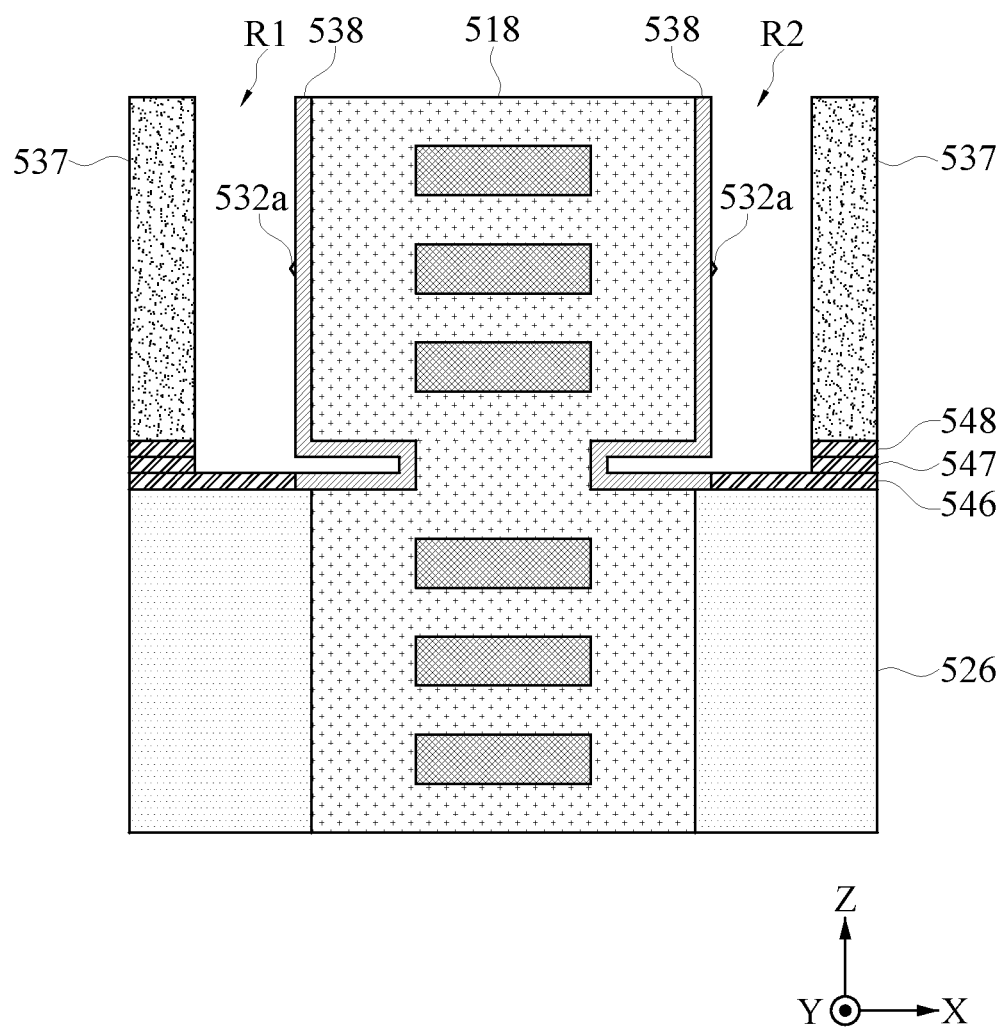
Figure 5V:
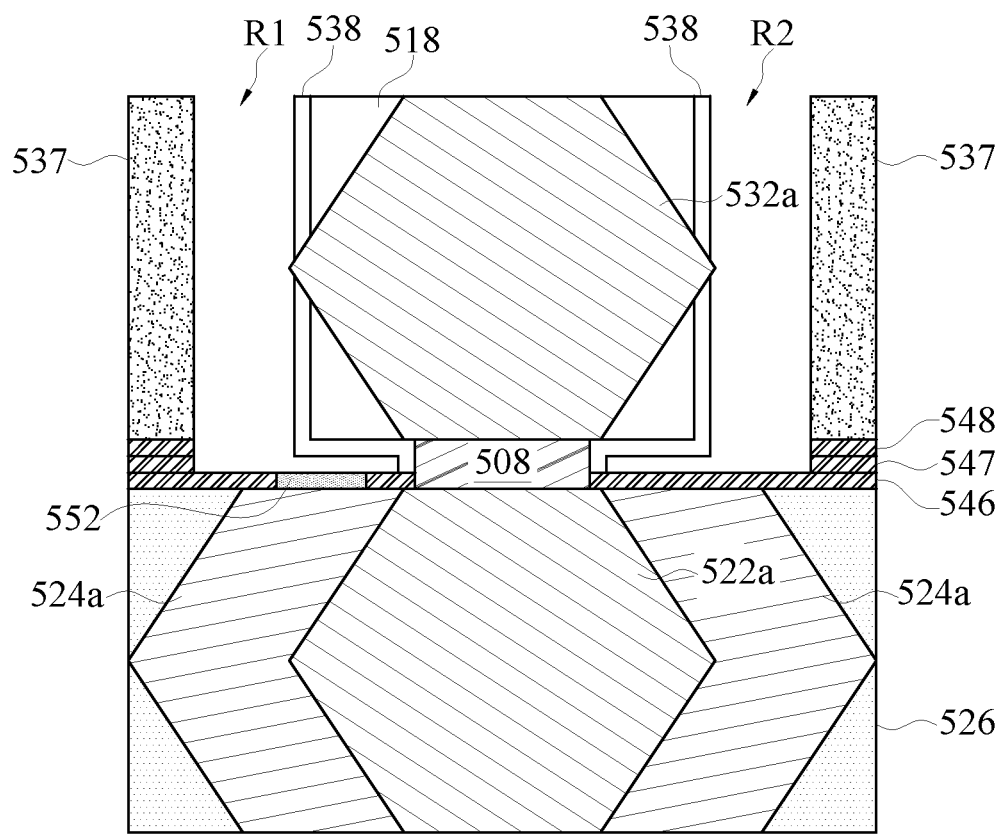

FIG. 5V(A) illustrates a perspective view of an intermediate stage of the method 500 for forming an insulation film 538 on the metal gate 518. FIGS. 5V(B) and 5V(C) are cross-sectional views of the perspective view shown in FIG. 5V(A) along sectional lines B-B and C-C that cross the metal gate 518 and the source/drain region 522a, respectively.

Referring to FIGS. 5V(A) to 5V(C), the insulation film 538 is formed on the exposed sidewalls of the metal gate 518. The insulation film 538 may cover portions the sidewalk of the metal gate 518 at the upper FET not covered by the insulation layer 526. The sidewalls of the metal gate 518 covered by the insulation layer 526 may be free from the insulation film 538. In some embodiments, the insulation film 538 is formed of a dielectric material, such as oxide, nitride, or other suitable materials. The insulation film 538 is an electrical insulation film configured to electrically insulate the metal gate 518 from adjacent features. In some embodiments, the insulation film 538 is in a range between about 5 nm and about 10 nm. In an exemplary forming method, the insulation film 538 is formed by, e.g., selectively growing a dielectric material, such as oxide, nitride, or the like, on the sidewalls of the gate materials of the metal gate 538 by CVD, PVD, ALD, or other suitable deposition operations.

Referring to FIG. 5V(B), the insulation film 538 is formed from the top portion of the metal gate 518, along the outer sidewalls of the metal gate 518 and the inner sidewalls of the recessed portion (defined by the sacrificial regions 510). In the depicted embodiment, the insulation film 538 also extends over an upper surface of the insulation layer 526. In some other embodiments, the insulation film 538 is formed only on sidewalls of the metal gate 518 without extending to other features.

Figure 5W:
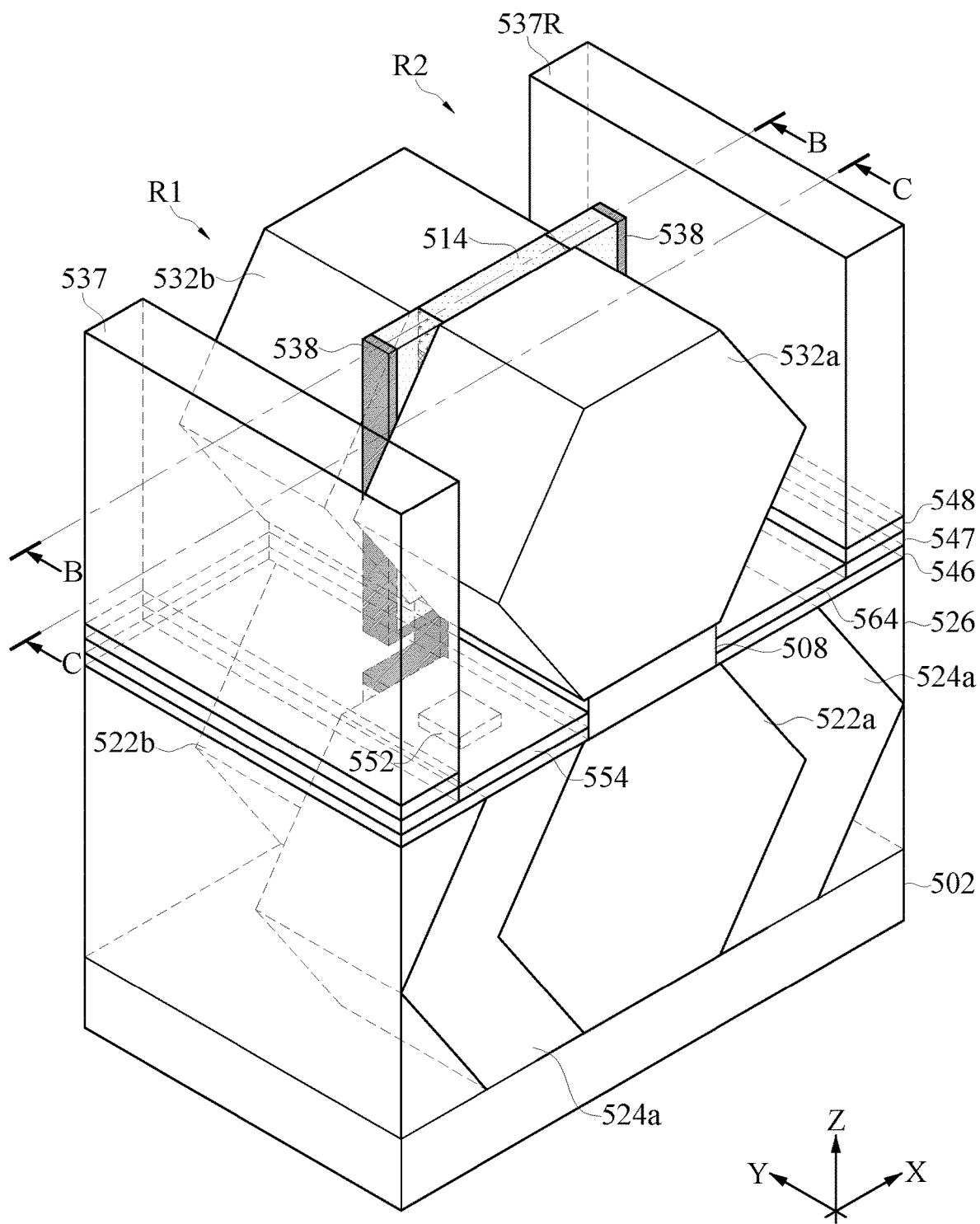
Figure 5W:
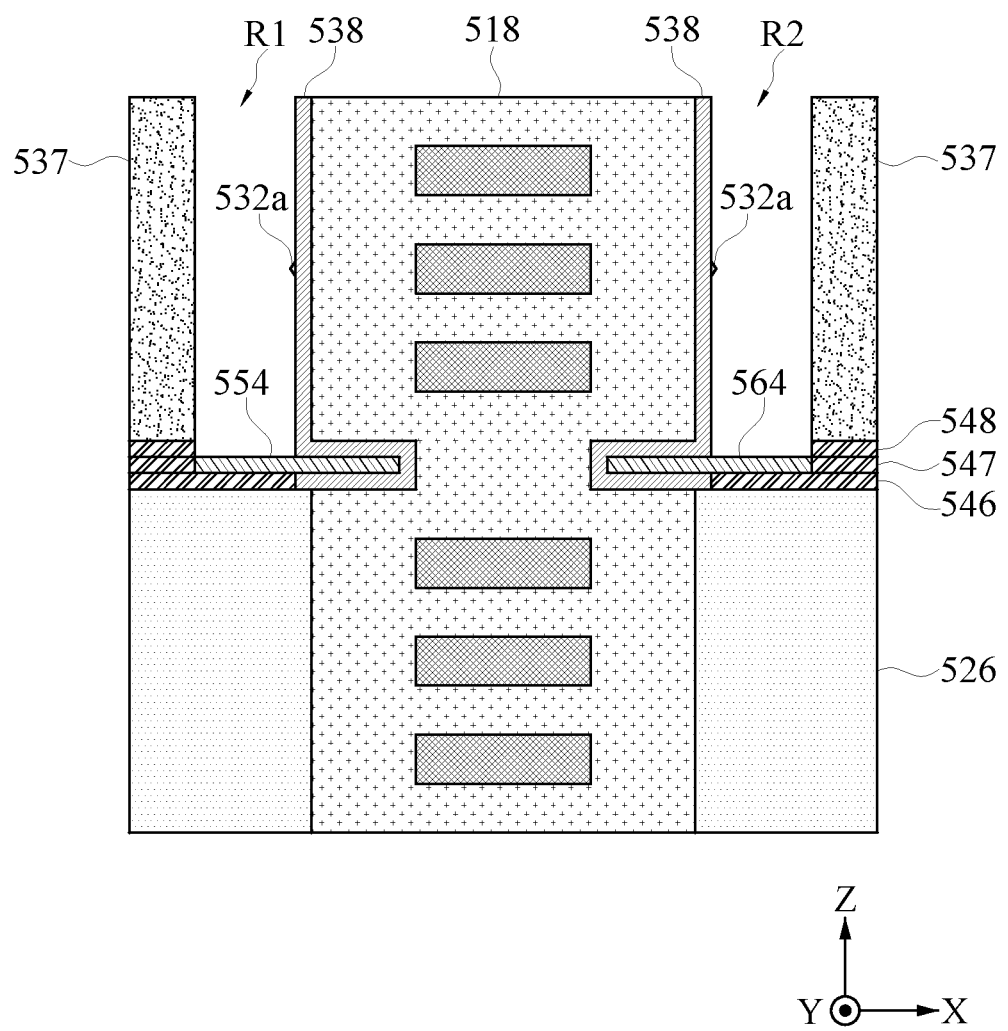
Figure 5W:
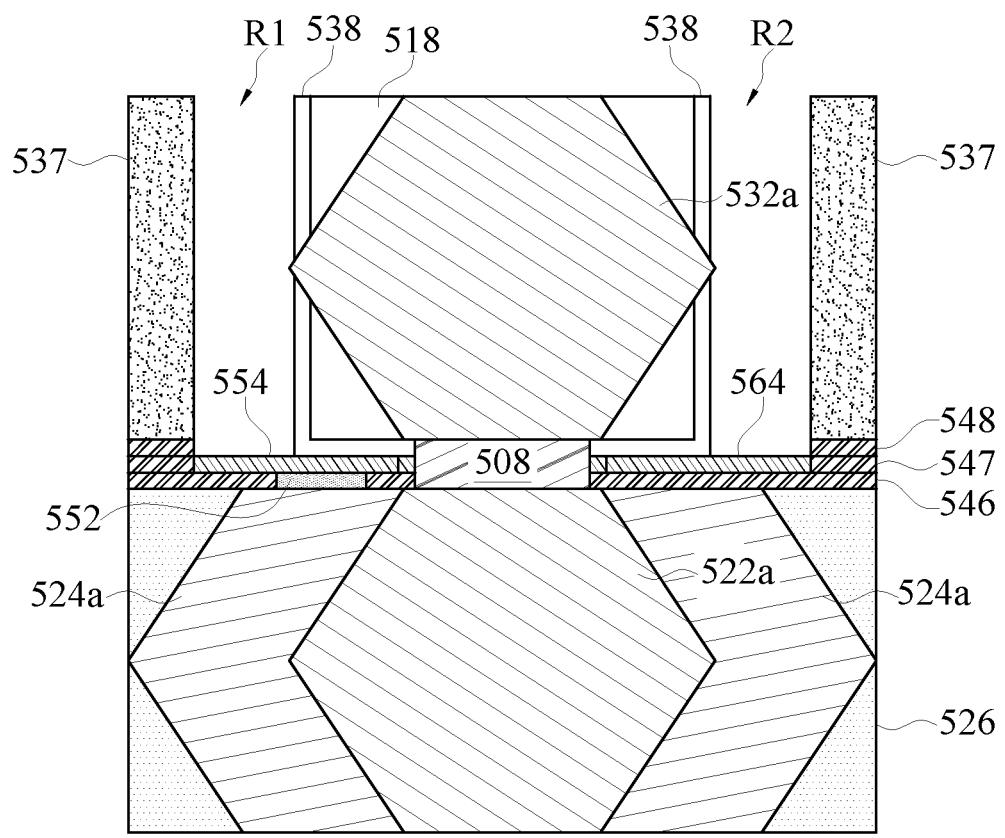

FIG. 5W(A) illustrates a perspective view of an intermediate stage of the method 500 for forming an inner conductive line 554 of the first IIS and an inner conductive line 564 of a second IIS. FIGS. 5W(B) and 5W(C) are cross-sectional views of the perspective view shown in FIG. 5W(A) along sectional lines B-B and C-C that cross the metal gate 518 and the source/drain region 522a, respectively.

Referring to FIGS. 5W(A) to 5W(C), a conductive material, such as copper, silver, tungsten, titanium, nickel, tin, aluminum, or the like, is deposited in the recesses R1 and R2 to form the inner conductive lines 554 and 564, in which the inner conductive line 554 is electrically connected to the first inner conductive via 552. The inner conductive lines 554 and 564 have widths in the x-direction substantially equal to the width defined by the recesses R1 and R2, respectively. In some embodiments, the inner conductive line 554 or 564 has a line height substantially equal to the height of the dielectric layer 547. In some embodiments, the inner conductive line 554 or 564 is laterally surrounded by the dielectric layer 547. Referring to FIG. 5W(B), the conductive line 554 or 564 has a first portion overlapping the metal gate from a top view perspective and a second portion extending outside the sidewall of the metal gate 518 and non-overlapped with the metal gate 518.

Figure 5X:
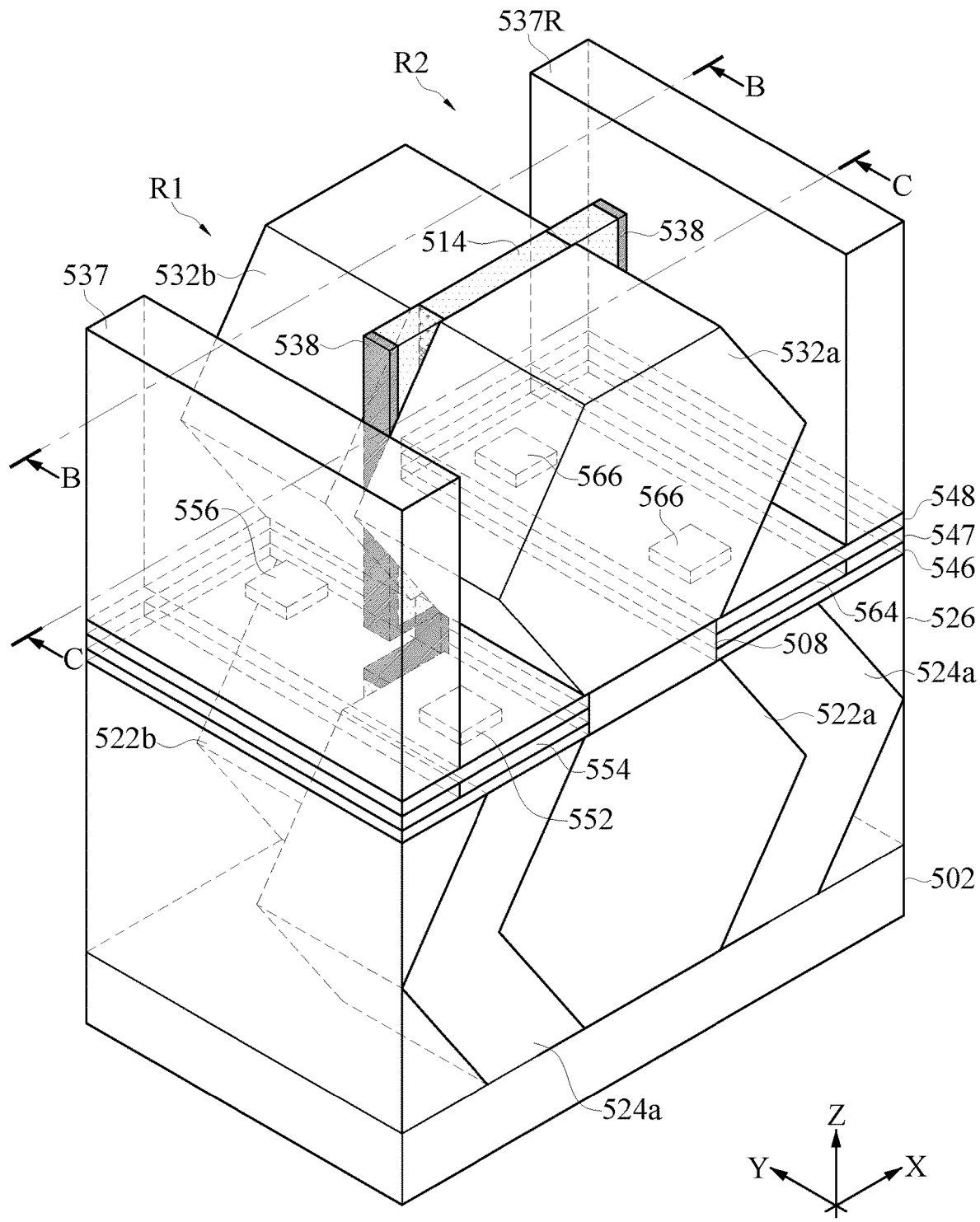
Figure 5X:
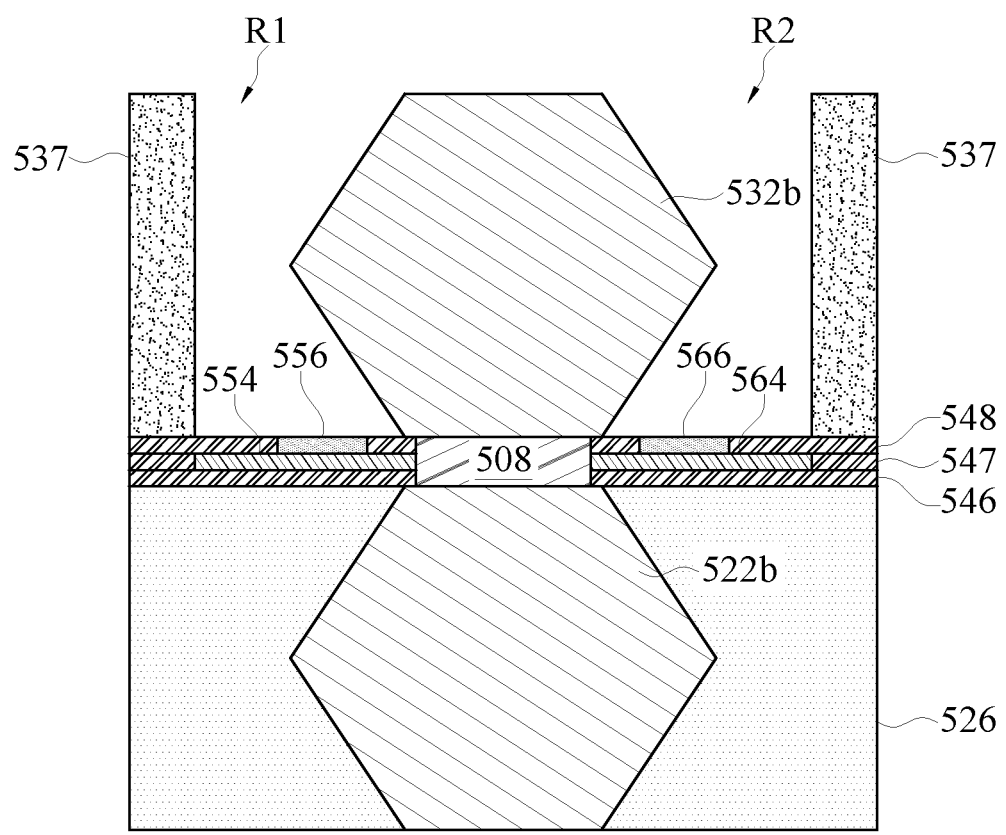
Figure 5X:
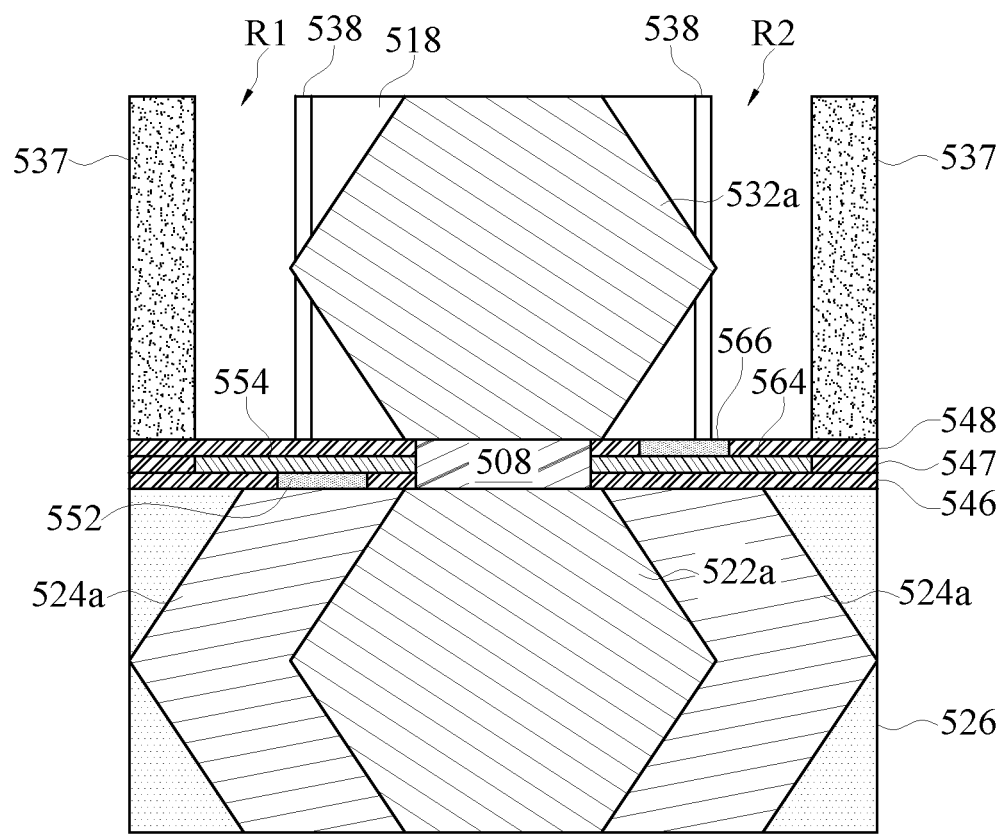

FIG. 5X(A) illustrates a perspective view of an intermediate stage of the method 500 for forming a second inner conductive via 556 of the first IIS and third and fourth inner conductive vias 566 of the second IIS. FIGS. 5X(B) and 5X(C) are cross-sectional views of the perspective view shown in FIG. 5X(A) along sectional lines B-B and C-C that cross the metal gate 518 and the source/drain region 522a, respectively.

Referring to FIGS. 5X(A) to 5X(C), a dielectric material is formed in the recesses R1 and R2 defined by the insulation layer 537 and the insulation film 538 over the inner conductive lines 554 and 564. The dielectric material has a height substantially equal to the height of the dielectric layer 548. The dielectric material may have the similar material to the dielectric layer 548. A patterning operation is performed on the dielectric material to define and etch a second hole for the second inner conductive via 556 over the inner conductive line 554. In some embodiments, a patterning operation, which may be the same operation for forming the second hole or may be a separate patterning operation, is performed to form a third hole and a fourth hole in the recess R2 for the third and fourth inner conductive vias 566a and 566b. A conductive material, such as copper, silver, tungsten, titanium, nickel, tin, aluminum, or the like, is deposited in the second, third and fourth holes to form the second, third and fourth inner conductive vias 556, 566a, 566b, respectively. As a result, the second inner conductive via 556 is electrically connected to the inner conductive line 554 to thereby construct the first IIS. The third and fourth inner conductive vias 566a and 566b are electrically connected to the inner conductive line 564 to thereby construct the second IIS.

Figure 5Y:
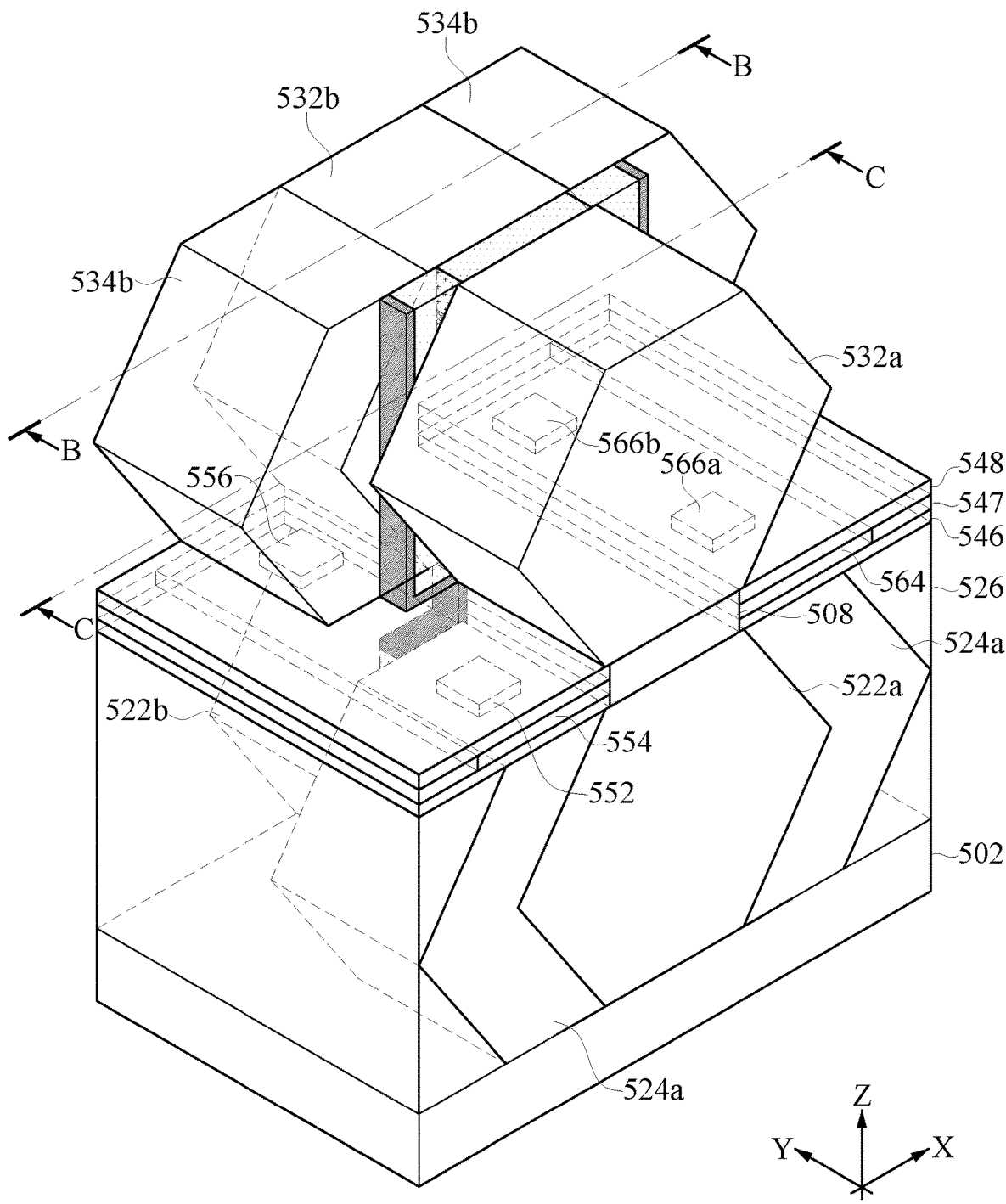
Figure 5Y:
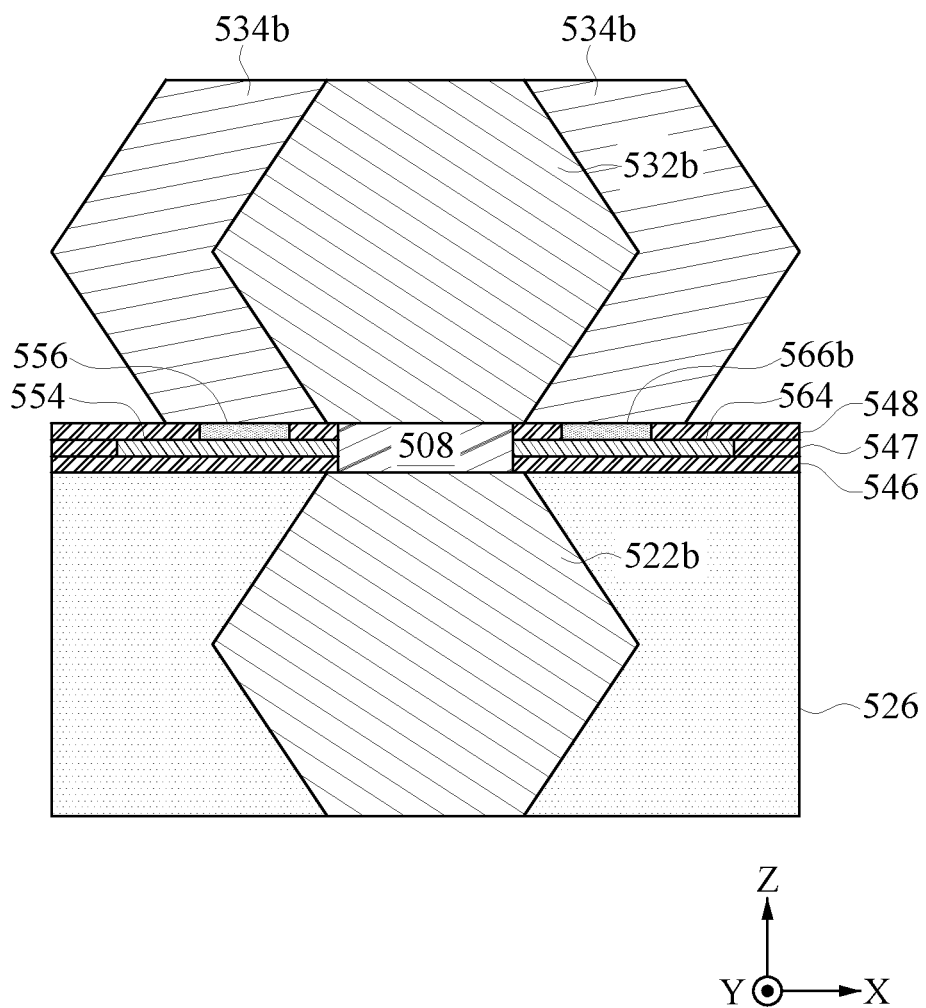
Figure 5Y:
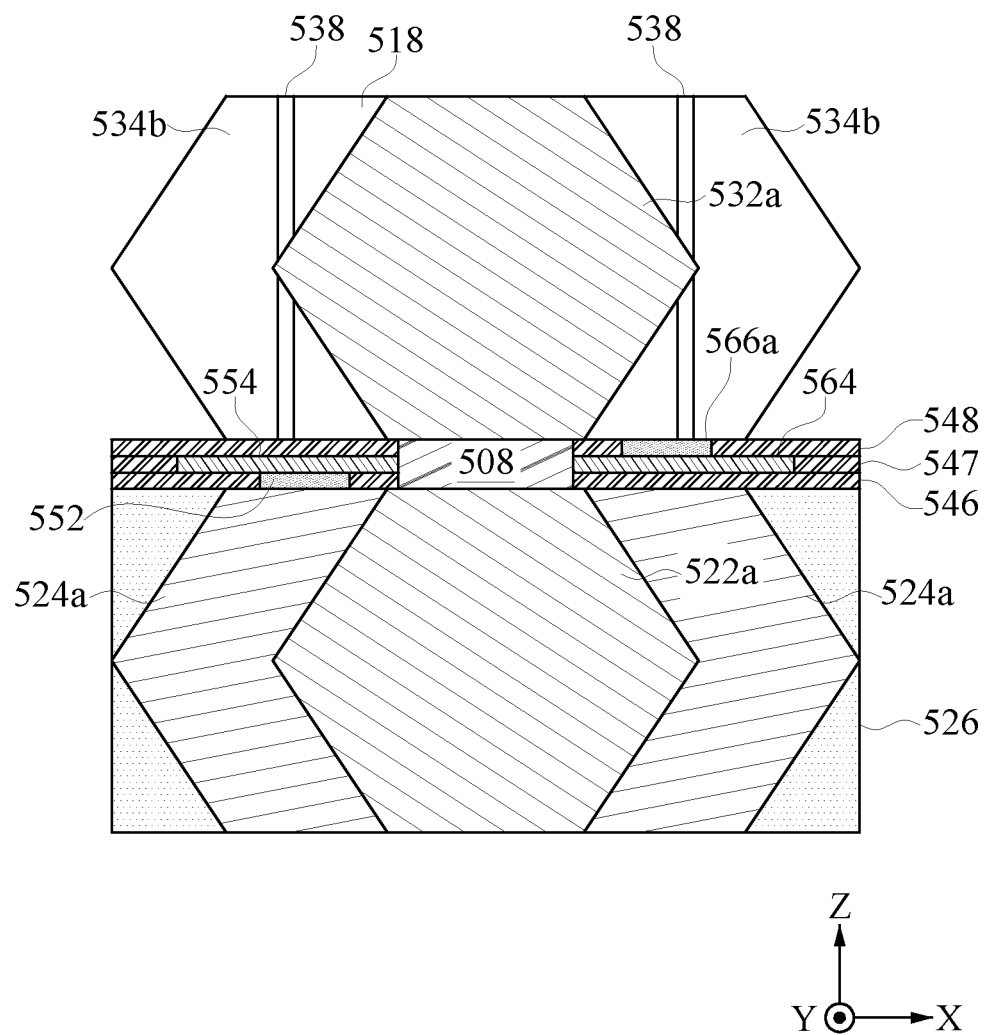

FIG. 5Y(A) illustrates a perspective view of an intermediate stage of the method 500 for forming the conductive line 534b. FIGS. 5Y(B) and 5Y(C) are cross-sectional views of the perspective view shown in FIG. 5Y(A) along sectional lines B-B and C-C that cross the metal gate 518 and the source/drain region 522a, respectively.

Referring to FIGS. 5Y(A) to 5Y(C), the conductive line 534b is formed or grown on two sides of the source/drain region 532b and extending in the x-direction to electrically connect the source/drain region 532b to the second inner conductive via 556 and the fourth inner conductive via 566b. The materials, configurations and method of forming of the conductive line 534b are similar to those of the conductive line 524a, and their descriptions are not repeated for brevity. As a result, the source/drain region 532b is electrically connected to the source/drain region 522a through the first IIS or to the source/drain region 532a through the second IIS.

According to an embodiment, a semiconductor device includes a first transistor and a second transistor. The first transistor is of a first conductivity type arranged in a first layer and includes a gate extending in a first direction and a first active region extending in a second direction perpendicular to the first direction. The second transistor is of a second conductivity type arranged in a second layer over the first layer and includes the gate and a second active region extending in the second direction. The semiconductor device further includes a first conductive line arranged in a third layer between the first layer and the second layer and extending in the second direction. The first conductive line electrically connects a first source/drain region of the first active region to a second source/drain region of the second active region. The gate includes an upper portion and a lower portion, and the first conductive line crosses the first gate between the upper portion and the lower portion.

According to an embodiment, a semiconductor device includes a first transistor and a second transistor. The first transistor is of a first conductivity type arranged in a first layer and includes a first gate extending in a first direction and a first active region extending in a second direction perpendicular to the first direction. The second transistor is of a second conductivity type arranged in a second layer over the first layer and includes the first gate and a second active region extending in the second direction. The semiconductor device further includes a first conductive line arranged in a third layer between the first layer and the second layer and extending in the second direction. The first gate has a recessed portion located between the first layer and the second layer, wherein the first conductive line crosses the first gate through the recessed portion.

According to an embodiment, a method of manufacturing a semiconductor device includes: forming a first semiconductor stack, a first dielectric layer and a second semiconductor stack from bottom to top, wherein the first and second semiconductor stacks extend in a first direction; forming a dummy gate over the second semiconductor stack and extending in a second direction perpendicular to the first direction; growing a first epitaxial region on a first side of the dummy gate; depositing a first insulation layer laterally surrounding the dummy gate and the first epitaxial region; forming a second dielectric layer over the first insulation layer; pattering the second dielectric layer to form a first conductive via over the first epitaxial region; depositing a third dielectric layer the second dielectric layer; growing a second epitaxial region over the third dielectric layer on a second side of the dummy gate; depositing a second insulation layer over the third dielectric layer and laterally surrounding the dummy gate and the second epitaxial region; patterning the second insulation layer to expose the third dielectric layer; patterning the third dielectric layer to form a first conductive line over the second dielectric layer, the first conductive line extending in the first direction and electrically connected to the first conductive via; and patterning the third dielectric layer to form a second conductive via electrically connected to the first conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first transistor of a first conductivity type arranged in a first layer, the first transistor comprising:
      a gate extending in a first direction; and
      a first active region extending in a second direction perpendicular to the first direction;
   a second transistor of a second conductivity type arranged in a second layer over the first layer, the second transistor comprising:
      the gate; and
      a second active region extending in the second direction; and a first conductive line arranged in a third layer between the first layer and the second layer and extending in the second direction, the first conductive line electrically connecting a first source/drain region of the first active region to a second source/drain region of the second active region, wherein the gate comprises an upper portion and a lower portion, and the first conductive line crosses the gate between the upper portion and the lower portion.

2. The semiconductor device according to claim 1, wherein the first transistor further comprises a second conductive line electrically connecting the first source/drain region to the first conductive line.

3. The semiconductor device according to claim 2, further comprising a first conductive via between and electrically connecting the first conductive line and the second conductive line.

4. The semiconductor device according to claim 3, wherein the second transistor further comprises a third conductive line electrically connecting the second source/drain region to the first conductive line.

5. The semiconductor device according to claim 4, further comprising a second conductive via between and electrically connecting the first conductive line and the third conductive line.

6. The semiconductor device according to claim 1, further comprising an insulating film arranged between the gate and the first conductive line.

7. The semiconductor device according to claim 1, wherein the upper portion wraps around a first channel of the first transistor, the lower portion wraps around a second channel of the second transistor, and the gate further comprises a middle portion between the upper portion and the lower portion, wherein the upper portion or the lower portion have a first width in the first direction greater than a second width of the middle portion in the first direction.

8. The semiconductor device according to claim 7, wherein the first conductive line comprises a first portion at an elevation of the middle portion of the gate and is non-overlapped with the gate.

9. The semiconductor device according to claim 7, wherein the first conductive line comprises a second portion at an elevation of the middle portion of the gate and overlapping the upper portion and the lower portion of the gate.

10. The semiconductor device according to claim 7, further comprising an insulation film on sidewalls of the gate and extending from the upper portion to the middle portion of the gate.

11. A semiconductor device comprising:
a first transistor of a first conductivity type arranged in a first layer, the first transistor comprising:
a first gate extending in a first direction; and
a first active region extending in a second direction perpendicular to the first direction;
a second transistor of a second conductivity type arranged in a second layer over the first layer, the second transistor comprising:
the first gate; and
a second active region extending in the second direction; and
a first conductive line arranged in a third layer between the first layer and the second layer and extending in the second direction, wherein the first gate has a recessed portion located between the first layer and the second layer, wherein the first conductive line crosses the first gate through the recessed portion.

12. The semiconductor device according to claim 11, further comprising a second conductive line arranged in the third layer and extending in the second direction on a side of the first gate opposite to the first conductive line.

13. The semiconductor device according to claim 12, wherein the first conductive line and the second conductive line cross the first gate on two sides of the recessed portion.

14. The semiconductor device according to claim 12, further comprising a third transistor arranged in the second layer and comprising:
a second gate extending in the first direction parallel to the first gate; and
a third active region extending in the second direction,
wherein the second conductive line is configured to electrically connect a first source/drain region of the first active region to a second source/drain region of the third active region.

15. The semiconductor device according to claim 11, further comprising a first power rail extending in the second direction in a fourth layer below the first layer and a second power rail extending in the second direction in a fifth layer above the second layer, wherein the first power rail and the second power rail are configured to supply a first voltage and a second voltage, respectively.

16. A method of manufacturing a semiconductor device, comprising:
forming a first semiconductor stack, a first dielectric layer and a second semiconductor stack from bottom to top, wherein the first and second semiconductor stacks extend in a first direction;
forming a dummy gate over the second semiconductor stack and extending in a second direction perpendicular to the first direction;
growing a first epitaxial region on a first side of the dummy gate;
depositing a first insulation layer laterally surrounding the dummy gate and the first epitaxial region;
forming a second dielectric layer over the first insulation layer;
patterning the second dielectric layer to form a first conductive via over the first epitaxial region;
depositing a third dielectric layer over the second dielectric layer;
growing a second epitaxial region over the third dielectric layer on a second side of the dummy gate;
depositing a second insulation layer over the third dielectric layer and laterally surrounding the dummy gate and the second epitaxial region;
patterning the second insulation layer to expose the third dielectric layer;
patterning the third dielectric layer to form a first conductive line over the second dielectric layer, the first conductive line extending in the first direction and electrically connected to the first conductive via; and
patterning the third dielectric layer to form a second conductive via electrically connected to the first conductive line.

17. The method according to claim 16, wherein the forming of the first semiconductor stack, the first dielectric layer and the second semiconductor stack comprises:

forming the first semiconductor stack comprising first semiconductor layers and second semiconductor layers alternatively arranged with the first semiconductor layers;

forming the first dielectric layer comprising a sacrificial region over the first semiconductor stack; and forming the second semiconductor stack comprising third semiconductor layers and fourth semiconductor layers alternatively arranged with the third semiconductor layers.

18. The method according to claim 17, further comprising replacing the dummy gate with a metal gate and patterning the metal gate to expose the sacrificial region prior to forming the first conductive line.

19. The method according to claim 18, further comprising removing the sacrificial region to form a recess in the metal gate, wherein the first conductive line extends through the recess.

20. The method according to claim 19, further comprising forming an insulation film on sidewalls of the recess prior to forming the first conductive line.

* * * * *